US012588505B2

(12) United States Patent
Kuo et al.

(10) Patent No.: US 12,588,505 B2
(45) Date of Patent: Mar. 24, 2026

(54) THERMAL AND MECHANICAL ENHANCED THERMAL MODULE STRUCTURE ON HETEROGENEOUS PACKAGES AND METHODS FOR FORMING THE SAME

(71) Applicant: Taiwan Semiconductor Manufacturing Company Limited, Hsinchu (TW)

(72) Inventors: Sheng-Liang Kuo, Hsinchu (TW); Po-Yao Lin, Zhudong Township (TW); Kathy Yan, Hsinchu (TW); Cooper Yu, Taipei City (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 717 days.

(21) Appl. No.: 17/888,823

(22) Filed: Aug. 16, 2022

(65) Prior Publication Data

US 2024/0063087 A1 Feb. 22, 2024

(51) Int. Cl.
| | |
|---|---|
| *H01L 23/38* | (2006.01) |
| *H01L 23/42* | (2006.01) |
| *H10N 10/01* | (2023.01) |
| *H10N 10/17* | (2023.01) |
| *H10W 40/22* | (2026.01) |

(Continued)

(52) U.S. Cl.
CPC ............ *H10W 40/28* (2026.01); *H10N 10/01* (2023.02); *H10N 10/17* (2023.02); *H10W 40/22* (2026.01); *H10W 40/70* (2026.01); *H10W 70/027* (2026.01); *H10W 70/611* (2026.01); *H10W 70/685* (2026.01); *H10W 90/00* (2026.01);

(Continued)

(58) Field of Classification Search
CPC ... H01L 23/38; H01L 21/4878; H01L 23/367; H01L 23/42; H01L 23/5383; H01L 23/5385; H01L 24/32; H01L 25/18; H01L 24/73; H01L 2224/32245; H01L 2224/73204; H01L 23/3675; H10N 10/01; H10N 10/17; H10N 10/00; H10N 19/00; H01M 10/6572; H05K 2201/10219
See application file for complete search history.

(56) References Cited

U.S. PATENT DOCUMENTS

| | | | | |
|---|---|---|---|---|
| 5,921,087 A | * | 7/1999 | Bhatia .................... | H10N 10/13 136/203 |
| 6,094,919 A | * | 8/2000 | Bhatia .................... | H01L 23/38 62/3.2 |

(Continued)

FOREIGN PATENT DOCUMENTS

JP 2009253053 A * 10/2009

*Primary Examiner* — Dale E Page
*Assistant Examiner* — Cristian A Tivarus
(74) *Attorney, Agent, or Firm* — The Marbury Law Group, PLLC

(57) ABSTRACT

Devices and method for forming a chip package assembly, including a package substrate, a fan-out package attached to the package substrate, the fan-out package including a first semiconductor die including a first physical interface and a second semiconductor die including a second physical interface. The chip package assembly further including a heatsink structure including a heatsink base and a cavity within the heatsink base, and a thermoelectric cooler (TEC) embedded within the cavity, wherein the TEC is positioned above the first physical interface and the second physical interface.

20 Claims, 48 Drawing Sheets

(51) Int. Cl.

| | |
|---|---|
| *H10W 40/28* | (2026.01) |
| *H10W 40/70* | (2026.01) |
| *H10W 70/02* | (2026.01) |
| *H10W 70/60* | (2026.01) |
| *H10W 70/685* | (2026.01) |
| *H10W 90/00* | (2026.01) |
| *H10W 74/15* | (2026.01) |

(52) U.S. Cl.
CPC .......... *H10W 90/401* (2026.01); *H10W 74/15* (2026.01); *H10W 90/736* (2026.01)

(56)                References Cited

U.S. PATENT DOCUMENTS

| | | | | |
|---|---|---|---|---|
| 6,424,533 | B1 * | 7/2002 | Chu ........................ | H10N 10/17 |
| | | | | 361/719 |
| 7,638,705 | B2 * | 12/2009 | Venkatasubramanian ................... | |
| | | | | H10N 10/13 |
| | | | | 136/205 |
| 7,997,087 | B2 * | 8/2011 | Venkatasubramanian ................... | |
| | | | | H10N 10/13 |
| | | | | 62/3.2 |
| 8,310,045 | B2 * | 11/2012 | Son ..................... | H01L 23/3675 |
| | | | | 257/E23.101 |
| 10,096,577 | B2 * | 10/2018 | Kim ........................ | G11C 5/063 |
| 11,348,859 | B2 * | 5/2022 | Beauchemin ........... | H01L 25/18 |
| 2010/0219525 | A1 * | 9/2010 | Ibaraki .................... | H01L 23/38 |
| | | | | 257/693 |
| 2019/0025529 | A1 * | 1/2019 | Chen ........................ | G02B 6/35 |
| 2020/0098664 | A1 * | 3/2020 | Valavala ............. | H01L 23/3675 |
| 2021/0035859 | A1 * | 2/2021 | Mehta ................. | H01L 23/3135 |

* cited by examiner

2610 Forming a heatsink having an heatsink base and a cavity within the heatsink base 2620 Forming a thermoelectric cooler (TEC) within the cavity

THERMAL AND MECHANICAL ENHANCED THERMAL MODULE STRUCTURE ON HETEROGENEOUS PACKAGES AND METHODS FOR FORMING THE SAME

BACKGROUND

Semiconductor dies within chip package structures are becoming increasingly complex, requiring more power and increased thermal regulation mechanisms to operate efficiently and at higher frequencies. Simultaneously, efforts are being made to minimize the footprints of semiconductor dies along with chip package structures and accompanying components within semiconductor designs, despite the increased complexity of new designs. The increased complexity, increased power requirements, and reduction in footprints may increase the level of thermal cross-talk between adjacent semiconductor dies. High temperatures within a semiconductor system caused by high-power semiconductor dies may convey excess temperatures to adjacent low-power semiconductor dies, causing increased thermal stress and unwanted material expansion that may induce run-time errors or physical damage with a chip package structure.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 11A is a vertical cross-sectional view and FIG. 11B is a bottom-up view of the intermediate heatsink structure of FIG. 11A. FIG. 11C is a top-down view of the intermediate heatsink structure 601 of FIGS. 11A and 11B.

FIG. 12A is a vertical cross-sectional view and FIG. 12B is a top-down view of the heatsink structure 601 of FIG. 12A.

FIG. 13A is a vertical cross-sectional and FIG. 13B is a top-down view of the heatsink structure 601 of FIG. 13A.

DETAILED DESCRIPTION

Figure 1A:
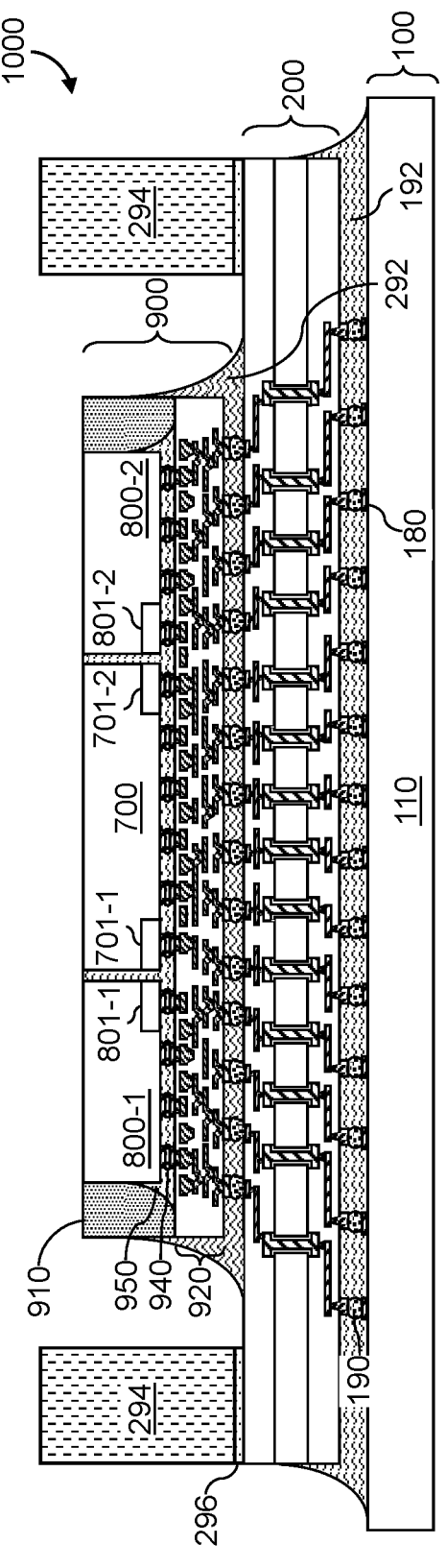
FIG. 1A is a vertical cross-sectional view of a region of a chip package structure that includes a package substrate, printed circuit board, fan-out package, and stiffener according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

In heterogeneous chip package structures including multiple semiconductor dies (e.g., system-on-a-chip (SoCs), high-bandwidth memory (HBM), (static random-access memory (SRAM), etc.) with varying degrees of power draw and junction temperature specifications, thermal cross-talk between the semiconductor dies may occur. Typical external thermal modules (e.g., heatsinks) may have a solid base that is affixed to a top of a chip package structure to cool all heat sources within a fan-out package of a chip package structure simultaneously. However, the thermal coupling from one heat source to another through the heatsink base may lead some semiconductor dies with comparatively lower power draw operating at lower temperatures to be exposed to absorb the excess heat generated by the semiconductor dies with comparatively higher power draw operating at higher temperatures. For example, an SoC die may draw more power than an adjacent memory die, and may therefore exhibit higher operating temperatures, especially at the physical layer (PHY) interfaces and proximate regions. A heatsink with a solid base may be affixed to the top of the chip package structure to cool the semiconductor dies. During operation, the high temperatures exuded by the SoC die may be transferred into the heatsink base and transferred to lower temperature regions of the heatsink base. Thus, the excess heat from the SoC die may be transferred through a heatsink and into adjacent memory dies and surrounding regions. This thermal cross-talk effect may reduce the performance of the memory dies.

Furthermore, the thermal cross-talk effect caused by the thermal mismatch between the heatsink and the heterogeneous chip package structure may increase the physical stress of the SoC die(s), memory dies, and surrounding materials. The thermal cross-talk effect may be worsened in instances in which a high dielectric constant ("high-k") thermal interface material (TIM) has been implemented to affix a heatsink to the top of the chip package structure. The thermal mismatch may induce a high stress environment within the fan-out package, potentially causing breaks, cracks, or electrical disconnects within the fan-out package that may induce run-time errors or prevent the semiconductor dies from functioning entirely.

Various embodiments of the present disclosure are directed to thermal cooling systems, particularly to heatsink structures including embedded thermoelectric coolers (TECs) for use with chip package structures. Generally, the various embodiment methods and structures may be used to provide a chip package assembly including a chip package structure and a thermal cooling system (e.g., a heatsink structure with embedded TEC) for reducing thermal cross-talk between semiconductor dies within the chip package structure. The chip package structure may be a fan-out wafer level package (FOWLP) or fan-out panel level package (FOPLP). While the various embodiments of the present disclosure are described using an FOWLP configuration, implementation of the various embodiment methods and structures in an FOPLP configuration or any other fan-out package configuration are within the contemplated scope of disclosure for use with the various thermal cooling system embodiments. Various embodiments allow for the reduction of thermal cross-talk between semiconductor dies within a heterogeneous chip package structure.

Figure 1B:
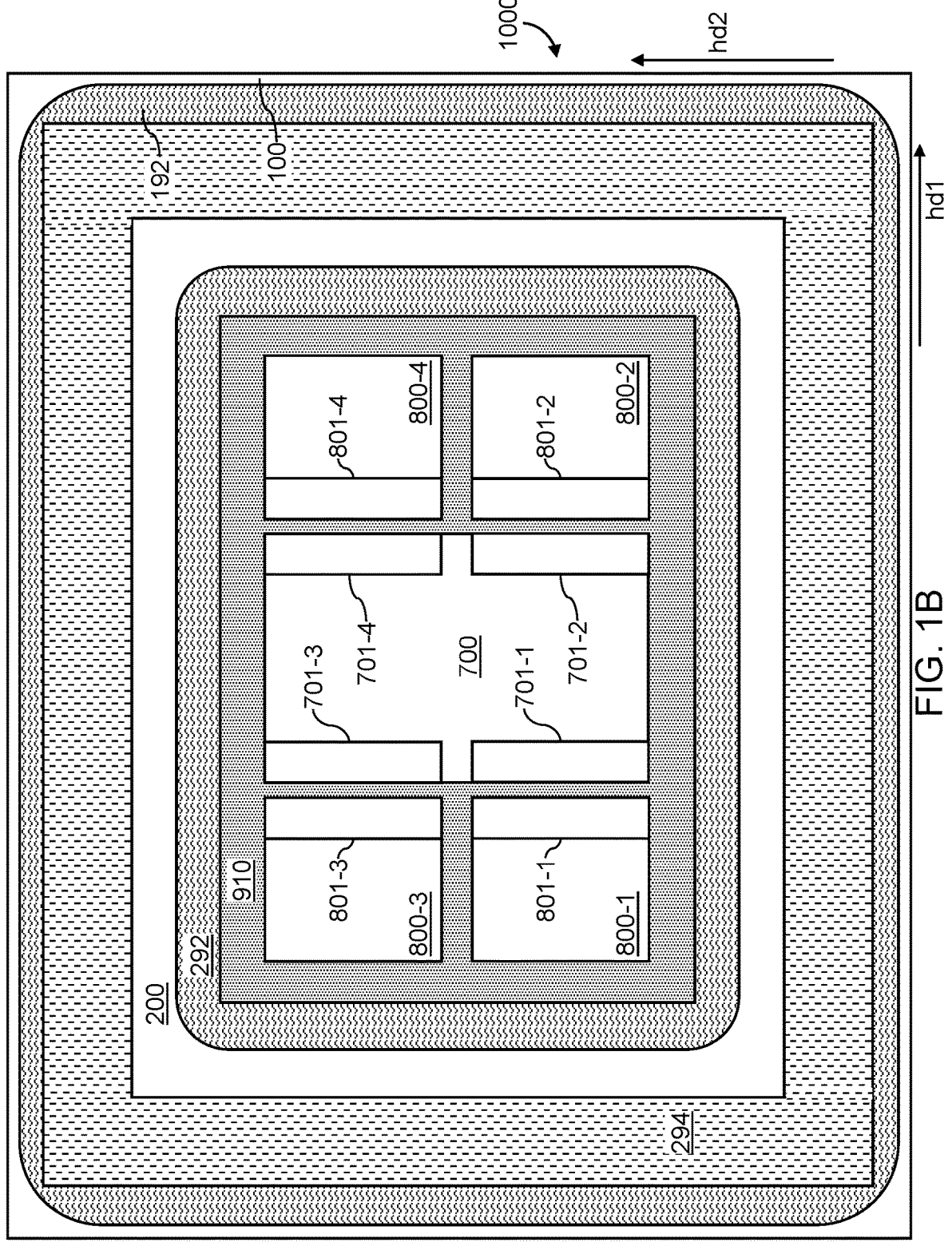
FIG. 1B is a top-down view of the chip package structure of FIG. 1A.

FIG. 1A is a vertical cross-sectional view of a region of a chip package structure that includes a package substrate, printed circuit board, fan-out package, and stiffener according to an embodiment of the present disclosure. FIG. 1B is a top-down view of the chip package structure of FIG. 1A. For ease of illustration, the areas of each physical layer (PHY) interface (e.g., memory PHY interfaces 801, SoC PHY interfaces 701) are outlined and illustrated in FIG. 1B despite not being normally viewable from a top-down perspective. A first horizontal direction hd1 and a second horizontal direction hd2 are shown. Referring to FIGS. 1A and 1B, a chip package structure 1000 according to an embodiment of the present disclosure includes a package substrate 200 affixed to a printed circuit board 100, a fan-out package 900 affixed to the package substrate 200, and a stiffener 294 affixed to the package substrate 200.

Referring to FIG. 1A, the fan-out package 900 may include a redistribution structure 920 including redistribution-side metal pad structures, redistribution dielectric layers, and redistribution wiring interconnects. The fan-out package 900 may further include at least one semiconductor die (700, 800) comprising a respective set of die-side metal pad structures that may be coupled to the redistribution-side metal pad structures through a respective set of solder material portions, thereby electrically connecting the semiconductor dies (700, 800) to the redistribution dielectric layers and redistribution wiring interconnects of the redistribution structure 920. A first underfill material portion 950 may laterally surround the redistribution-side metal pad structures and the die-side metal pad structures of the semiconductor dies (700, 800), and may surround sidewalls of the at least one semiconductor dies (700, 800).

The first underfill material portion 950 may also be referred to as microbump underfill fillet portions or microbump underfill material portions. The first underfill material portion 950 may be formed by injecting the first underfill material around a respective array of solder material portions positioned between the semiconductor dies (700, 800) and the redistribution structure 920. In some embodiments, the outer periphery of the first underfill material portion 950 may have squared, or perpendicular corners in a plan view. The first underfill material portion 950 may laterally surround, and contact, each of the solder material portions 940 within the unit area UA. The first underfill material portion 950 may be formed around, and contact, the solder material portions, redistribution-side metal pad structures, and die-side metal pad structures positioned between the semiconductor dies (700, 800) and the redistribution structure 920. In some embodiments, the exposed outermost surfaces of the first underfill material portion 950 surrounding sidewalls of the semiconductor dies (700, 800) may have a curved or concave shape with varying taper angles formed as a result of the deposition process. In other embodiments, the exposed outermost surfaces of the first underfill material portion 950 surrounding sidewalls of the semiconductor dies (700, 800) may have a straight, tapered, or convex shape.

The fan-out package 900 may further include a molding compound die frame 910 laterally surrounding the semiconductor dies (700, 800) formed from a molding compound material. In one embodiment, the molding compound die frame 910 may include sidewalls that are vertically coincident with sidewalls of the redistribution structure 920, i.e., located within same vertical planes as the sidewalls of the redistribution structure 920. Generally, the molding compound die frame 910 may be formed around the at least one semiconductor die (700, 800) after formation of the first underfill material portion 950 within the fan-out package 900. The molding compound material contacts a peripheral portion of a planar surface of the redistribution structure 920.

Each semiconductor die (700, 800) may include any semiconductor die known in the art, such as a system-on-a-chip (SoC) die and a memory die. For example, as illustrated, the fan-out package 900 includes semiconductor dies 700, 800-1, and 800-2. The semiconductor die 700 may be an SoC die 700 and the semiconductor dies 800-1 and 800-2 may be memory dies 800-1 and 800-2 electrically connected to the SoC die 700 through the redistribution structure 920. Each SoC die 700 may include an application processor die, a central processing unit die, or a graphic processing unit die. In one embodiment, the memory dies 800-1 and 800-2 may include a high bandwidth memory (HBM) die that includes a vertical stack of static random-access memory dies. In one embodiment, the semiconductor dies (700, 800) may include at least one system-on-chip (SoC) die and a high bandwidth memory (HBM) die including a vertical stack of static random-access memory (SRAM) dies that are interconnected to one another through microbumps and are laterally surrounded by an epoxy molding material enclosure frame.

Fan-out bonding pads may be formed on the opposite side of the redistribution structure 920 from the array of semiconductor dies (700, 800). Each redistribution structure 920 may comprise redistribution dielectric layers, redistribution wiring interconnects embedded in the redistribution dielectric layers, and fan-out bonding pads. The fan-out bonding pads may be located on an opposite side of the redistribution structure 920 from the redistribution-side metal pad structures relative to the redistribution dielectric layers (i.e. positioned between the redistribution structure 920 and the package substrate 200). Solder material portions may be attached to the fan-out bonding pads. The package substrate 200 may be bonded to the fan-out package 900 through the solder material portions on the bottom side of the redistribution structure 920. The package substrate 200 may be a cored package substrate including a core substrate, or a coreless package substrate that does not include a package core. Alternatively, the package substrate 200 may include a system-on-integrated package substrate (SoIS) including redistribution layers and/or dielectric interlayers, at least one embedded interposer (such as a silicon interposer). Such a system-integrated package substrate may include layer-to-layer interconnections using bonding material portions, underfill material portions (such as molded underfill material portions), and/or an optional adhesion film (not shown). While the present disclosure is described using a substrate package, it is understood that the scope of the present disclosure is not limited by any particular type of substrate package and may include an SoIS. Other substrate packages are within the contemplated scope of disclosure. An array of through-core via structures including a metallic material may be provided in the through-plate holes. Each through-core via structure may, or may not, include a cylindrical hollow therein. Optionally, dielectric liners may be used to electrically isolate the through-core via structures from the core substrate.

The package substrate 200 may include board-side surface laminar circuit (SLC) and a chip-side surface laminar circuit (SLC). The board-side SLC may include board-side insulating layers embedding board-side wiring interconnects. The chip-side SLC may include chip-side insulating layers embedding chip-side wiring interconnects. The board-side insulating layers and the chip-side insulating layers may include a photosensitive epoxy material that may be lithographically patterned and subsequently cured. The board-side wiring interconnects and the chip-side wiring interconnects may include copper that may be deposited by electroplating within patterns in the board-side insulating layers or the chip-side insulating layers.

The package substrate 200 may include a chip-side surface laminar circuit including chip-side wiring interconnects connected to an array of chip-side bonding pads that may be bonded to the array of solder material portions connected to the redistribution structure 920, and a board-side surface laminar circuit including board-side wiring interconnects connected to an array of board-side bonding pads. The array of board-side bonding pads may be configured to allow bonding through solder balls. The array of chip-side bonding pads may be configured to allow bonding through C4 solder balls. Generally, any type of package substrate 200 may be used. While the present disclosure is described using an embodiment in which the package substrate 200 includes a chip-side surface laminar circuit and a board-side surface laminar circuit, embodiments are expressly contemplated herein in which one of the chip-side surface laminar circuit and the board-side surface laminar circuit is omitted, or is replaced with an array of bonding structures such as microbumps. In an illustrative example, the chip-side surface laminar circuit may be replaced with an array of microbumps or any other array of bonding structures.

The solder material portions attached to the fan-out bonding pads of the fan-out package 900 may be disposed on the array of the chip-side bonding pads of the package substrate. A reflow process may be performed to reflow the solder material portions, thereby inducing bonding between the fan-out package 900 and the package substrate 200. In one embodiment, the solder material portions may include C4 solder balls, and the fan-out package 900 may be attached to the package substrate 200 using an array of C4 solder balls.

A second underfill material portion 292 may be formed around the solder material portions positioned between the fan-out package 900 and the package substrate 200 by applying and shaping a second underfill material. The second underfill material portion 292 may be formed by injecting the second underfill material around the array of solder material portions between the fan-out package 900 and the package substrate 200 after the solder material portions are reflowed. Any known underfill material application method may be used, which may be, for example, the capillary underfill method, the molded underfill method, or the printed underfill method. The second underfill material portion 292 may be formed between the redistribution structure 920 and the package substrate 200, and may contact vertical sidewalls of the fan-out package 900. According to an aspect of the present disclosure, the second underfill material portion 292 may be formed directly on each sidewall of the molding compound die frame 910.

In one embodiment, the second underfill material portion 292 may include tapered sidewalls that extend continuously from a respective sidewall of the molding compound die frame 910 to a planar surface (such as the top surface) of the package substrate 200. The taper angle of the tapered sidewalls may be in a range from 10 degrees to 80 degrees, such as from 30 degrees to 60 degrees, although lesser and greater taper angles may also be used. The taper angle may, or may not, be uniform. For example, exposed outermost surfaces of the second underfill material portion 292 surrounding vertical sidewalls of the fan-out package 900 may have a curved or concave shape with varying taper angles formed as a result of the deposition process. In one embodiment, the tapered sidewalls may have a same taper angle (as measured from a vertical direction) throughout.

The stiffener 294 may be attached to the package substrate 200 via an adhesive layer 296. The adhesive layer 296 may be formed on a top surface of the package substrate 200 (e.g., on a top surface of the chip-side insulating layers). The adhesive layer 296 may be placed, deposited, or otherwise formed as a ring structure surrounding the fan-out package 900. In some embodiments, the adhesive layer 296 may include silicon-based materials. The stiffener 294 may be attached to the assembly of the fan-out package 900 and the package substrate 200 to reduce deformation of the assembly during subsequent processing steps and/or during operation of the chip package structure 1000.

The printed circuit board (PCB) 100 may include a PCB substrate 110 and PCB bonding pads 180 may be provided. The PCB 100 includes a printed circuitry (not shown) at least on one side of the PCB substrate 110. An array of solder joints 190 may be formed to bond the array of board-side bonding pads to the array of PCB bonding pads 180. The solder joints 190 may be formed by disposing an array of solder balls between the array of board-side bonding pads and the array of PCB bonding pads 180, and by reflowing the array of solder balls 190. An underfill material portion 192 may be formed around the solder joints by applying and shaping an underfill material. Exposed outermost surfaces of the underfill material portion 192 surrounding vertical sidewalls of the package substrate 200 may have a curved or concave shape with varying taper angles formed as a result of the deposition process. The package substrate 200 may be attached to the PCB 100 through the array of solder joints.

Referring to FIGS. 1A and 1B, each semiconductor die (700, 800) may include a physical layer (PHY) interface for interfacing and communicating with other semiconductor dies (700, 800) within the fan-out package 900. The proximate PHY interfaces of semiconductor dies (700, 800) may be electrically connected through the redistribution structure 920, such as through redistribution wiring interconnects and/or a silicon bridge embedded within a same horizontal plane as the redistribution dielectric layers of the redistribution structure 920. For example, the memory die 800-1 may include a memory PHY interface 801-1 electrically connected to an SoC PHY interface 701-1, the memory die 800-2 may include a memory PHY interface 801-2 electrically connected to an SoC PHY interface 701-2, a memory die 800-3 may include a memory PHY interface 801-3 electrically connected to an SoC PHY interface 701-3, and a memory die 800-4 may include a memory PHY interface 801-4 electrically connected to an SoC PHY interface 701-4.

In heterogeneous chip package structures including multiple semiconductor dies (e.g., SoCs, HBM, SRAM, etc.) with varying degrees of power draw and junction temperature specifications, thermal cross-talk between the semiconductor dies may occur. Typical external thermal modules (e.g., heatsinks) may have a solid base that is affixed to a top of a chip package structure to cool all heat sources simultaneously. However, the thermal coupling from one heat source to another through the heatsink base may lead some semiconductor dies with comparatively lower power draw operating at lower temperatures to be exposed to absorb the excess heat generated by the semiconductor dies with comparatively higher power draw operating at higher temperatures. For example, the SoC die 700 may draw more power than the memory dies 800, and may therefore exhibit higher operating temperatures, especially at the SoC PHY interfaces 701-1, 701-2, 701-3, 701-4 and proximate regions. A heatsink with a solid base may be affixed to the top of the chip package structure 1000 to cool the semiconductor dies (700, 800). During operation, the high temperatures exuded by the SoC die 700 may be transferred into the heatsink base and conveyed to lower temperature regions of the heatsink base. In this example, such lower temperatures regions would be towards the lower-operating temperature memory dies 800-1, 800-2, 800-3, and 800-4. Thus, the excess heat from the SoC die 700 may be conveyed through the heatsink and into the memory dies 800 and surrounding regions. This thermal cross-talk effect may reduce the performance of the memory dies 800.

Furthermore, the thermal cross-talk effect caused by the thermal mismatch between the heatsink and the heterogeneous chip package structure 1000 may increase the physical stress of the SoC die 700, memory dies 800, and surrounding materials (e.g., first underfill material portion 950, molding compound die frame 910, redistribution structure 920, etc.). The thermal cross-talk effect may be worsened if a high dielectric constant ("high-k") thermal interface material (TIM) has been implemented to affix a heatsink to the top of the chip package structure 1000. The thermal mismatch may induce a high stress environment within the fan-out package 900, potentially causing breaks, cracks, or electrical disconnects within the fan-out package 900. For example, the excess heat from the SoC die 700 during operation may be conveyed through a heatsink base and through the first underfill material portion 950 into the top surface and proximate side of the memory die 800-1. A mismatch in coefficients of thermal expansion between the SoC die 700, first underfill material portion 950, and memory die 800-1 may cause varying degrees of physical expansion, which may cause breaks within the fan-out package 900. For example, electrical connections of the memory PHY interface 801-1 may be lifted off or otherwise separated from bonding pads or solder material portions connecting the memory die 800-1 to the redistribution structure 920. As another example, the various layers (not shown) within the memory die 800-1 itself may be damaged, causing run-time errors or preventing the memory die 800-1 from functioning completely.

Figure 2A:
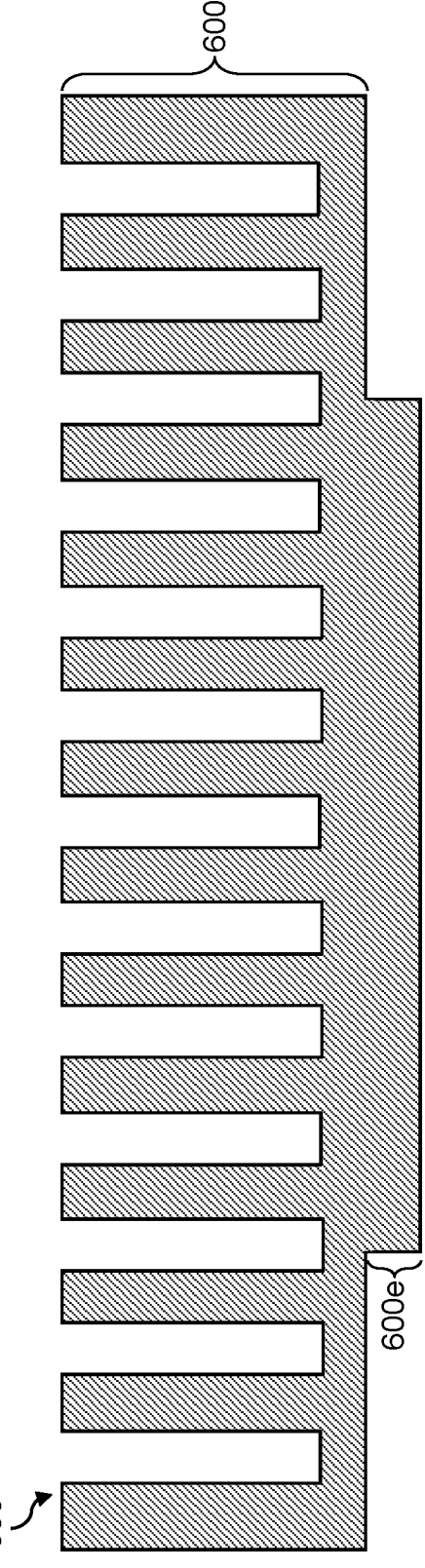
FIG. 2A is vertical cross-sectional view of a region of an intermediate heatsink structure including an extruded heatsink base according to an embodiment of the present disclosure.
Figure 2B:
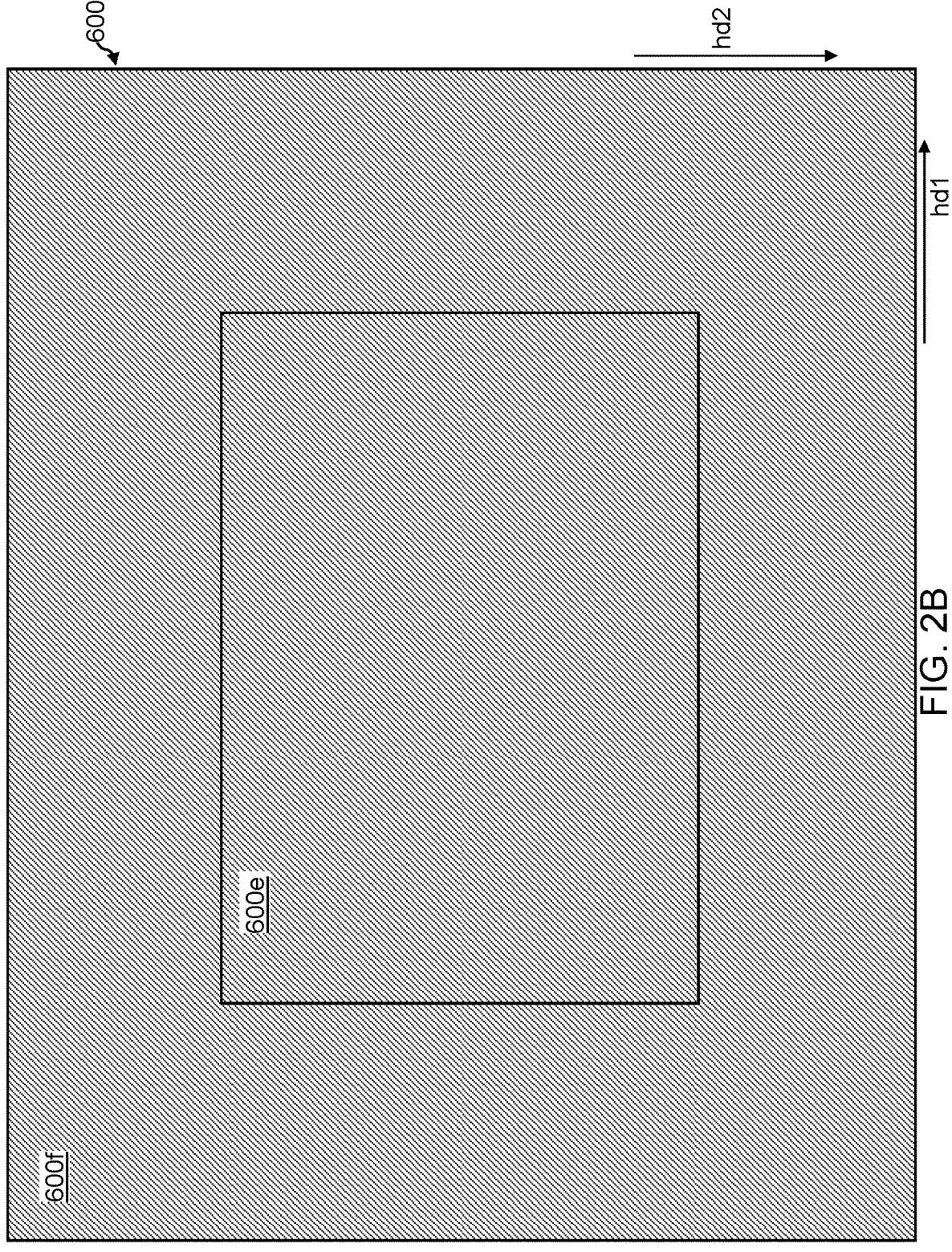
FIG. 2B is a bottom-up view of the intermediate heatsink structure of FIG. 2A.

FIG. 2A is vertical cross-sectional view of a region of an intermediate heatsink structure including an extruded heatsink base according to an embodiment of the present disclosure. FIG. 2B is a bottom-up view of the intermediate heatsink structure of FIG. 2A. Referring to FIGS. 2A and 2B, the intermediate heatsink structure 600 may include a fin portion 600*f* and an extruded heatsink base 600*e* extending from the fin portion 600*f*.

In some embodiments, the heatsink may be a passive heatsink, including no mechanical components, that cools a chip package structure through conduction. In some embodiments, the intermediate heatsink structure 600 may be an active heatsink, such as a heatsink including a motorized fan embedded within the fins of the fin portion 600*f* or attached to a top surface of the intermediate heatsink structure (i.e., on top surfaces of the tips of the fins). In some embodiments, electrical connections for powering any electromechanical components within the intermediate heatsink structure 600, such as motorized fans and/or embedded TECs, may be provided and connected directly to any such electromechanical components. In some embodiments, the intermediate heatsink structure 600 may be drilled, molded, or otherwise formed to include one or more trenches, tunnels, or pathways in which electrical connections (i.e., positive, negative, ground wires) may be inserted or embedded. For example, a top portion of the extruded heatsink base 600*e*, a bottom portion of the fin portion 600*f*, or both may include one or more tunnels through which positive and negative electrical connections may be inserted to power a motorized fan embedded within the fins of the fin portion 600*f* or a TEC embedded within the extruded heatsink base 600*e*.

The intermediate heatsink structure 600 may comprise any conventional material(s) with high thermal conductivity, such as aluminum, copper, ceramics, or any combination thereof (e.g., alloys). The fin portion 600*f* may include any number of fins of any height, width, length, or thickness having a same or varying fin size throughout depending on the size and application of the chip package structure 1000. The fin portion 600*f* may be molded or otherwise formed in a same process as the extruded heatsink base 600*e*. In some embodiments, the fin portion 600*f* and the extruded heatsink base 600*e* may be formed as separate pieces in separate processes, and may then be welded, melded, soldered, or otherwise affixed such that a center of the extruded heatsink base 600*e* is aligned with a center of the fin portion 600*f*. The fin portion 600*f* may be of any width or length suitable for cooling the chip package structure 1000.

The extruded heatsink base 600*e* may have any height suitable for dispersing heat from a chip package structure 1000. The width and length of the extruded heatsink base 600*e* may be greater than or equal to a width and length of a top surface of the fan-out package 900 of the chip package structure 1000. In other words, a surface area of the bottom surface of the extruded heatsink base 600*e* may be greater than or equal to a surface area of the top surface of the fan-out package 900. In some embodiments, the surface area of the bottom of the extruded heatsink base 600*e* may be less than the surface area of the top surface of the fan-out package 900. For example, the surface area of the bottom of the extruded heatsink base 600*e* may be smaller than the surface area of the top of the fan-out package 900, but may be large enough to cover at least the area above the semiconductor dies (700, 800).

In some embodiments, the intermediate heatsink structure 600 may not include an extruded heatsink base 600*e*, but may instead have a thicker base that is a continuation of the fin portion 600*f*. For example, the fin portion 600*f* may have trenches separating each fin, and a distance between a bottom surface of each trench and a bottom surface of the intermediate heatsink structure 600 may be greater than or equal to a comparative height of the extruded heatsink base 600*e* in embodiments including an extruded heatsink base 600*e*. In other words, the intermediate heatsink structure 600 as illustrated may instead be formed to have sidewalls of the extruded heatsink base 600*e* to aligned in a same vertical plane as outermost peripheral sidewalls of the fin portion 600*f*.

Figure 3A:
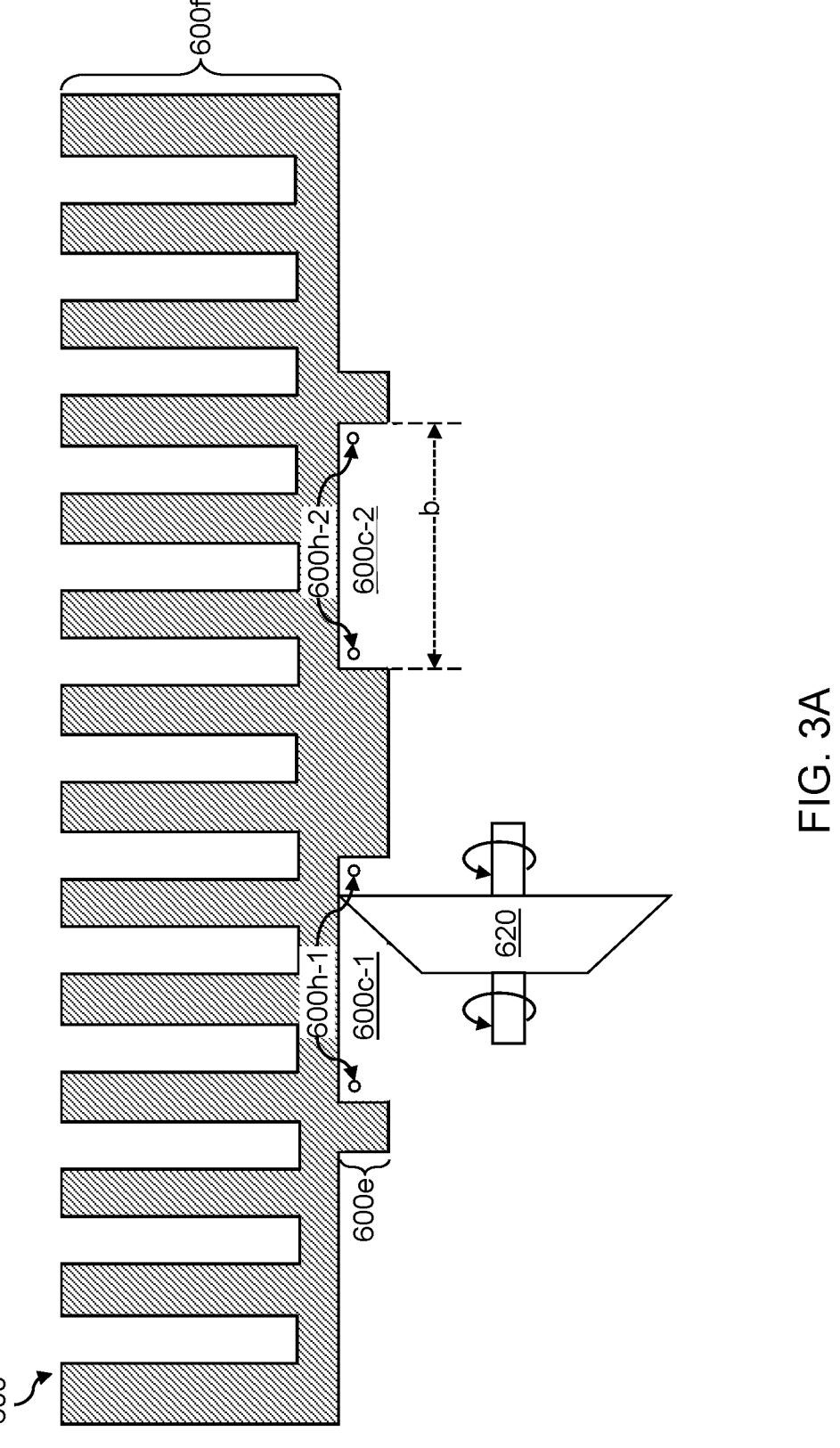
FIG. 3A is a vertical cross-sectional view of a region the intermediate heatsink structure after forming cavities according to an embodiment of the present disclosure.
Figure 3B:
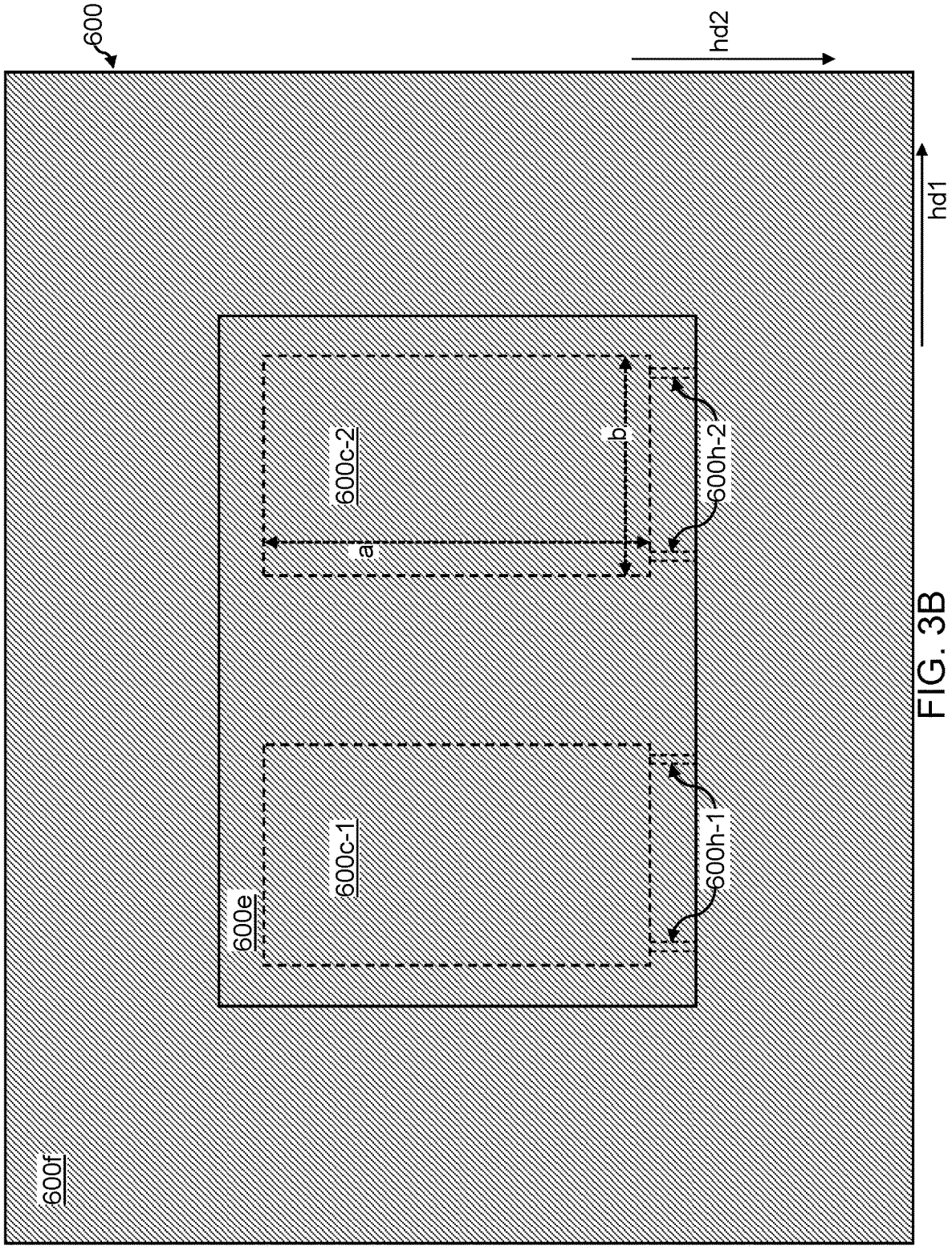
FIG. 3B is a bottom-up view of the intermediate heatsink structure of FIG. 3A including dashed outlines of the holes formed in FIG. 3A.
Figure 3C:
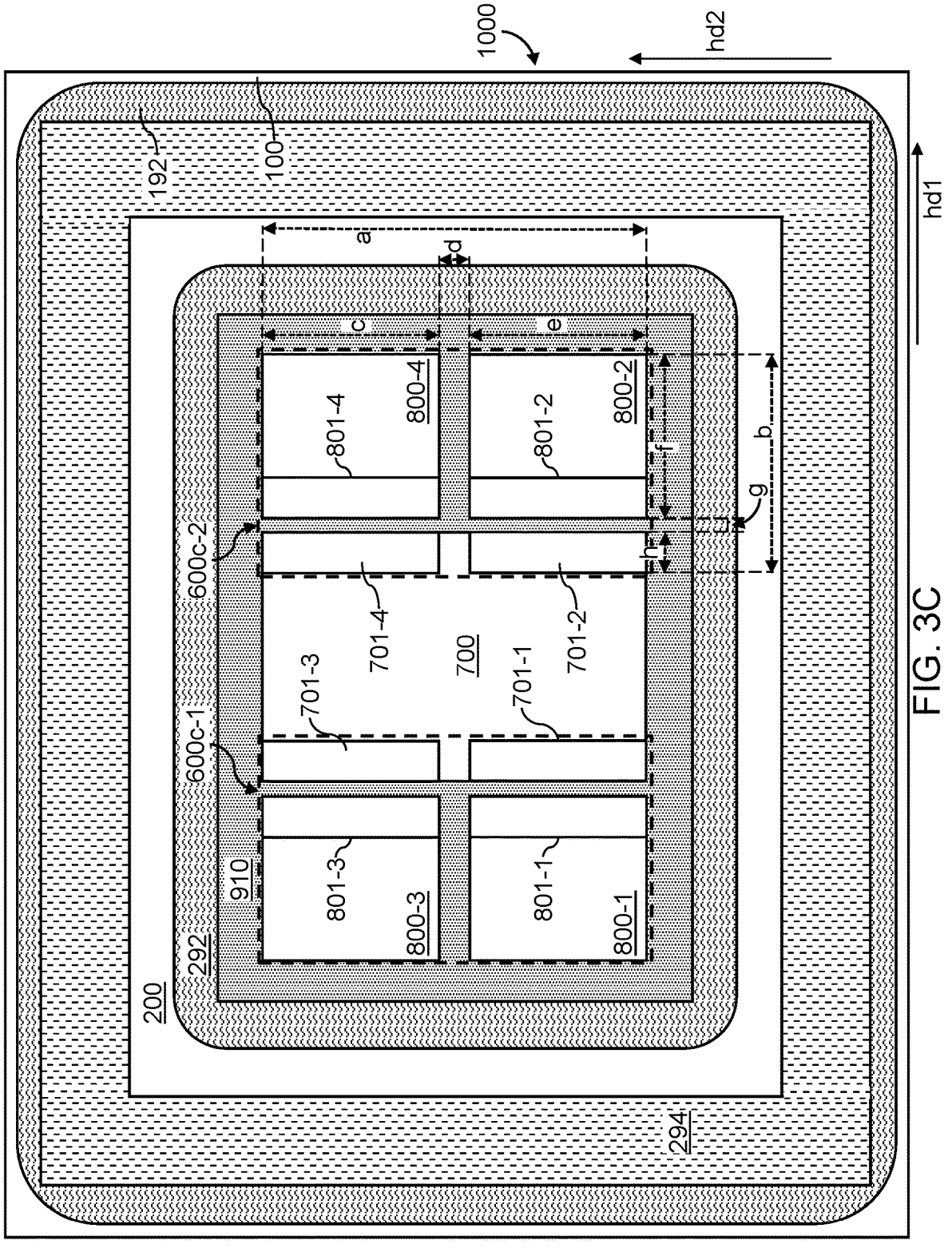
FIG. 3C is a top-down view of the chip package structure of FIG. 1A including a dashed outline of the cavities formed in FIGS. 3A and 3B.

FIG. 3A is a vertical cross-sectional view of a region the intermediate heatsink structure during formation of cavities according to an embodiment of the present disclosure. FIG. 3B is a bottom-up view of the intermediate heatsink structure of FIG. 3A including dashed outlines of the holes formed in FIG. 3A. FIG. 3C is a top-down view of the chip package structure of FIG. 1A including a dashed outline of the cavities formed in FIGS. 3A and 3B. Referring to FIGS. 3A-3C, one or more cavities 600*c*-1, 600*c*-2 (collectively cavities 600*c*) may be formed within the extruded heatsink base 600*e*. The cavities 600*c* may be formed using any known drilling, beveling, or etching process. For example, the cavities 600*c* may be drilled using a drilling apparatus 620. In some embodiments, the intermediate heatsink structure 600 may be molded or otherwise formed to include the cavities 600*c* within the extruded heatsink base 600*e* (i.e., no drilling process is needed).

The function of the cavities 600*c* is to create a space within the extruded heatsink base 600*e* in which to embed one or more thermoelectric coolers (TECs) that are to be positioned above an area of at least a portion of the semiconductor dies (700, 800) after affixing the heatsink structure to the chip package structure 1000 for purposes of reducing thermal cross-talk between heterogeneous components. Thus, the cavities 600c may be formed within the extruded heatsink base 600e such that, when affixing the heatsink structure to the top surface of the chip package structure 1000, the cavities 600c (then including TECs) will overlay at least an area of the fan-out package 900 in which thermal cross-talk is high or problematic (e.g., above proximate PHY interfaces of heterogeneous semiconductor dies (700, 800).

For example, a first cavity 600c-1 and a second cavity 600c-2 may be formed within the extruded heatsink base 600e relative to the semiconductor dies (700, 800). The cavity 600c-1 may be formed to be ultimately located above outer peripheries of the SoC PHY interface 701-1, the SoC PHY interface 701-3, the memory die 800-1, and the memory die 800-3 in a top-down view. The cavity 600c-2 may be formed to be ultimately located above outer peripheries of the SoC PHY interface 701-2, the SoC PHY interface 701-4, the memory die 800-2, and the memory die 800-4 in a top-down view. A length "a" of the cavity 600c-2 may be greater than or equal to the combined distance of (i) a length "c" of the memory die 800-4 (and/or a length of the SoC PHY interface 701-4), (ii) a length "e" of the memory die 800-2 (and/or a length of the SoC PHY interface 701-2), and (iii) a distance "d" between proximate sidewalls of the memory die 800-2 and the memory die 800-4 (and/or a distance between proximate peripheries of the SoC PHY interface 701-2 and SoC PHY interface 701-4). A width "b" of the cavity 600c-2 may be greater than or equal to the combined distance of (i) a width "h" of the SoC PHY interface 701-2 or the SoC PHY interface 701-4, (ii) a width "f" of the memory die 800-2 or the memory die 800-4, and (iii) a distance "g" between proximate sidewalls of the SoC die 700 and the memory dies 800-2 and 800-4. The cavity 600c-1 may similarly have a length "a" and width "b" as the cavity 600c-2 with respect to the outer peripheries of the SoC PHY interface 701-1, the SoC PHY interface 701-3, the memory die 800-1, and the memory die 800-3 in a top-down view.

Holes 600h-1 and 600h-2 may be drilled or otherwise formed in the cavities 600c-1 and 600c-2 respectively. For example, the holes 600h may be molded during the same molding process used to form the intermediate heatsink structure 600, or may be drilled out after forming the intermediate heatsink structure 600. As illustrated, the holes 600h may be located within a sidewall of the extruded heatsink base 600e, connecting an inner sidewalls of each cavity 600c to an outer sidewall of the extruded heatsink base 600e. The holes 600h may open up to an outer sidewall of the extruded heatsink base 600e. The holes 600h may be positioned within the extruded heatsink base 600e to subsequently receive and pass through an electrical wiring connection from TECs within the cavities 600c to an area outside of the outer sidewalls of the extruded heatsink base 600e. For example, the holes may be formed relatively close to a top surface within each of the cavities 600c (i.e., a bottom surface of the intermediate heatsink structure 600 within the cavities 600c).

The depth of the cavities 600c may be less than or equal to a height of the extruded heatsink base 600e (i.e., a distance between a bottom of the extruded heatsink base 600e and a bottom of the fin portion 600f). In some embodiments, the depth of the cavities 600c may extend beyond a height of the extruded heatsink base 600e and into a bottom portion of the fin portion 600f.

For illustrative purposes, two cavities 600c-1 and 600c-2 are shown. However, fewer or more cavities 600c may be drilled or otherwise formed within the intermediate heatsink structure. For example, in embodiments including fewer semiconductor dies, such as one SoC die 700 and one associated memory die 800, one cavity 600c may be formed to encompass a relative area above an outer periphery of the SoC PHY interface 701 and the memory PHY interface 801 or the memory die 800 in its entirety in a horizontal cross-sectional or top-down view.

For illustrative purposes, four holes 600h are shown (i.e., two for each TEC to be inserted into the cavities 600c). However, fewer or more holes 600h may be drilled or otherwise formed within the heatsink structure 601. For example, in embodiments including fewer semiconductor dies, such as one SoC die 700 and one associated memory die 800, one cavity 600c and two corresponding holes may be formed. In some embodiments, one hole 600h may be drilled or otherwise formed to be able to receive more than one electrical connection or wire.

In some embodiments including various sized semiconductor dies (700, 800), the widths, lengths, and depths of the various cavities may be varied. For example, a fan-out package may include an SoC die and corresponding HBM die and SRAM die, in which the HBM die and SRAM die are positioned proximate to the SoC die at distal sidewalls of the SoC die. Assuming the SRAM die has a larger profile (i.e., footprint) than the HBM die, the corresponding cavity to be formed and ultimately positioned above the SRAM die and the SoC PHY interface proximate to the SRAM die may have a larger width and/or length than the cavity to be formed and ultimately positioned above the HBM die and the SoC PHY interface proximate to the HBM die.

Figure 4A:
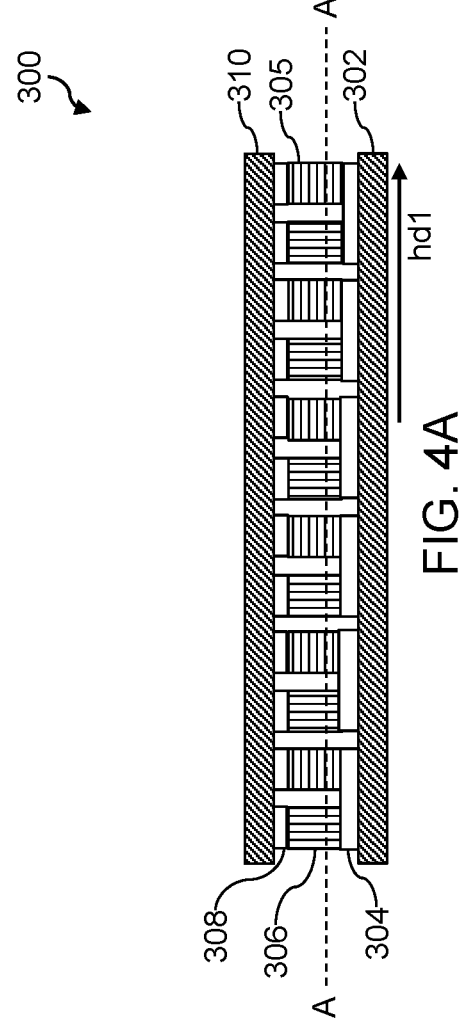
FIG. 4A is a vertical cross-sectional view of a region of a thermoelectric cooler (TEC) according to an embodiment of the present disclosure.
Figures 4B, 4C:
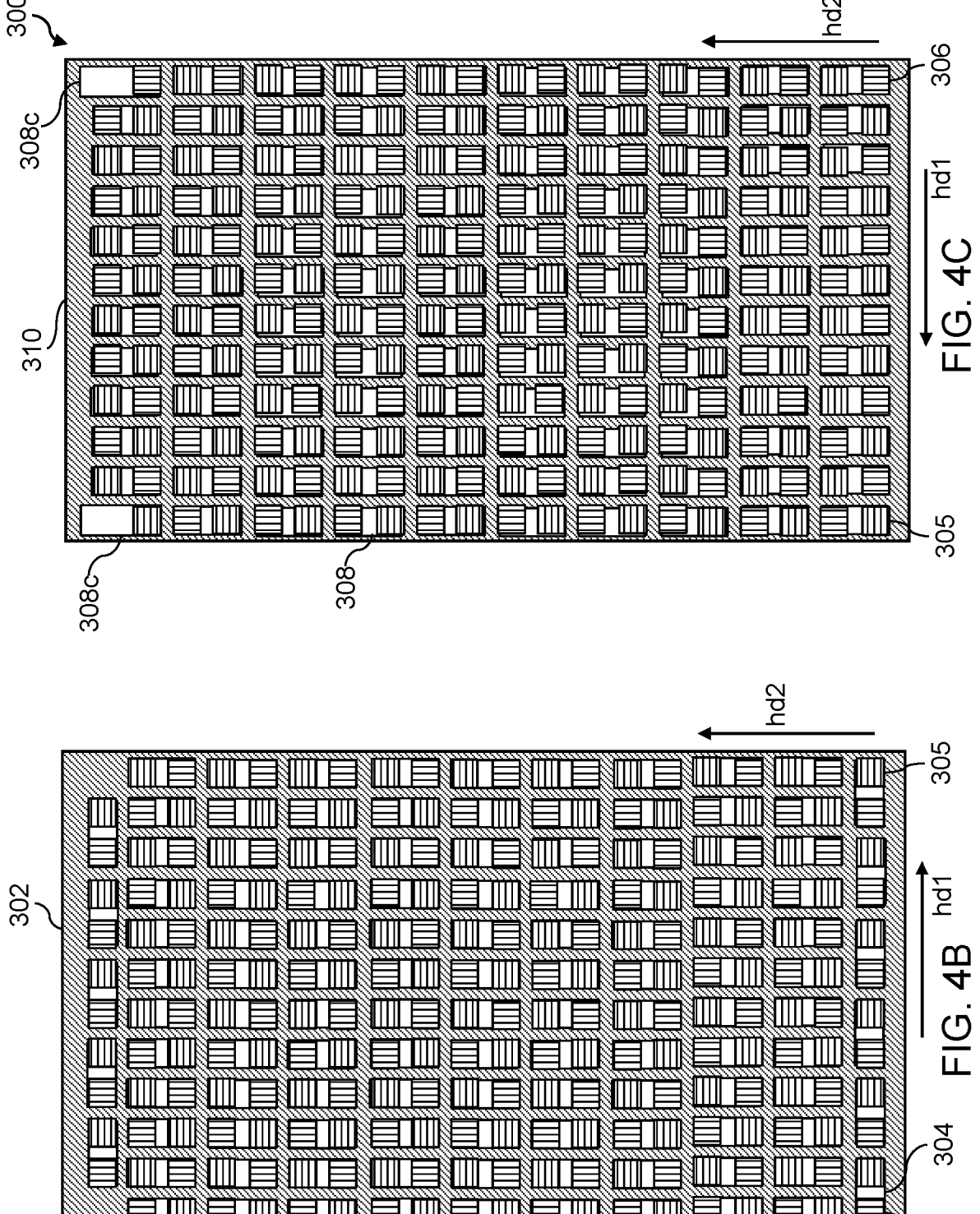
FIG. 4B is a top-down view of the TEC along the horizontal plane A-A' of FIG. 4A according to an embodiment of the present disclosure.
FIG. 4C is a bottom-up view of the TEC along the horizontal plane A-A' of FIG. 4A according to an embodiment of the present disclosure.

FIG. 4A is a vertical cross-sectional view of a region of a thermoelectric cooler (TEC) 300 according to an embodiment of the present disclosure. FIG. 4B is a top-down view of the TEC 300 along the horizontal plane A-A' of FIG. 4A according to an embodiment of the present disclosure. FIG. 4C is a bottom-up view of the TEC 300 along the horizontal plane A-A' of FIG. 4A according to an embodiment of the present disclosure. The TEC 300 may be silicon-based or ceramic-based that is compliant with the semiconductor dies (700, 800) (i.e., have compatible CTEs).

Referring to FIGS. 4A-4C, a TEC 300 may be formed using any known techniques, including sputtering. The TEC may include a bottom substrate 302, bottom conductor pads 304, N pellets 305 (i.e., N-type semiconductor pellets/junctions), P pellets 306 (i.e., P-type semiconductor pellets/junctions), top conductor pads 308, and a top substrate 310. The rectangular bottom conductor pads 304 may be formed on a top surface of the bottom substrate 302, an N pellet 305 and a P pellet 306 may be formed on top surfaces of each bottom conductor pad 304 on distal ends of each bottom conductor pad 304, and the top conductor pads 308 may be formed on top surfaces of the N pellets 305 and P pellets 306, such that the bottom conductor pads 304, N pellets 305, P pellets 306, and top conductor pads 308 form an electrical series connection. The series connection alternates between N pellets 305 and P pellets 306. The top conductor pads 308 may include connector top conductor pads 308c which are connected to the first and last N pellet 305 and P pellet 306 within the electrical series connection of alternating N pellets 305 and P pellets 306. The connector top conductor pads 308c may subsequently be connected to electrical wiring to allow for operation of the TEC 300 once embedded within the intermediate heatsink structure 600. A width and length of the bottom substrate 302 and the top substrate 310 may be less than or equal to a width and length of the cavities 600c, such that the TEC may be inserted into the cavities 600c.

Figure 5A:
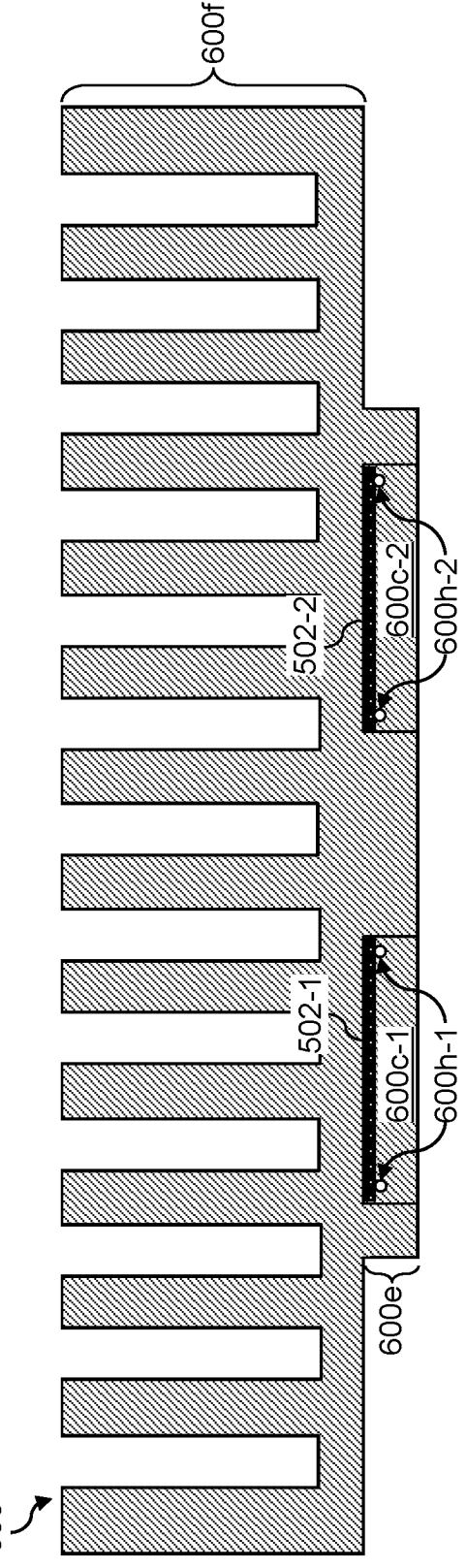
FIG. 5A is a vertical cross-sectional view of a region of the intermediate heatsink structure after formation of a thermal interface material according to an embodiment of the present disclosure.
Figure 5B:
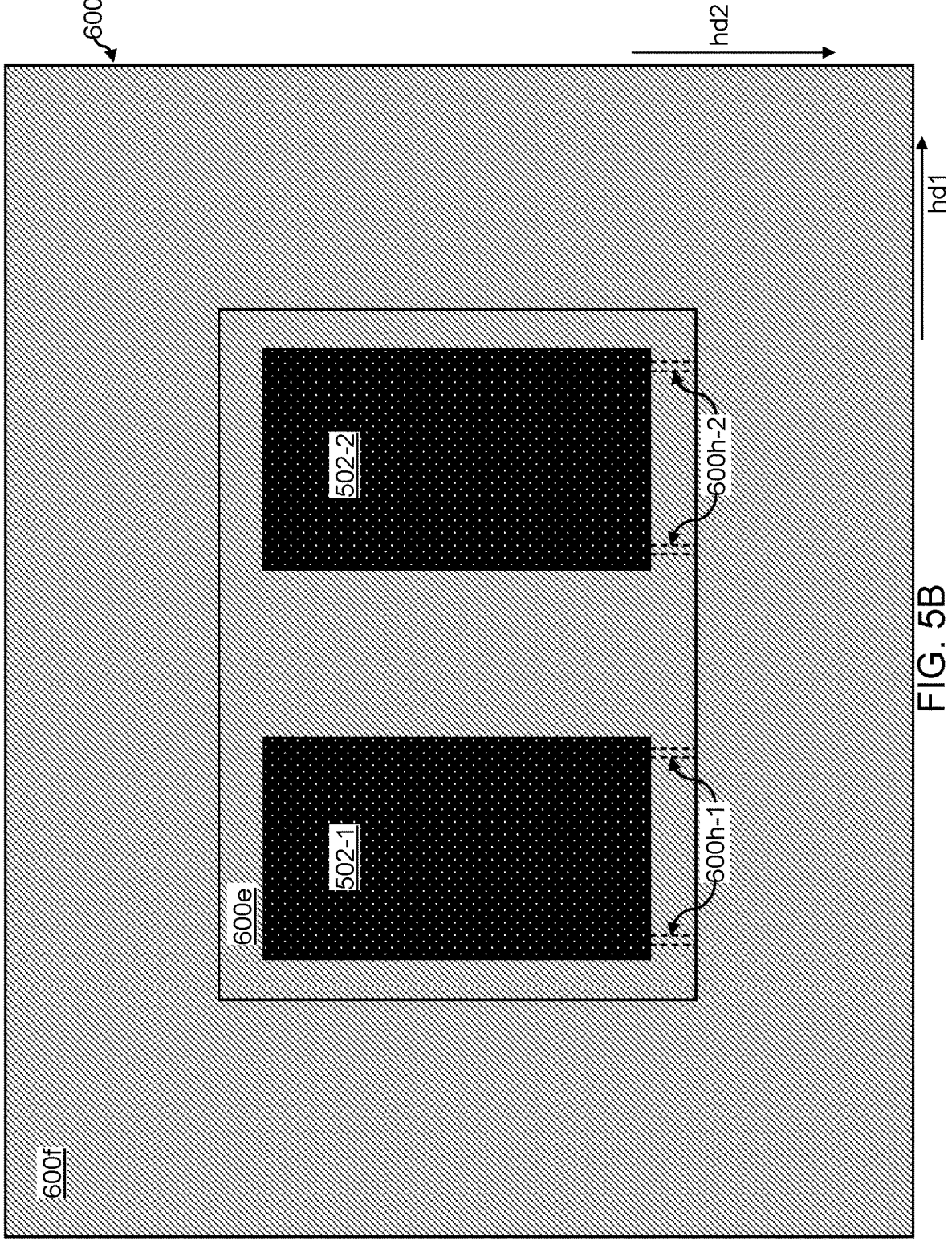
FIG. 5B is a bottom-up view of the intermediate heatsink structure of FIG. 5A according to an embodiment of the present disclosure.

FIG. 5A is a vertical cross-sectional view of a region of the intermediate heatsink structure after formation of a thermal interface material according to an embodiment of the present disclosure. FIG. 5B is a bottom-up view of the intermediate heatsink structure of FIG. 5A according to an embodiment of the present disclosure. Referring to FIGS. 5A and 5B, a thermal interface material (TIM) may be deposited or otherwise formed on top surfaces of the cavity 600c-1 and the cavity 600c-2 within the extruded heatsink base 600e to form respective TIM layers 502-1 and 502-2 (collectively 502). In some embodiments in which the cavities 600c extend beyond the height of the extruded heatsink base 600e, the TIM layers 502 may be formed on top surfaces of the cavities 600c within the fin portion 600f. In some embodiments, the TIM layers 502 may cover a portion of the top surfaces of the cavities 600c. In some embodiments, the TIM layers 502 may cover all of the top surfaces of the cavities 600c and may be in contact with sidewalls of the cavities 600c. The TIM layers 502 may be formed using one or more high thermal conductivity materials, such as graphite, liquid metal materials, or polymers including silicon, carbon, and oxygen. In some embodiments, the TIM layers 502 may include materials such as aluminum oxide ($Al_2O_3$) or zinc oxide ($ZnO_2$) mixed with silicone ($[R_2SiO]n$) and other applicable materials. In some embodiments, the thickness of the TIM layers 502 may be in a range from 10 μm to 300 μm, although lesser or greater thicknesses may be used.

Figure 6A:
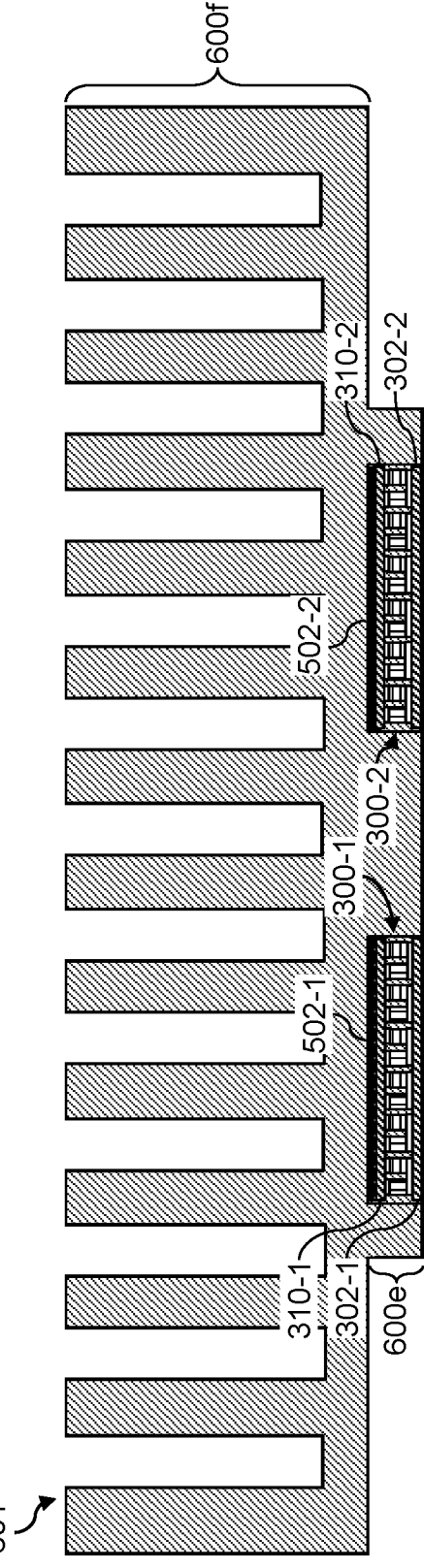
FIG. 6A is a vertical cross-sectional view of a region of the heatsink structure after attaching one or more TECs according to an embodiment of the present disclosure.
Figure 6B:
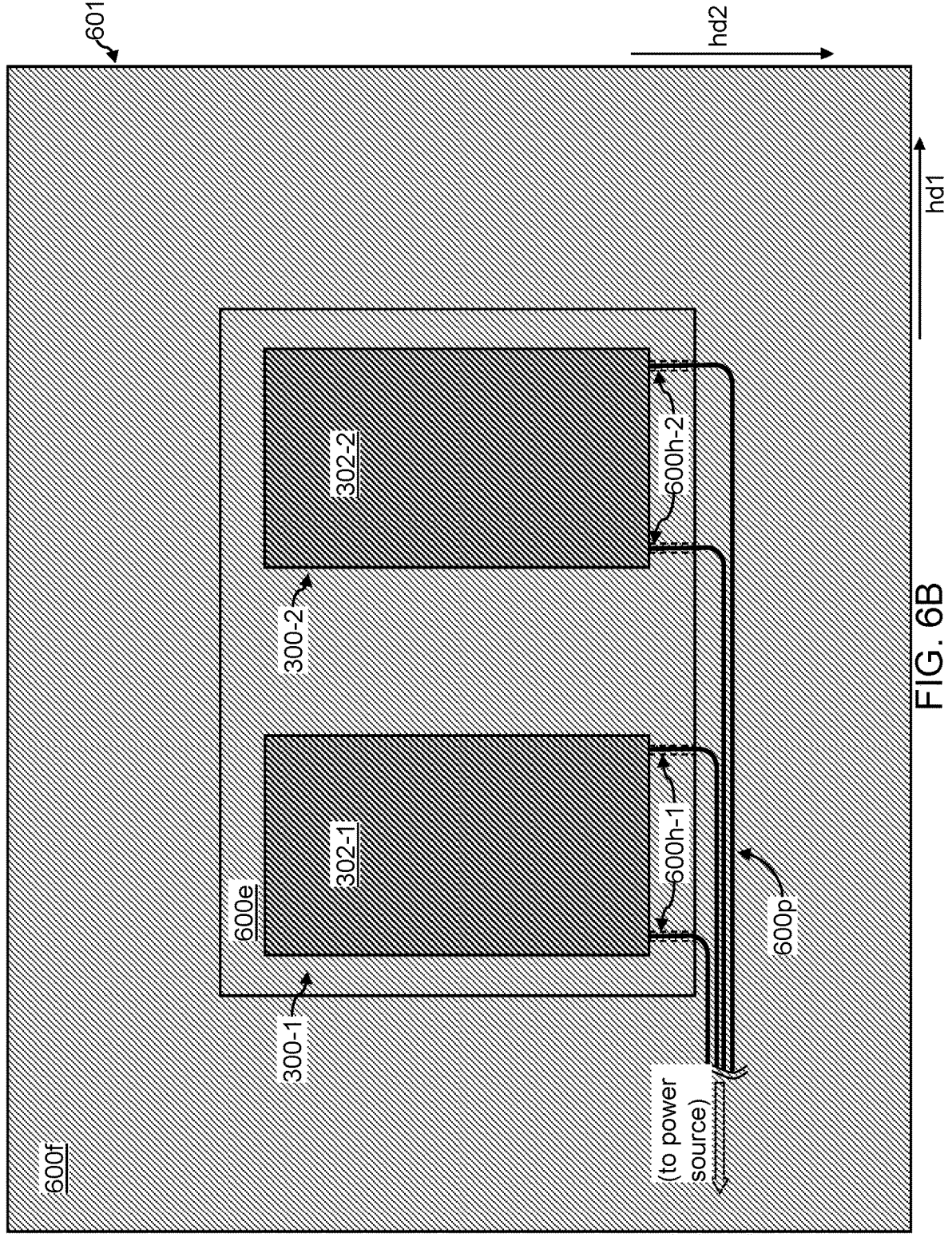
FIG. 6B is a bottom-up view of the heatsink structure of FIG. 6A according to an embodiment of the present disclosure.

FIG. 6A is a vertical cross-sectional view of a region of the heatsink structure after attaching one or more TECs according to an embodiment of the present disclosure. FIG. 6B is a bottom-up view of the heatsink structure of FIG. 6A according to an embodiment of the present disclosure. Referring to FIGS. 6A and 6B, TECs 300 may be inserted, embedded, or otherwise affixed to the intermediate heatsink structure 600 to form the heatsink structure 601.

In some embodiments, inserting, embedding, or otherwise affixing the TECs 300 to the intermediate heatsink structure 600 may include passing or embedding electrical connections 600p (e.g., positive, negative, ground if applicable) connected to the top conductor pads 308c of each TEC 300 through tunnels or trenches (e.g., holes 600h) formed in the intermediate heatsink structure 600, such that the TECs 300 may be connected to an external power supply or power source (not shown). For example, electrical connections 600p may be passed through the holes 600h-1 and 600h-2 to form electrical connections with the top conductor pads 308c of each TEC 300 (e.g., via a soldering process). In some embodiments, the TECs 300 may be inserted into the cavities 600c and the physical connection to the electrical connections 600p may be formed subsequently (i.e., inserting the electrical connections 600p from the outside of the extruded heatsink base 600e and affixing the electrical connections 600p to the top conductor pads 308c within the cavities 600c). In some embodiments, the electrical connections 600p may be attached to the TECs 300, the electrical connections 600p may then be passed through the holes 600h from the inside of the cavities 600c, and the TECs 300 may be inserted into the cavities 600c while simultaneously pulling excess wire of the electrical connections 600p through the holes 600h.

A first TEC 300-1 may have a bottom substrate 302-1 and a top substrate 310-1, and a second TEC may have a bottom substrate 302-2 and a top substrate 310-2. The TEC 300-1 may be inserted into the cavity 600c-1, such that a top surface of the top substrate 310-1 is in contact with a bottom surface of the TIM layer 502-1, and a bottom surface of the bottom substrate 302-1 is coplanar with a bottom surface of the extruded heatsink base 600e. The TEC 300-2 may be inserted into the cavity 600c-2, such that a top surface of the top substrate 310-2 is in contact with a bottom surface of the TIM layer 502-2, and a bottom surface of the bottom substrate 302-2 is coplanar with a bottom surface of the extruded heatsink base 600e (and therefore coplanar with the bottom surface of the bottom substrate 302-1 of the TEC 300-1).

In some embodiments, sidewalls of the bottom substrate 302-1 and the top substrate 310-1 may be in direct contact with sidewalls of the extruded heatsink base 600e within the cavity 600c-1. In some embodiments, sidewalls of the bottom substrate 302-1 and the top substrate 310-1 may not be in direct contact with sidewalls of the extruded heatsink base 600e within the cavity 600c-1, such that there exists a space or a nonconductive insulating material between said sidewalls. In some embodiments, sidewalls of the bottom substrate 302-2 and the top substrate 310-2 may be in direct contact with sidewalls of the extruded heatsink base 600e within the cavity 600c-2. In some embodiments, sidewalls of the bottom substrate 302-2 and the top substrate 310-2 may not be in direct contact with sidewalls of the extruded heatsink base 600e within the cavity 600c-2, such that there exists a space or a nonconductive insulating material between said sidewalls.

Figure 7A:
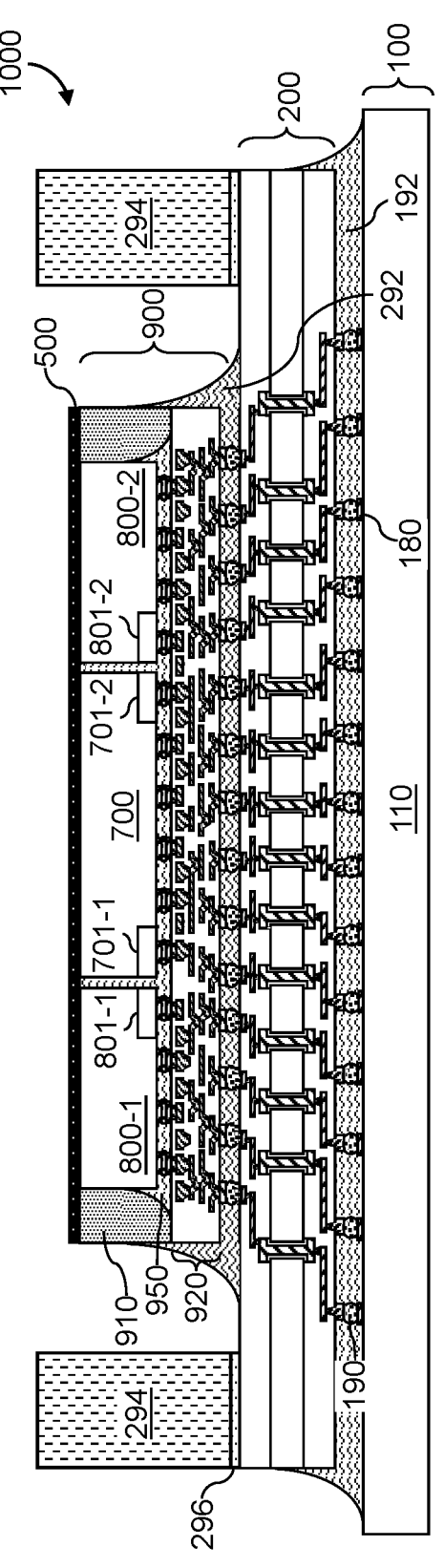
FIG. 7A is a vertical cross-sectional view of a region of an intermediate chip package assembly after forming a thermal interface material according to an embodiment of the present disclosure.
Figure 7B:
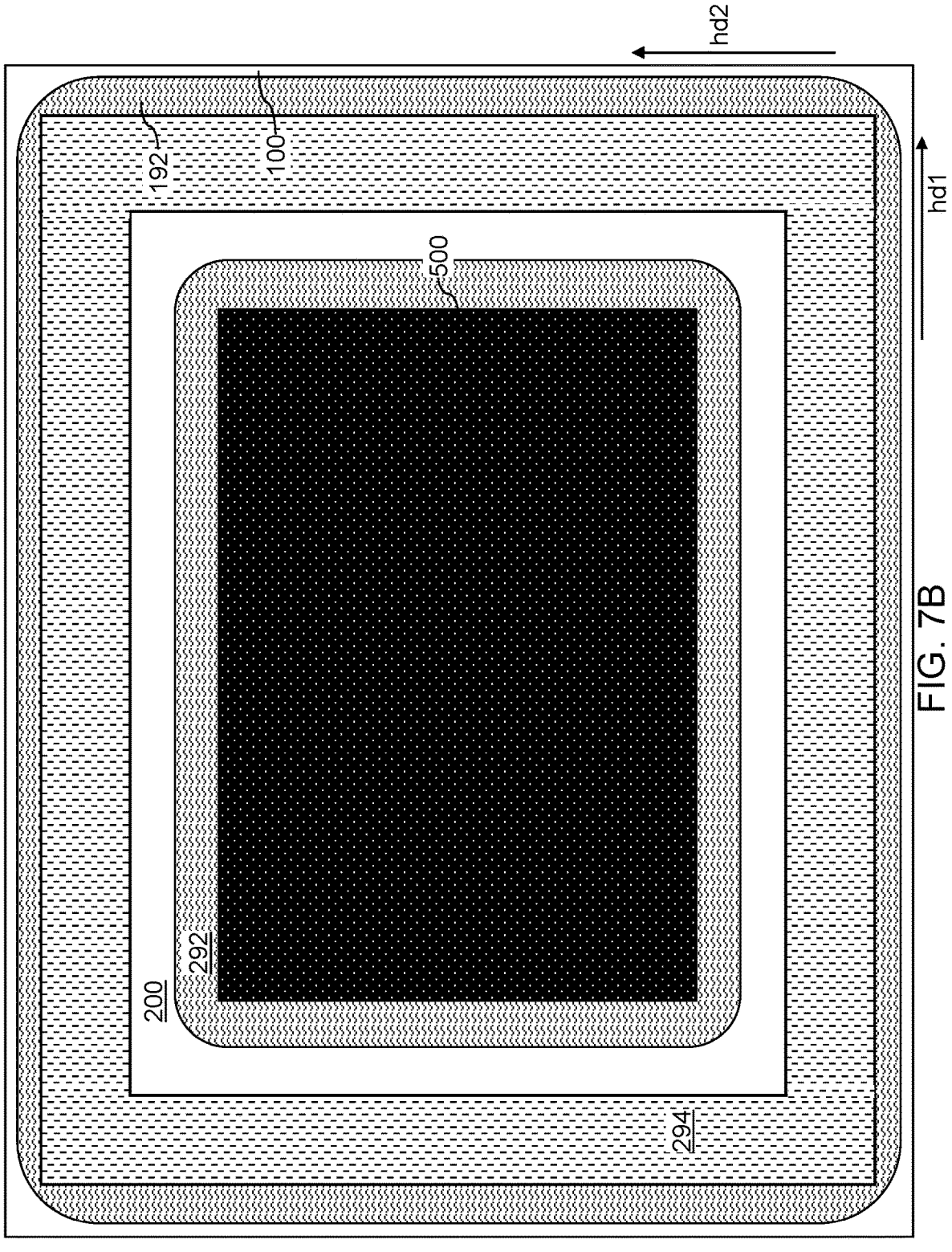
FIG. 7B is a top-down view of the intermediate chip package assembly of FIG. 7A.

FIG. 7A is a vertical cross-sectional view of a region of an intermediate chip package assembly after forming a thermal interface material according to an embodiment of the present disclosure. FIG. 7B is a top-down view of the intermediate chip package assembly of FIG. 7A. Referring to FIGS. 7A and 7B, a thermal interface material (TIM) may be deposited or otherwise formed on a top surface of the fan-out package 900 of the chip package structure 1000. The TIM may be formed as a TIM layer 500 that is in contact with top surfaces of the semiconductor dies (700, 800), the first underfill material portion 950, and the molding compound die frame 910. The TIM layer 500 may be formed using one or more high thermal conductivity materials, such as graphite, liquid metal materials, or polymers including silicon, carbon, and oxygen. In some embodiments, the TIM layer 500 may include materials such as aluminum oxide ($Al_2O_3$) or zinc oxide ($ZnO_2$) mixed with silicone ($[R_2SiO]n$) and other applicable materials. In some embodiments, the thickness of the TIM layer 500 may be in a range from 10 μm to 300 μm, although lesser or greater thicknesses may be used.

In some embodiments, the TIM layer 500 may be applied to a bottom surface of the heatsink structure 601 (i.e., bottom surfaces of the bottom substrates 302 and the extruded heatsink base 600e) illustrated in FIGS. 6A and 6B and then attached to a top surface of the fan-out package 900.

Figure 8A:
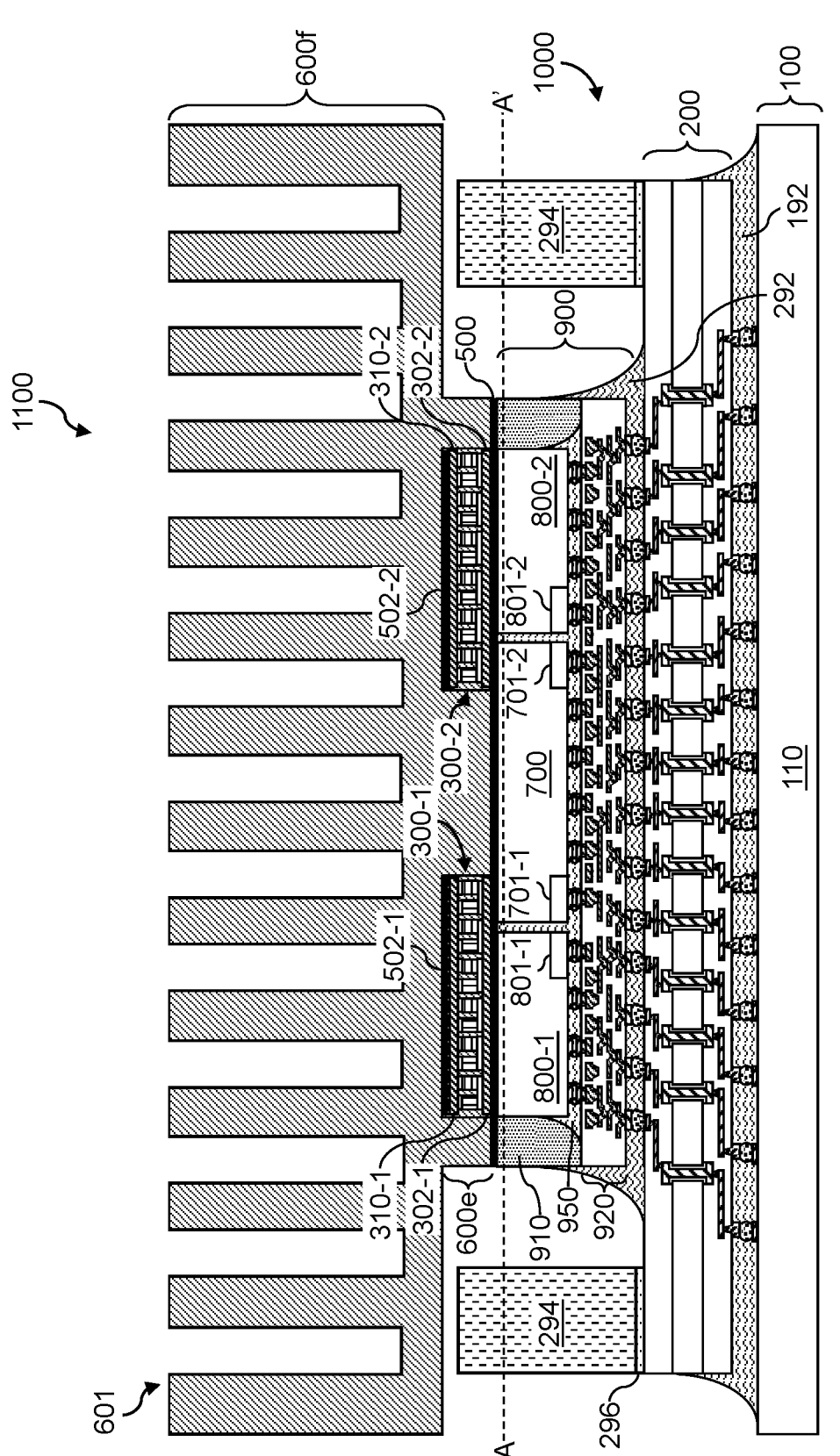
FIG. 8A is a vertical cross-sectional view of a region of a chip package assembly after attaching the heatsink structure according to an embodiment of the present disclosure.
Figure 8B:
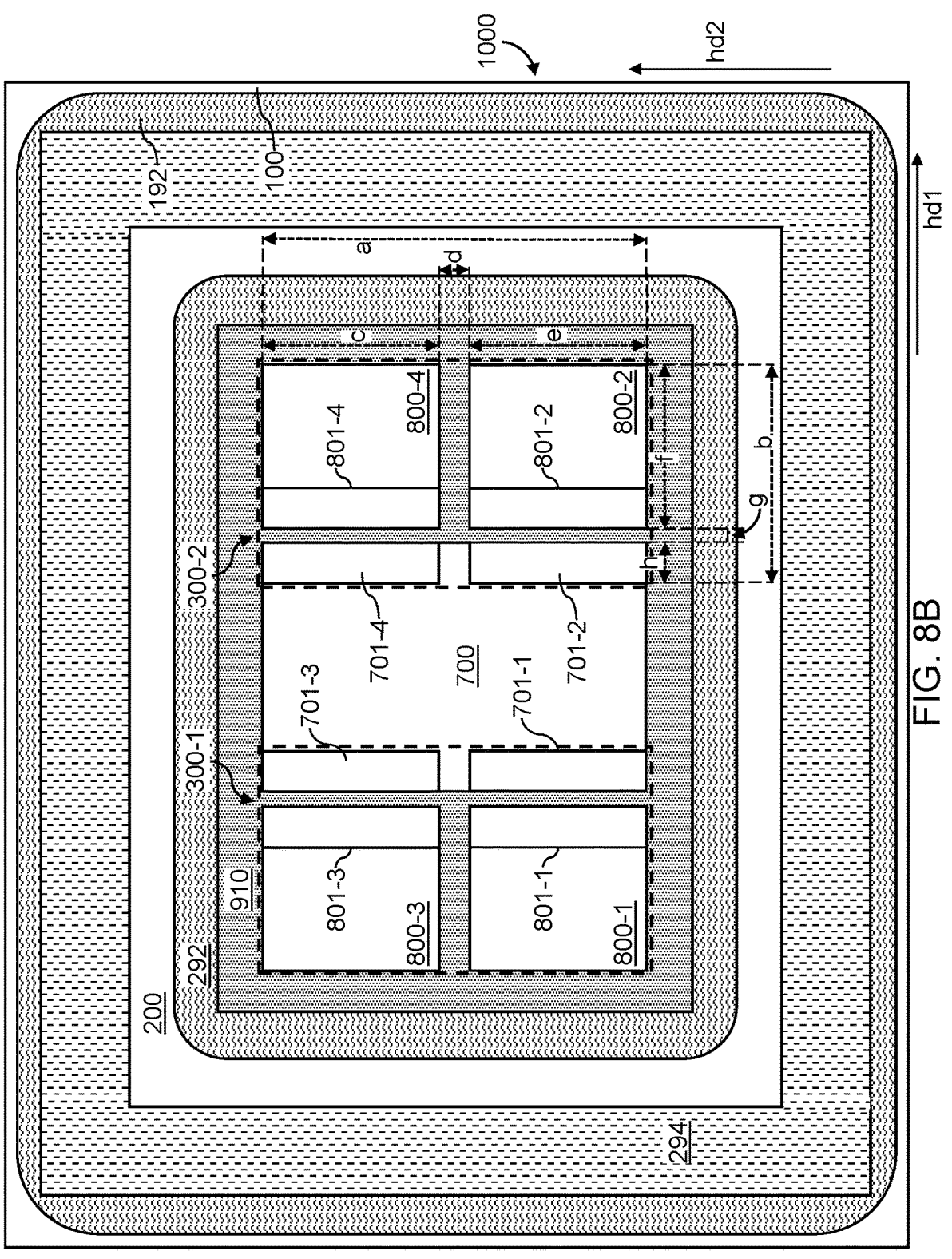
FIG. 8B is a top-down view of the chip package assembly along the horizontal plane B-B' of FIG. 8A including a dashed outline of the TECs.

FIG. 8A is a vertical cross-sectional view of a region of a chip package assembly after attaching the heatsink structure according to an embodiment of the present disclosure. FIG. 8B is a top-down view of the chip package assembly along the horizontal plane A-A' of FIG. 8A including a dashed outline of the TECs. Referring to FIGS. 8A and 8B, the heatsink structure 601 including the TECs 300 may be attached, affixed, or otherwise connected to the chip package structure 1000 to form a chip package assembly 1100.

A top surface of the TIM layer 500 may be in contact with a bottom surface of the extruded heatsink base, a bottom surface of the bottom substrate 302-1, and a bottom surface of the bottom substrate 302-2. The TECs 300 may overlay at least a portion of the areas of the fan-out package 900 with high operating thermal cross-talk (e.g., above two proximate PHY interfaces (e.g., SoC PHY interface 701-1 and memory PHY interface 801-1; SoC PHY interface 701-2 and memory PHY interface 801-2; SoC PHY interface 701-3 and memory PHY interface 801-3; SoC PHY interface 701-4 and memory PHY interface 801-4), or above a memory die 800 and a proximate SoC PHY interface). For example, the TEC 300-1 may overlay an area greater than or equal to a peripheral area in a top-down view including at least the SoC PHY interface 701-1, SoC PHY interface 701-3, memory die 800-1, and memory die 800-3. The TEC 300-2 may overlay an area greater than or equal to a peripheral area in a top-down view including at least the SoC PHY interface 701-2, SoC PHY interface 701-4, memory die 800-2, and memory die 800-4. In other words, the TECs 300 may overlay an area as defined by the length "a" and width "b" of the cavities 600c and the position of the cavities 600c.

By embedding TECs 300 within the heatsink structure 601 and positioning the TECs above areas that exhibit high thermal cross-talk during operating of the semiconductor dies (700, 800), the TECs 300 may help reduce or dissipate heat that may otherwise have been transferred to lower power semiconductor dies (700, 800) (e.g., memory dies 800) from higher power semiconductor dies (700, 800) (e.g., SoC die 700). For example, the TECs 300 may redirect heat from above the SoC PHY interfaces 701-1, 701-2, 701-3, and 701-4 and adjacent portions of the SoC die 700 by absorbing the heat through the bottom substrates 302-1 and 302-2, conveying the heat through the TECs 300 out to the top substrates 310-1 and 310-2, and distributing the heat into the fin portions 600f. Thus, the embedded TECs 300 allow for the reduction of thermal cross-talk between heterogeneous semiconductor dies (700, 800) by transferring a portion of the heat from the SoC die into the heatsink structure 601 closer to the fins of the fin portion 600f and bottom surfaces of trenches between the fins. Redistributing heat closer to the aerated fins may allow for increased cooling rates and thermal cross-talk reduction, thereby reducing thermal stress on components within the fan-out package 900 that have CTE mismatch.

Figure 9A:
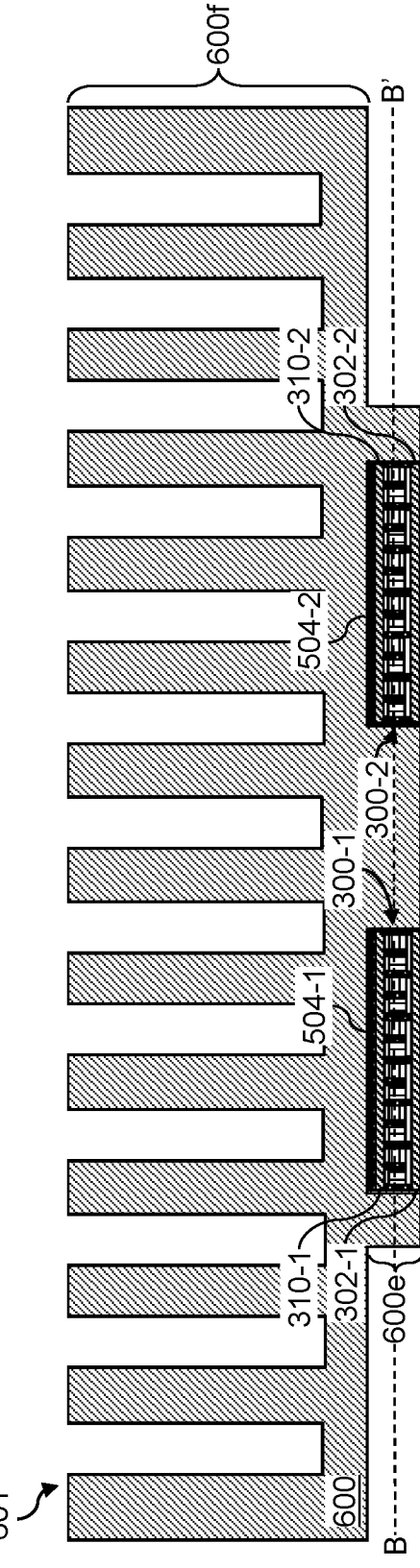
FIG. 9A is a vertical cross-sectional views of first alternative structure after attaching one or more TECs according to an embodiment of the present disclosure.
Figure 9B:
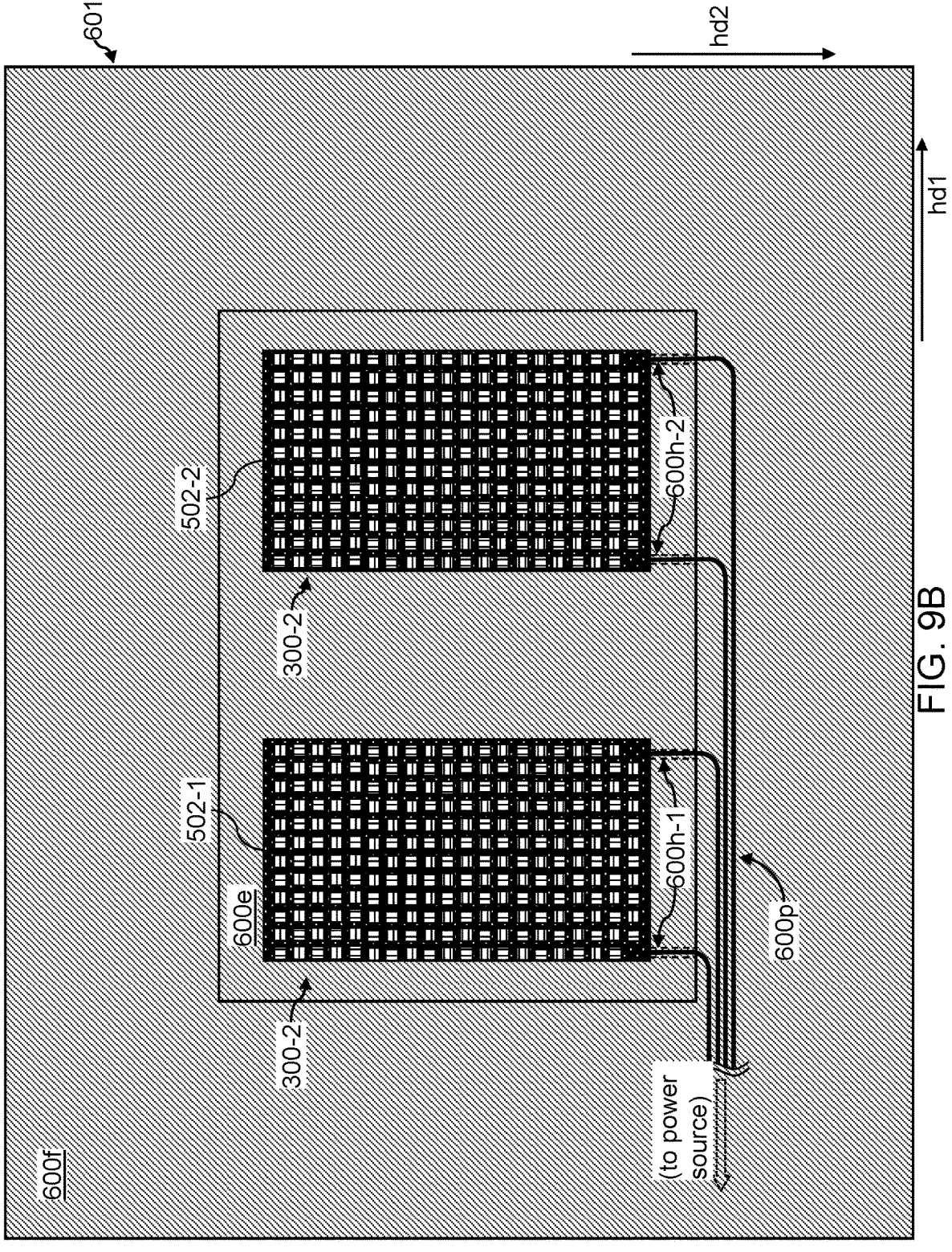
FIG. 9B is a bottom up view along the horizontal plane B-B' of FIG. 9A of a first alternative structure after attaching one or more TECs according to an embodiment of the present disclosure.

FIGS. 9A and 9B are various views of a first alternative structure after attaching one or more TECs according to an embodiment of the present disclosure. FIG. 9A is a vertical cross-sectional view and FIG. 9B is a bottom-up view along the horizontal plane B-B' of FIG. 9A. Referring to FIGS. 9A and 9B, a thermal interface material (TIM) may be deposited to form TIM encapsulation layers 504-1 and 504-2 (collectively, TIM encapsulation layers 504) around the TEC 300-1 and TEC 300-2 respectively.

The TIM encapsulation layers 504 may surround and be in contact with sidewalls of the TECs 300, including sidewalls of the bottom substrates 302, bottom conductor pads 304, N pellets 305, P pellets 306, top conductor pads 308, and top substrates 310. The TIM encapsulation layers 504 may further be in contact with exposed top surfaces of the bottom substrates 302 and bottom conductor pads 304, and in contact with exposed bottom surfaces of the top conductor pads 308 and the top substrates 310.

The TIM encapsulation layers 504 may be formed as separate layers involving multiple deposition processes, or may be formed in a single deposition process. For example, a first layer of the TIM encapsulation layers 504 may be deposited or otherwise formed on top surfaces of the cavities 600c (i.e., on bottom surfaces of the heatsink structure 601 within the cavities 600c), the TECs 300 may then be inserted within the cavities 600c to be in contact with a bottom surface of the first layer of the TIM encapsulation layers 504, and one or more remaining layers of the TIM encapsulation layers 504 may be deposited to encompass all remaining exposed surfaces of the TECs 300. As another example, the TECs 300 may be encompassed or otherwise encapsulated by the TIM encapsulation layers 504, and may then be inserted into the cavities 600c. As a further example, the TECs 300 may be inserted into the cavities 600c, and the TIM encapsulation layers 504 may then be deposited to encompass the TECs 300.

In some embodiments the TIM encapsulation layers 504 may be in contact with a bottom surface of the bottom substrates 302, such that excess TIM may have been deposited during the deposition process. In such embodiments, the excess TIM may be removed, or may be retained to be in contact with a top surface of the fan-out package 900 when affixing the heatsink structure 601 to the chip package structure 1000.

The TIM layer 500 may be formed using one or more high thermal conductivity materials, such as graphite, liquid metal materials, or polymers including silicon, carbon, and oxygen. In some embodiments, the TIM layer 500 may include materials such as aluminum oxide ($Al_2O_3$) or zinc oxide ($ZnO_2$) mixed with silicone ($[R_2SiO]n$) and other applicable materials. In some embodiments, the thickness of the TIM layer 500 may be in a range from 10 μm to 300 μm, although lesser or greater thicknesses may be used.

Figure 10:
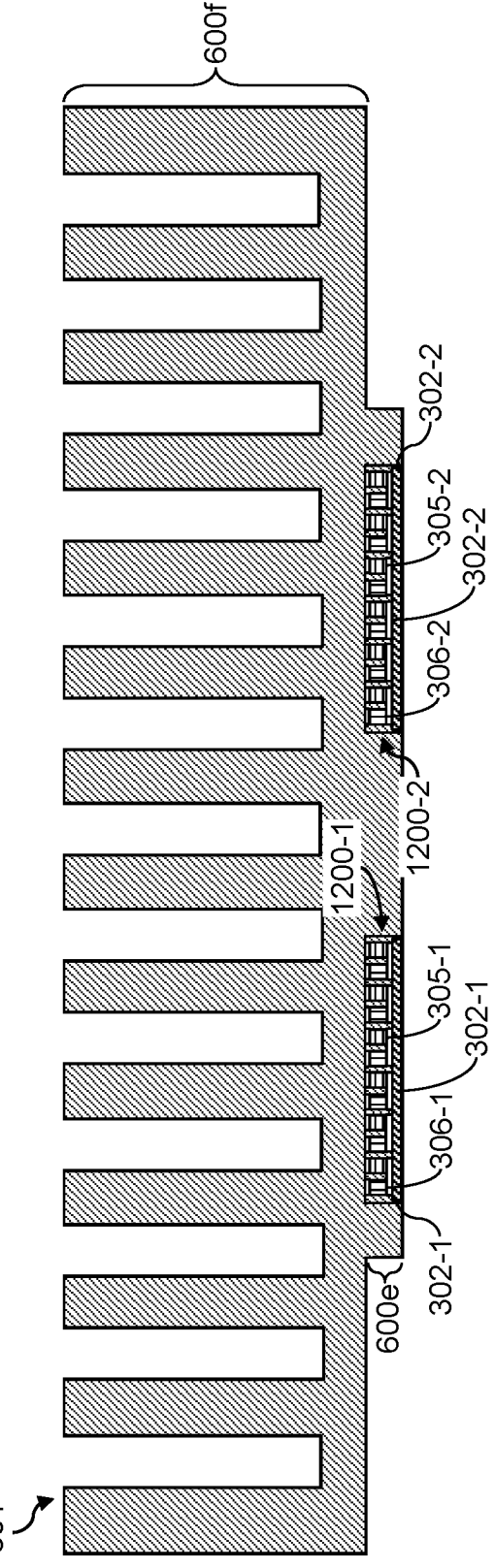
FIG. 10 is a vertical cross-sectional view of a second alternative structure after forming a one or more TEC structures onto a top surface of one or more cavities within a heatsink structure according to an embodiment of the present disclosure.

FIG. 10 is a vertical cross-sectional view of a second alternative structure after forming a one or more TEC structures onto a top surface of one or more cavities within a heatsink structure according to an embodiment of the present disclosure. Referring to FIG. 10, TEC structures 1200 (e.g., 1200-1, 1200-12) may be formed directly on a top surface within the cavities 600c (i.e., a bottom surface of the heatsink structure 601 within the cavities 600c). The heatsink structure 601 may be a ceramic material or other nonconductive material upon which the top conductor pads may be formed or otherwise attached to be in direct contact with bottom surfaces of the heatsink structure 601 within the cavities 600c. Thus, the TEC structures 1200 may be formed without a top substrate (e.g., top substrate 310).

In some embodiments, each of the TEC structures 1200 may be formed fully (i.e., forming single structures including top conductor pads 308, N pellets 305, P pellets 306, bottom conductor pads 304, and a bottom substrate 302), and then affixed to a bottom surface of the heatsink structure 601 within each cavity 600c. In some embodiments, the TEC structures 1200 may be formed piecewise within the cavities 600c. For example, the top conductor pads 308 may be formed, then the N pellets 305 and P pellets 306 may be formed on bottom surfaces of the top conductor pads 308, bottom conductor pads 304 may be formed on bottom surfaces of the N pellets 305 and P pellets 306 to form P-N junctions, and a bottom substrate 302 may be formed on bottom surfaces of the bottom conductor pads 304. Such a sequential process may be performed using various manufacturing techniques, including sputtering.

In some embodiments, the heatsink structure 601 may be referred to as a top substrate of the TEC structures 1200, such that the heatsink structure 601 is a component of the TEC structures 1200. In some embodiments, each of the TEC structures 1200 may wholly refer to the combination of top conductor pads 308, N pellets 305, P pellets 306, bottom conductor pads 304, and a bottom substrate 302, and the heatsink structure 601 may be referred to as a separate structure that is not a component of the TEC structures 1200.

Figure 11A:
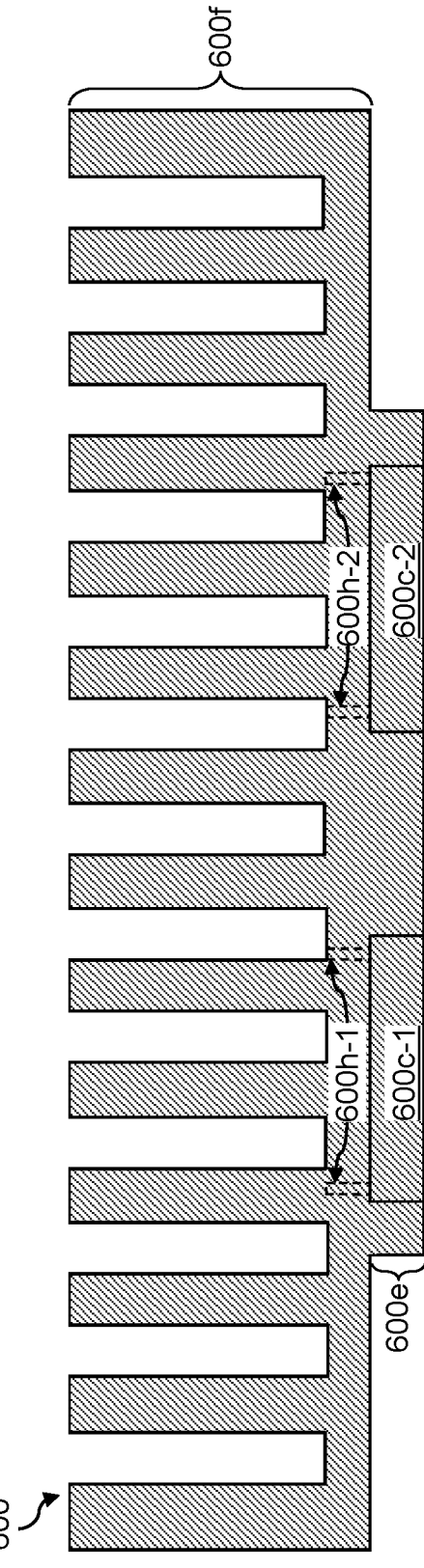
FIGS. 11A-11C are various views of a third alternative structure after forming one or more holes within an intermediate heatsink structure according to an embodiment of the present disclosure.
Figure 11B:
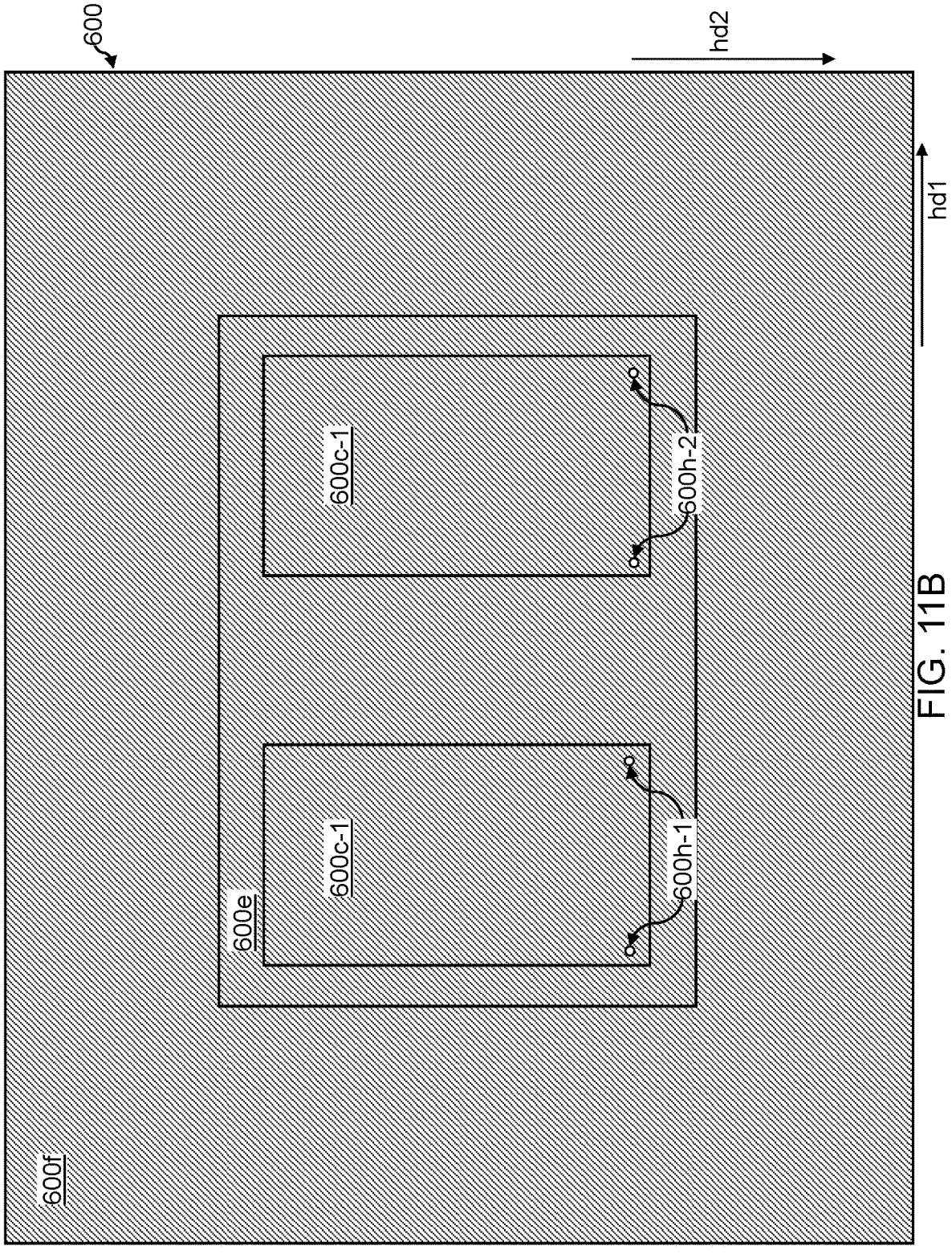
Figure 11C:
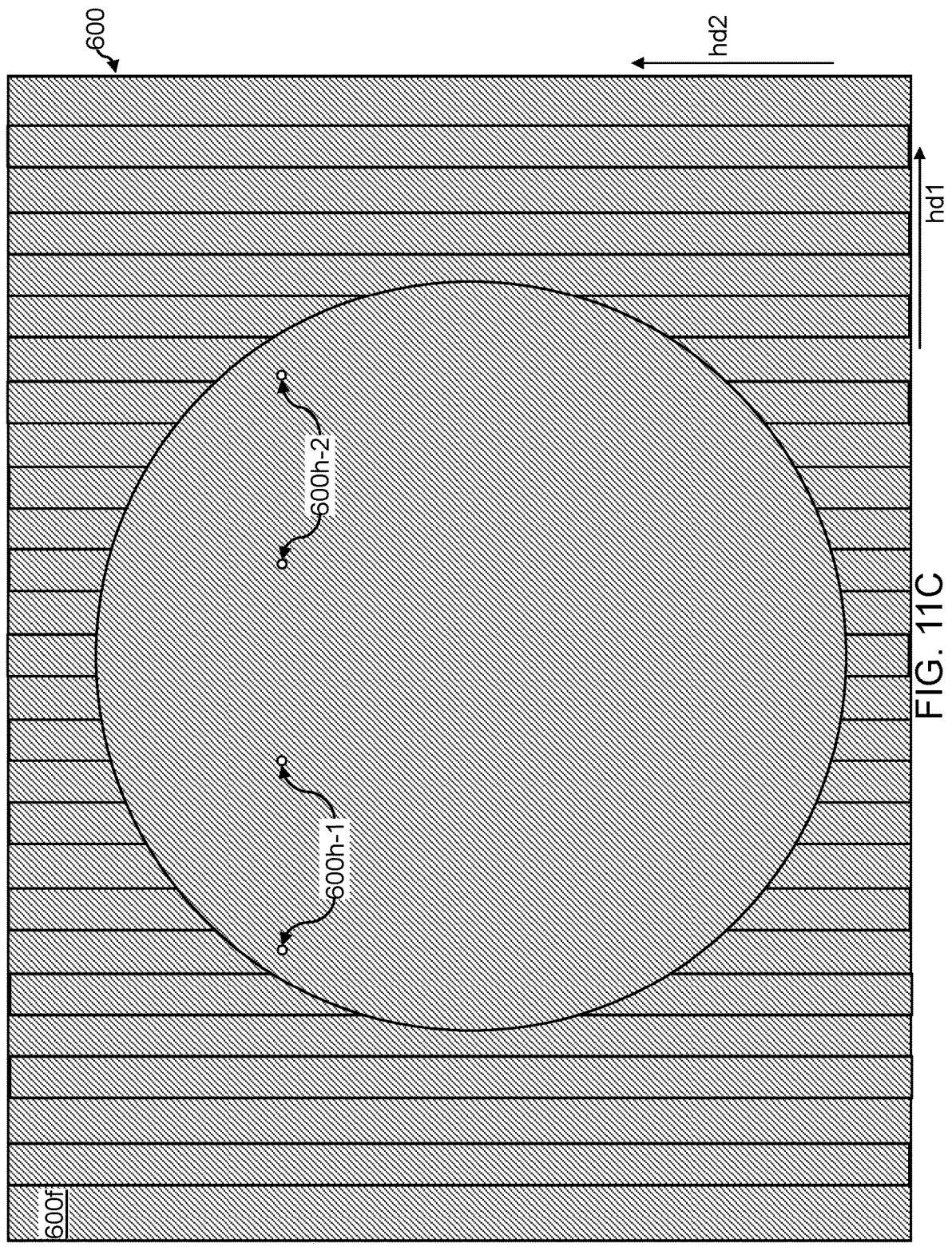

FIGS. 11A and 11B are various views of a third alternative structure after forming one or more holes within an intermediate heatsink structure according to an embodiment of the present disclosure. FIG. 11A is a vertical cross-sectional view and FIG. 11B is a bottom-up view of the intermediate heatsink structure 600 of FIG. 11A. FIG. 11C is a top-down view of the intermediate heatsink structure 600 of FIGS. 11A and 11B. Referring to FIGS. 11A-11C, one or more cavities 600c may be formed within the extruded heatsink base 600e, and holes 600h may be formed to connect each cavity 600c to a top surface of the intermediate heatsink structure 600 (i.e., to form a tunnel through which an electrical connection (e.g., wire) may be passed through). The cavities 600c and holes 600h may be formed using any known drilling, beveling, or etching process. For example, the cavities 600c and holes 600h may be drilled using a drilling apparatus 620. In some embodiments, the intermediate heatsink structure 600 may be molded or otherwise formed to include the cavities 600c within the extruded heatsink base 600e and the holes 600h within the fin portion 600f of the intermediate heatsink structure 600 (i.e., no drilling process is needed).

Holes 600h-1 and 600h-2 may be drilled or otherwise formed within the cavities 600c-1 and 600c-2 respectively. For example, the holes 600h may be molded during the same molding process used to form the intermediate heatsink structure 600, or may be drilled out after forming the intermediate heatsink structure 600. As illustrated, the holes 600h may be extend from the cavities 600c and extend through the fin portion 600f of the heatsink structure 601. The holes 600h may open up to a bottom surface of the fin portion 600f and a top surface of the cavities 600c. The holes 600h may be positioned within the fin portion 600f to subsequently receive and pass through an electrical wiring connection from TECs within the cavities 600c to a space between the fins of the fin portion 600f.

For illustrative purposes, four holes 600h are shown (i.e., two for each TEC to be inserted into the cavities 600c). However, fewer or more holes 600h may be drilled or otherwise formed within the heatsink structure 601. For example, in embodiments including fewer semiconductor dies, such as one SoC die 700 and one associated memory die 800, one cavity 600c and two corresponding holes may be formed. In some embodiments, one hole 600h may be drilled or otherwise formed to be able to receive more than one electrical connection or wire. In some embodiments, trenches may be formed laterally on a surface of the fin portion 600f to embed the electrical connections within the heatsink structure 601, such that a top surface of the electrical connections and a top surface of the trenches are coplanar.

Figure 12A:
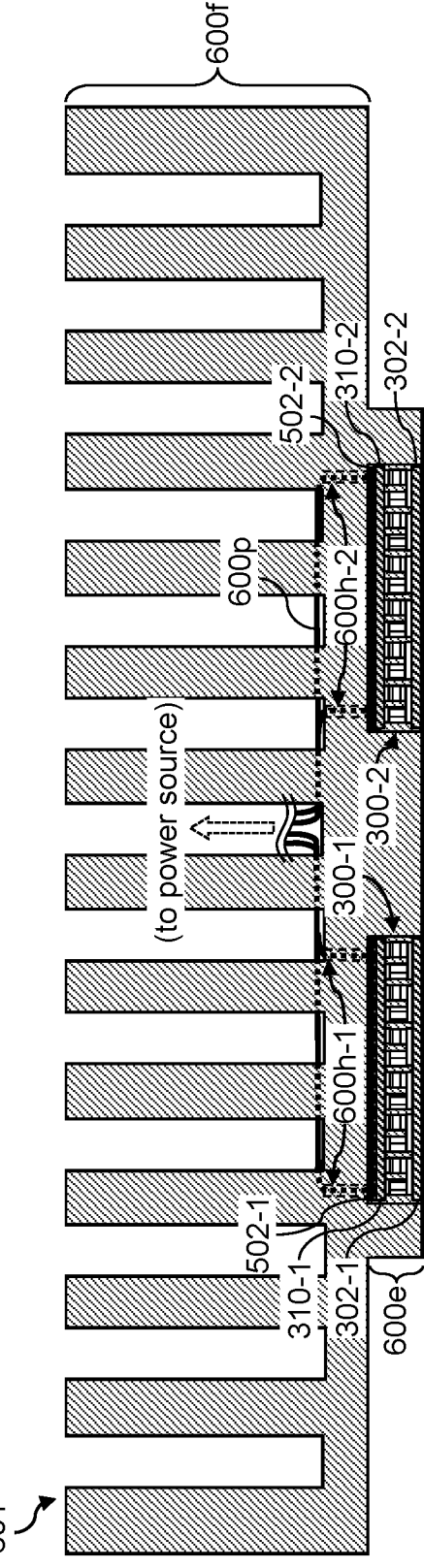
FIGS. 12A and 12B are various views of the third alternative structure after attaching one or more TECs to the intermediate heatsink structure according to an embodiment of the present disclosure.
Figure 12B:
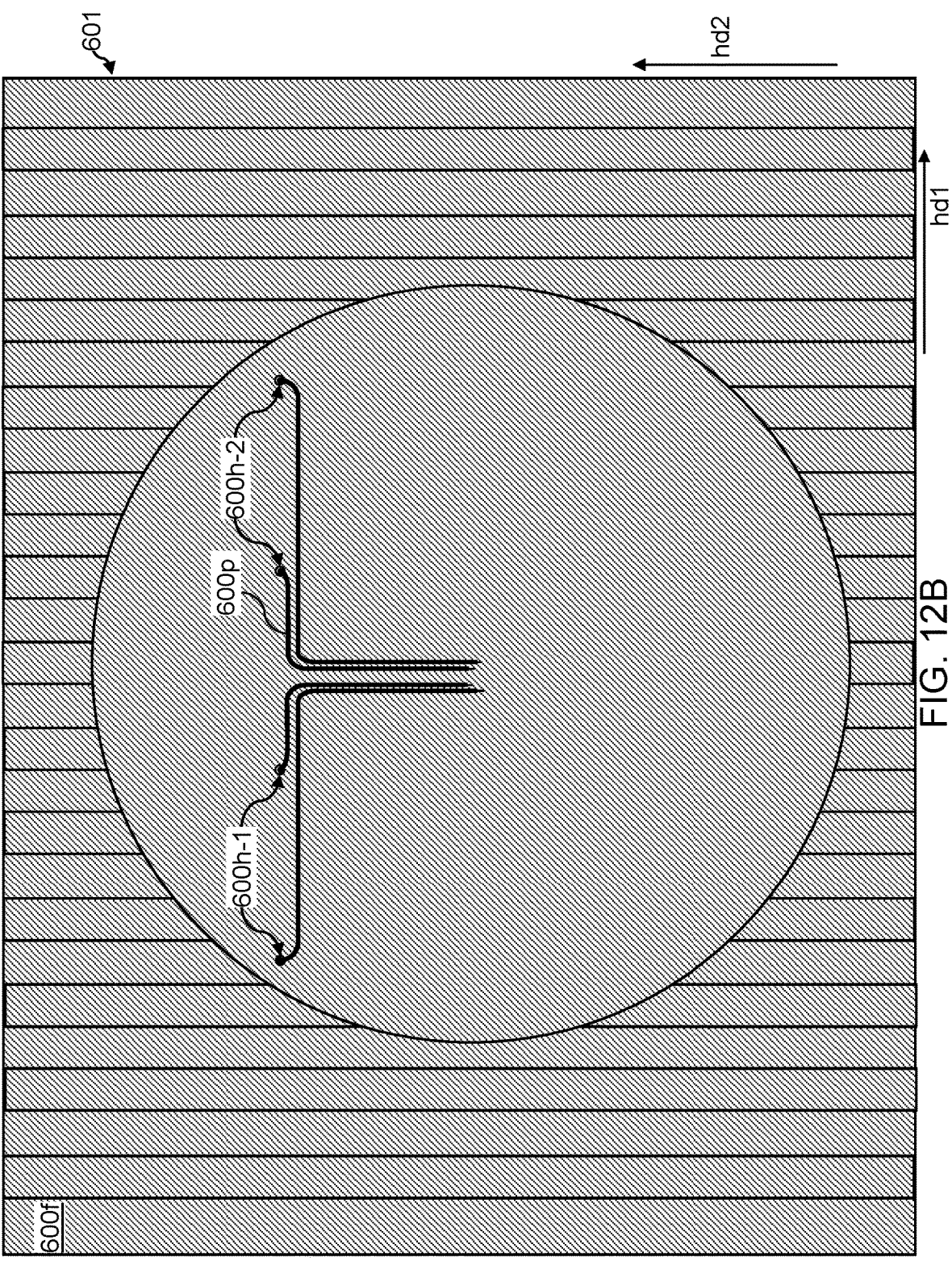

FIGS. 12A and 12B are various views of the third alternative structure after attaching one or more TECs to the intermediate heatsink structure according to an embodiment of the present disclosure. FIG. 12A is a vertical cross-sectional view and FIG. 12B is a top-down view of the heatsink structure 601 of FIG. 12A. Referring to FIGS. 12A and 12B, the TECs 300 may be inserted into the cavities 600c and attached to the intermediate heatsink structure 600 in a similar manner as described with reference to FIGS. 5A-6B to form the heatsink structure 601. The electrical connections 600p may be inserted through the holes 600h prior to, during, or after the process of attaching the TECs 300 to the heatsink structure 600 via the TIM layers 502. The electrical connections 600p may extend through the holes 600h to connect the TECs 300 to an external power source or power supply (not shown).

Figure 13A:
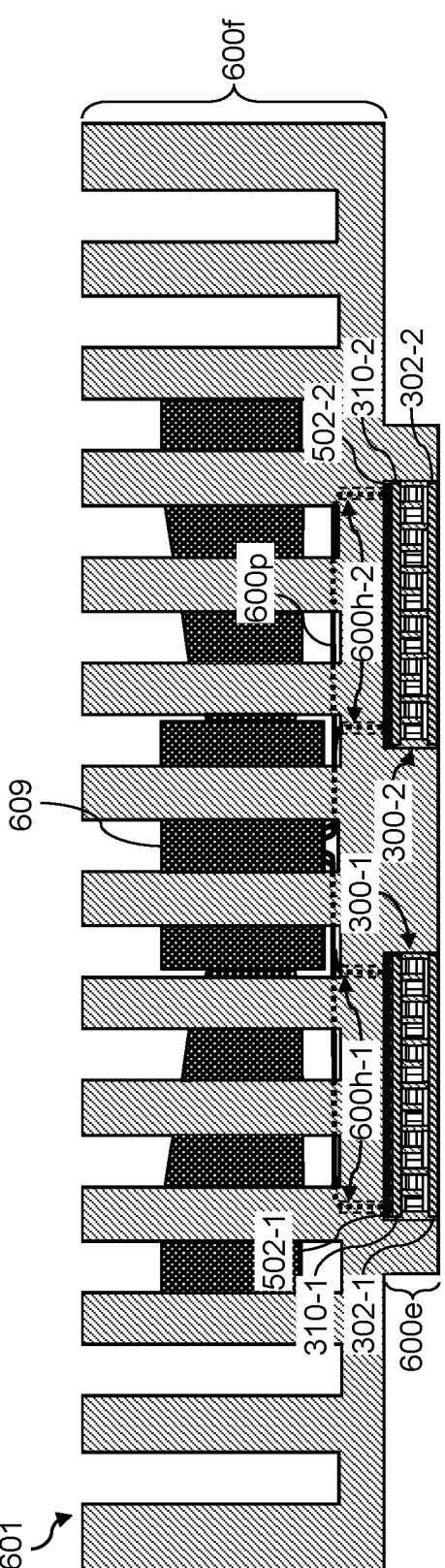
FIGS. 13A and 13B are various views of the third alternative structure after attaching a fan module to the heatsink structure according to an embodiment of the present disclosure.
Figure 13B:
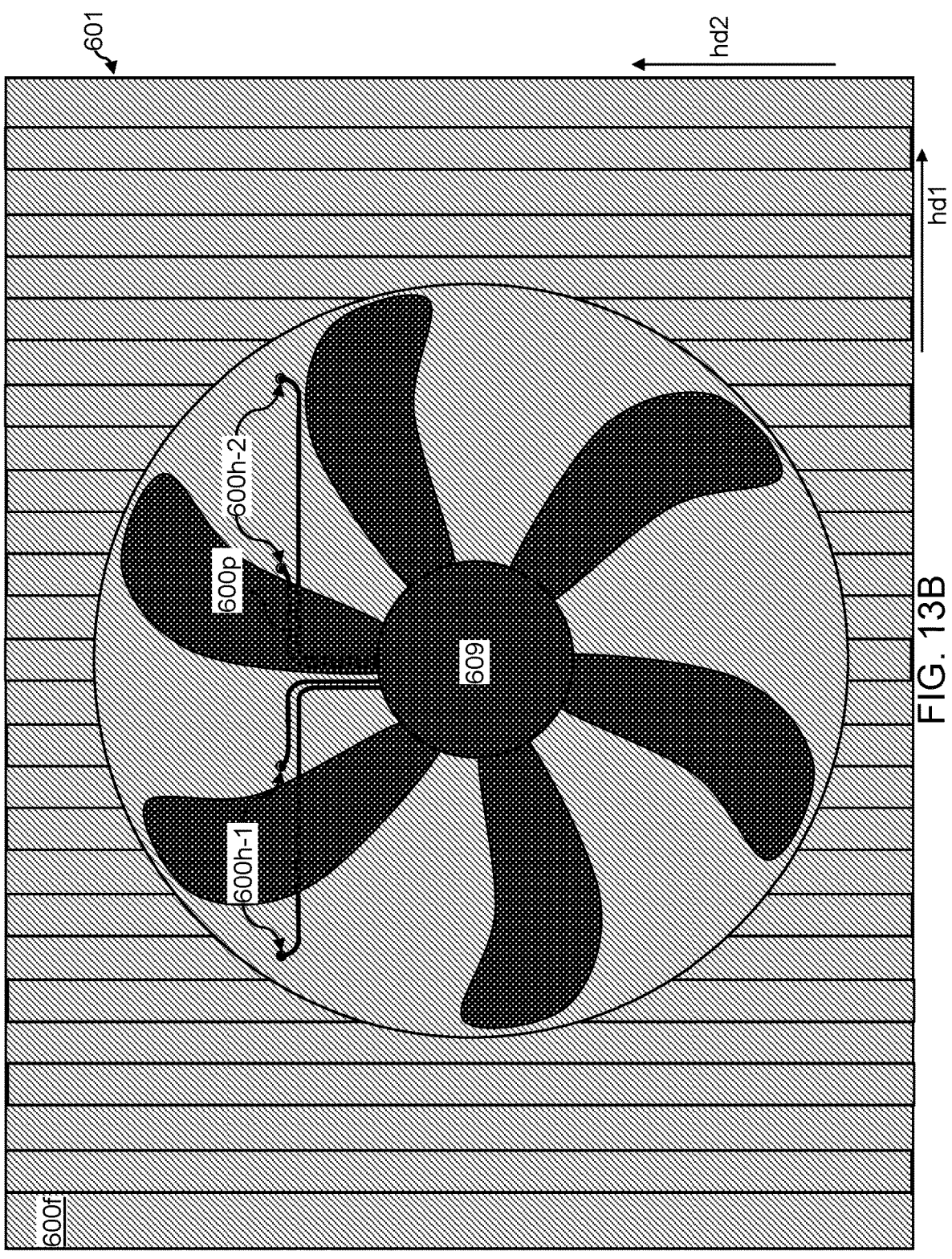

FIGS. 13A and 13B are various views of the third alternative structure after attaching a fan module to the heatsink structure according to an embodiment of the present disclosure. FIG. 13A is a vertical cross-sectional and FIG. 13B is a top-down view of the heatsink structure 601 of FIG. 13A. Referring to FIGS. 13A and 13B, the fan module 609 may be attached or otherwise affixed to the heatsink structure 601. The heatsink structure 601 may include a fin portion 600f including a hollowed-out portion of the fin portion 600f in which the fan module 609 may be inserted or embedded. In some embodiments, the fan module 609 may be attached to the heatsink structure 601 on top of the fins of the fin portion 600f, such that the fan module 609 may be positioned above but in contact with the fin portions 600f. Electrical connections 600p may be physically and electrically connected to the fan module 609, such that the TECs 300 may be powered directly from the fan module 609 or from another power source through which the fan module is connected (i.e., fan module passes power through to the electrical connections 609 and to the TECs 300).

Figure 14:
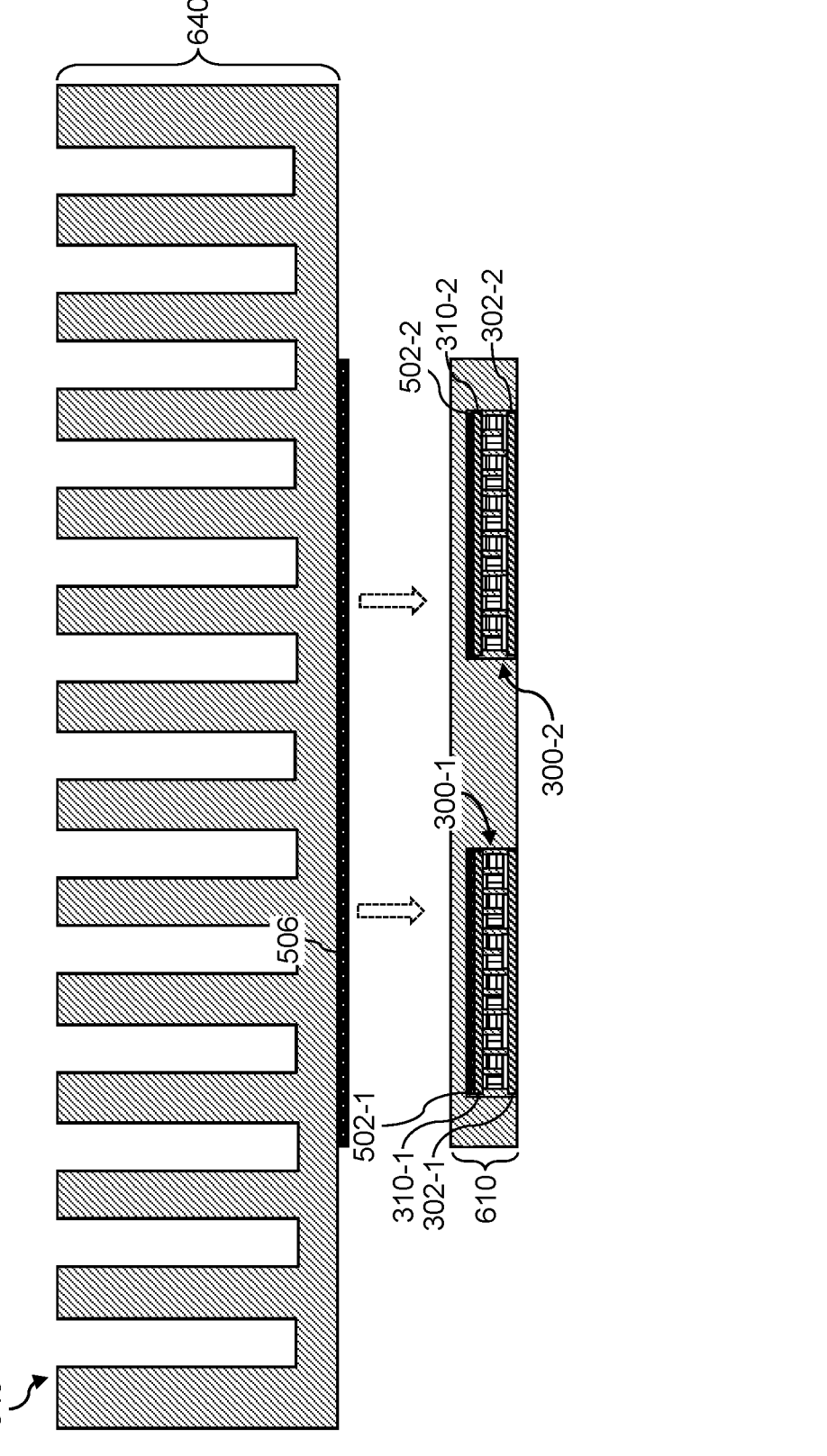
FIG. 14 is a cross-sectional view of a fourth alternative structure including a cavity structure according to an embodiment of the present disclosure.

FIG. 14 is a cross-sectional view of a fourth alternative structure including a cavity structure according to an embodiment of the present disclosure. Referring to FIG. 14, a cavity structure 610 may be formed to include cavities (e.g., cavities 600c, not shown) in which TECs 300 may be inserted or embedded. The cavity structure 610 may be drilled or otherwise formed in a similar manner as the extruded heatsink base 600e as described with reference to FIGS. 2A-3C. The TECs 300 may be inserted or attached to the cavity structure 610 in a similar manner as inserting the TECs into the extruded heatsink base 600e as described with reference to FIGS. 5A-6B. A top surface of the cavity structure 610 may then be attached, via a TIM layer 506, to a flat, bottom surface of a heatsink structure 640 including a fin portion 640f. In some embodiments, the TIM layer 506 may be attached to or otherwise formed on the top surface of the cavity structure 610, and a bottom surface of the heatsink structure 640 may then be attached to a top surface of the TIM layer 506. In some embodiments, the TIM layer 506 may be attached to or otherwise formed on a bottom surface of the heatsink structure 640, and a top surface of the cavity structure 610 may be attached to a bottom surface of the TIM layer 506.

The height of the cavity structure 610 may be greater than a height of the TECs 300, as illustrated. For example, the height of the cavity structure 610 may be greater than the height of the TECs 300, such that cavities formed within the cavity structure 610 form trenches.

Figure 15:
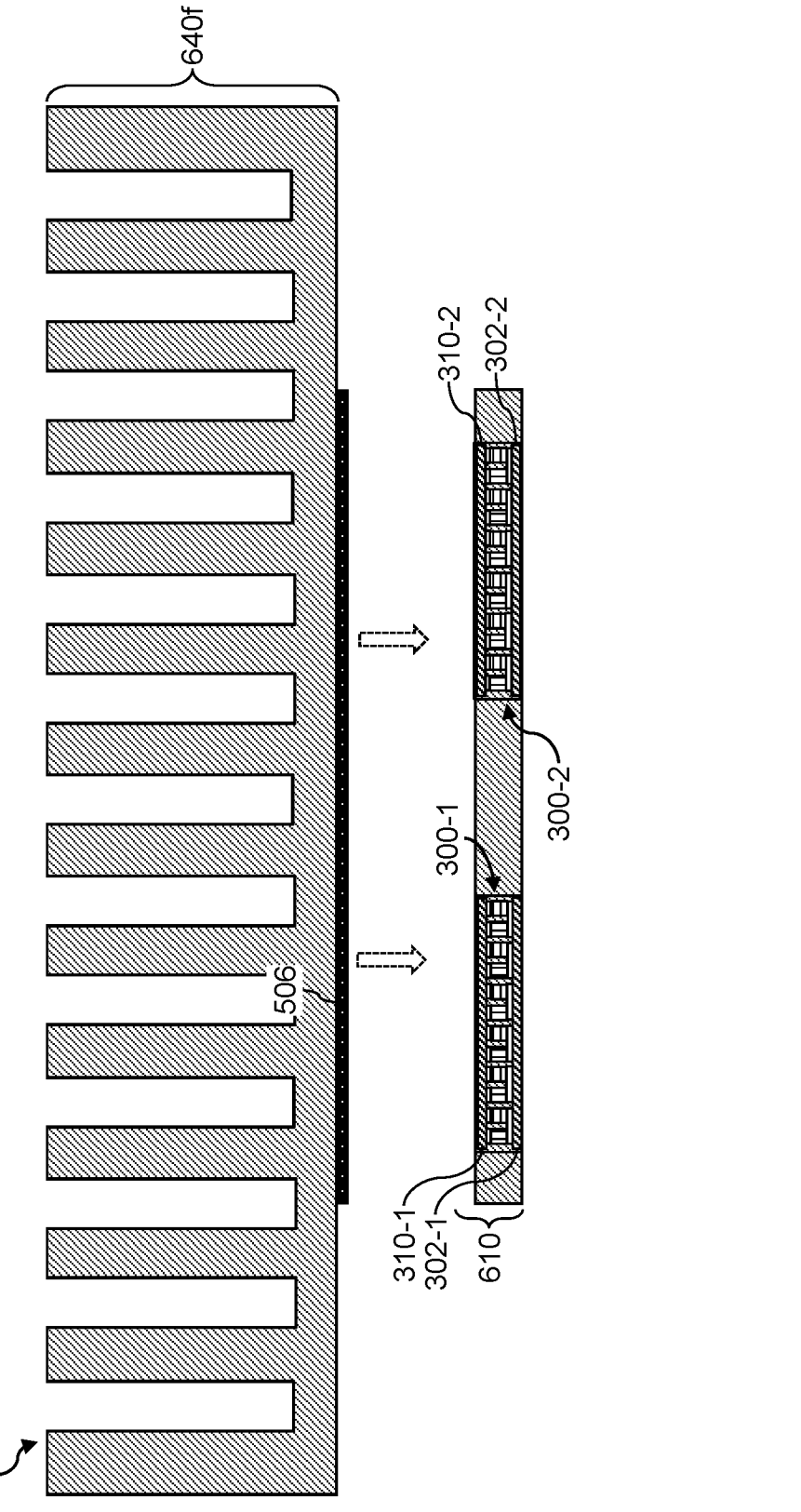
FIG. 15 is a cross-sectional view of a fifth alternative structure including a cavity structure according to an embodiment of the present disclosure.

FIG. 15 is a cross-sectional view of a fifth alternative structure including a cavity structure according to an embodiment of the present disclosure. Referring to FIG. 15, a cavity structure 610 may be formed to include cavities (e.g., cavities 600c, not shown) in which TECs 300 may be inserted or embedded. The cavity structure 610 may be drilled or otherwise formed in a similar manner as the extruded heatsink base 600e as described with reference to FIGS. 2A-3C. The TECs 300 may be inserted or attached to the cavity structure 610 in a similar manner as inserting the TECs into the extruded heatsink base 600e as described with reference to FIGS. 5A-6B. A top surface of the cavity structure 610 and top surfaces of the TECs 300 may then be attached, via a TIM layer 506, to a flat, bottom surface of a heatsink structure 640 including a fin portion 640f. In some embodiments, the TIM layer 506 may be attached to or otherwise formed on the top surface of the cavity structure 610 and top surfaces of the TECs 300, and a bottom surface of the heatsink structure 640 may then be attached to a top surface of the TIM layer 506. In some embodiments, the TIM layer 506 may be attached to or otherwise formed on a bottom surface of the heatsink structure 640, and a top surface of the cavity structure 610 and top surfaces of the TECs 300 may be attached to a bottom surface of the TIM layer 506. In some embodiments, a top surface of the cavity structure 610 may be attached to the heatsink structure 640 via the TIM layer 506, and the TECs 300 may subsequently be inserted into the cavities of the cavity structure 610 to be attached to the heatsink structure 640 via the TIM layer 506.

The height of the cavity structure 610 may be equal to a height of the TECs 300, as illustrated. For example, the height of the cavity structure 610 may be equal to the height of the TECs 300, such that the cavity structure 610 is formed to have holes in which the TECs 300 extend through. In other words, top surfaces of the TECs 300 may be coplanar with a top surface of the cavity structure 610, and bottom surfaces of the TECs 300 may be coplanar with a bottom surface of the cavity structure 610.

Figure 16:
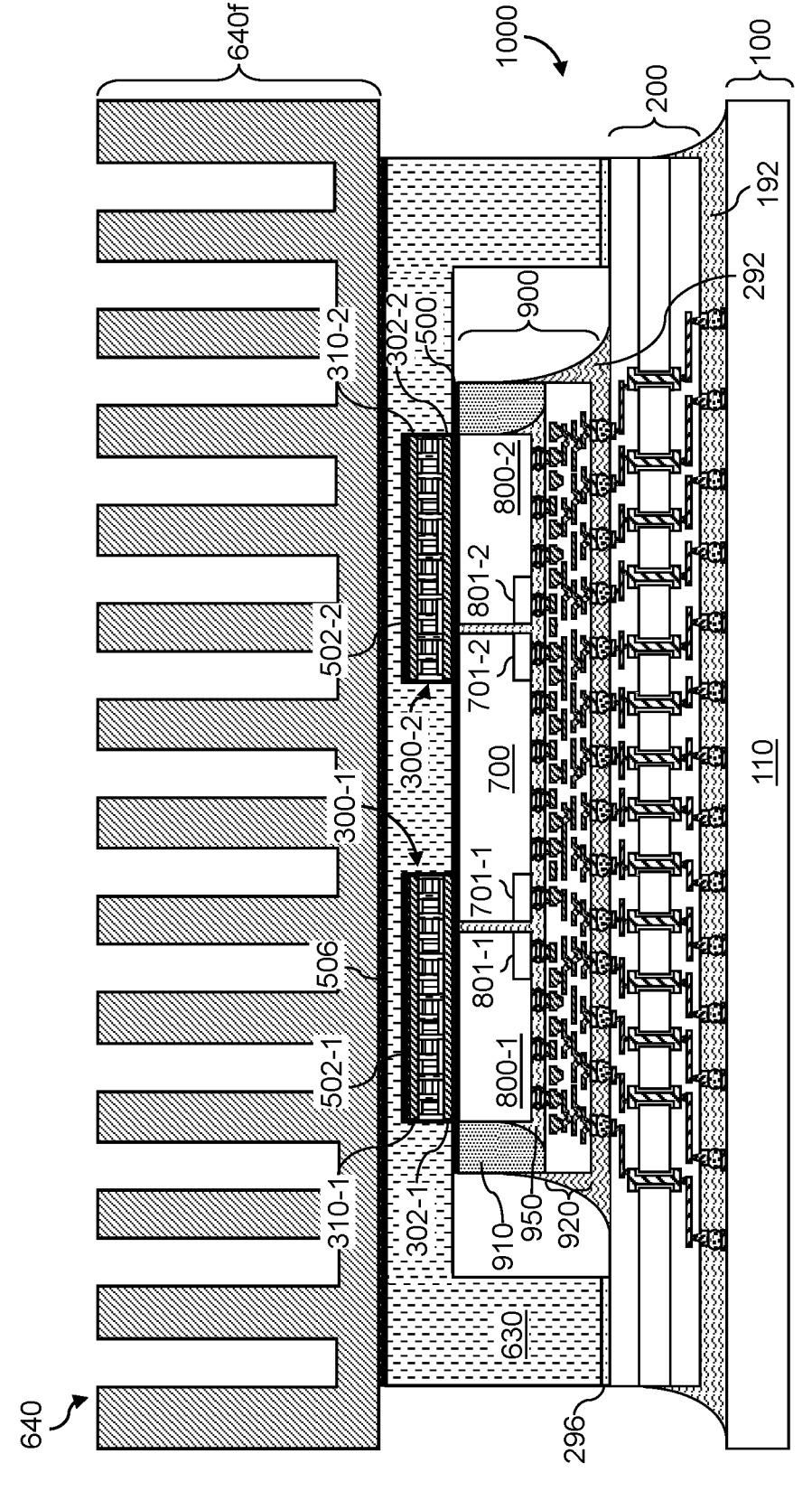
FIG. 16 is a cross-sectional view of a sixth alternative structure including a lid-type cavity structure according to an embodiment of the present disclosure.

FIG. 16 is a cross-sectional view of a sixth alternative structure including a lid-type cavity structure according to an embodiment of the present disclosure. Referring to FIG. 16, a lid-type cavity structure 630 may be formed to include cavities (e.g., cavities 600c, not shown) in which TECs 300 may be inserted or embedded.

The lid-type cavity structure 630 may be formed in a similar manner as the stiffener 294 as described with reference to FIGS. 1A and 1B (i.e., to form a lid-type stiffener structure), and may also be drilled, beveled, or otherwise formed in a similar manner as the extruded heatsink base 600e as described with reference to FIGS. 2A-3C (i.e., using a drilling apparatus 620 to form cavities 600c). The lid-type cavity structure 630 may be attached to the package substrate 200 via an adhesive layer 296. The adhesive layer 296 may be formed on a top surface of the package substrate 200 (e.g., on a top surface of the chip-side insulating layers). The adhesive layer 296 may be placed, deposited, or otherwise formed as a ring structure surrounding the fan-out package 900. The lid-type cavity structure 630 may be attached to the assembly of the fan-out package 900 and the package substrate 200 to reduce deformation of the assembly during subsequent processing steps and/or during operation of the chip package structure 1000.

The TECs 300 may be inserted or attached to the lid-type cavity structure 630 in a similar manner as inserting or attaching the TECs into the extruded heatsink base 600e as described with reference to FIGS. 5A-6B (i.e., via the TIM layers 502). A top surface of the lid-type cavity structure 630 may then be attached, via a TIM layer 506, to a flat, bottom surface of a heatsink structure 640 including a fin portion 640f. In some embodiments, the TIM layer 506 may be attached to or otherwise formed on the top surface of the lid-type cavity structure 630, and a bottom surface of the heatsink structure 640 may then be attached to a top surface of the TIM layer 506. In some embodiments, the TIM layer 506 may be attached to or otherwise formed on a bottom surface of the heatsink structure 640, and a top surface of the lid-type cavity structure 630 may be attached to a bottom surface of the TIM layer 506.

The height of a top portion of the lid-type cavity structure 630 may be greater than a height of the TECs 300. For example, as illustrated, the height of the top portion of the lid-type cavity structure 630 may be greater than the height of the TECs 300, such that cavities formed within the lid-type cavity structure 630 form trenches.

Figure 17:
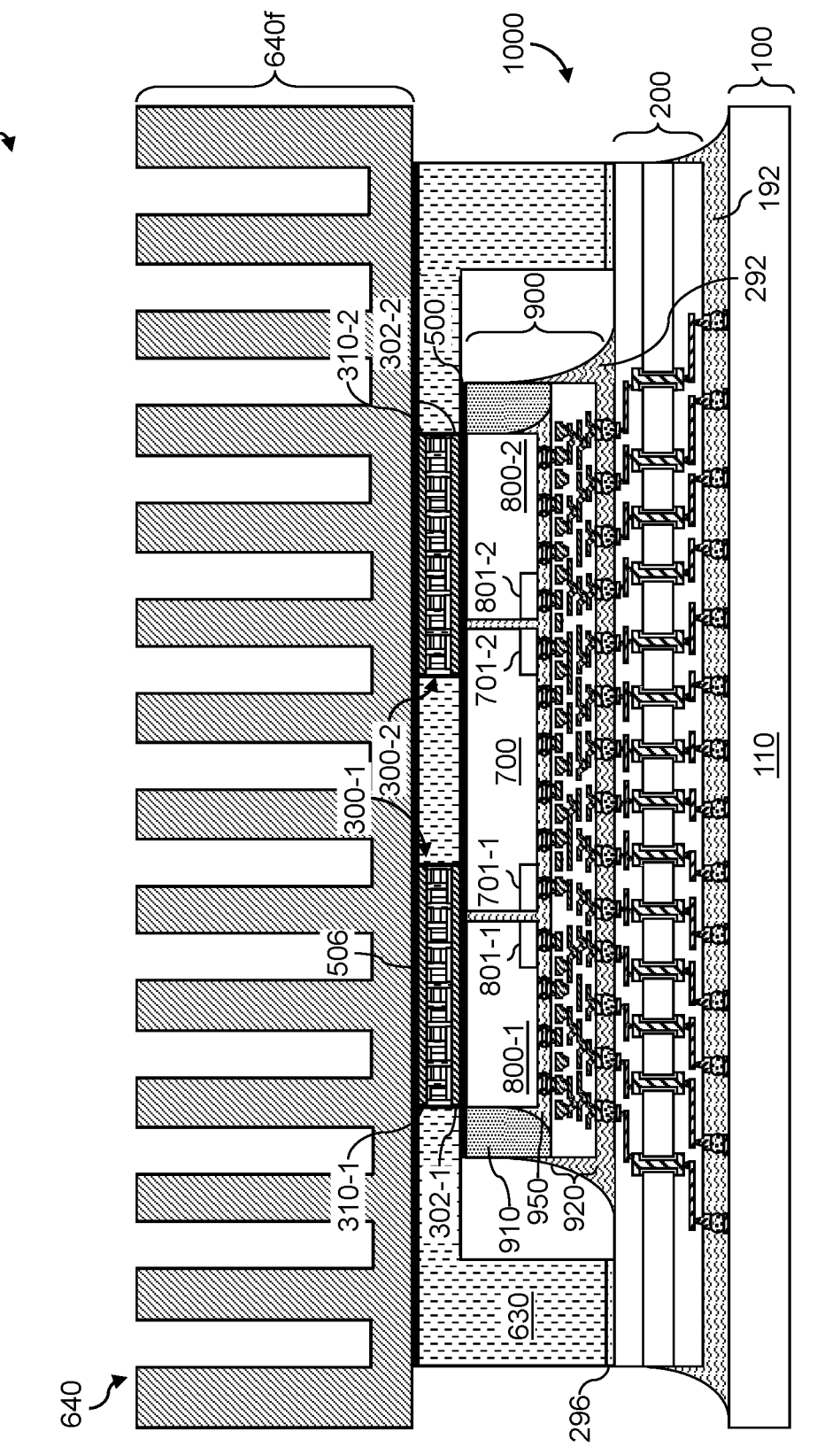
FIG. 17 is a cross-sectional view of a seventh alternative structure including a lid-type cavity structure according to an embodiment of the present disclosure.

FIG. 17 is a cross-sectional view of a seventh alternative structure including a lid-type cavity structure according to an embodiment of the present disclosure. Referring to FIG. 17, a lid-type cavity structure 630 may be formed to include cavities (e.g., cavities 600c, not shown) in which TECs 300 may be inserted or embedded.

The lid-type cavity structure 630 may be formed in a similar manner as the stiffener 294 as described with reference to FIGS. 1A and 1B (i.e., to form a lid-type stiffener structure), and may also be drilled, beveled, or otherwise formed in a similar manner as the extruded heatsink base 600e as described with reference to FIGS. 2A-3C (i.e., using a drilling apparatus 620 to form cavities 600c). The lid-type cavity structure 630 may be attached to the package substrate 200 via an adhesive layer 296. The adhesive layer 296 may be formed on a top surface of the package substrate 200 (e.g., on a top surface of the chip-side insulating layers). The adhesive layer 296 may be placed, deposited, or otherwise formed as a ring structure surrounding the fan-out package 900. The lid-type cavity structure 630 may be attached to the assembly of the fan-out package 900 and the package substrate 200 to reduce deformation of the assembly during subsequent processing steps and/or during operation of the chip package structure 1000.

The TECs 300 may be inserted or attached to the lid-type cavity structure 630 in a similar manner as inserting or attaching the TECs into the extruded heatsink base 600e as described with reference to FIGS. 5A-6B (i.e., via the TIM layers 502). A top surface of the lid-type cavity structure 630 and top surfaces of the TECs 300 may then be attached, via a TIM layer 506, to a flat, bottom surface of a heatsink structure 640 including a fin portion 640f. In some embodiments, the TIM layer 506 may be attached to or otherwise formed on the top surface of the lid-type cavity structure 630 and top surfaces of the TECs 300, and a bottom surface of the heatsink structure 640 may then be attached to a top surface of the TIM layer 506. In some embodiments, the TIM layer 506 may be attached to or otherwise formed on a bottom surface of the heatsink structure 640, and a top surface of the lid-type cavity structure 630 and top surfaces of the TECs 300 may be attached to a bottom surface of the TIM layer 506. In some embodiments, a top surface of the lid-type cavity structure 630 may be attached to the heatsink structure 640 via the TIM layer 506, the TECs 300 may subsequently be inserted into the cavities of the lid-type cavity structure 630 to be attached to the heatsink structure 640 via the TIM layer 506, and bottom surfaces of the lid-type cavity structure 630 and TECs 300 may be attached to the fan-out package via the TIM layer 500 and bottom-most surfaces of the lid-type cavity structure 630 may be attached to the package substrate 200 via the adhesive layer 296.

The height of a top portion of the lid-type cavity structure 630 may be equal to a height of the TECs 300, as illustrated. For example, the height of the top portion of the lid-type cavity structure 630 may be equal to the height of the TECs 300, such that the lid-type cavity structure 630 is formed to have holes in which the TECs 300 extend through. In other words, top surfaces of the TECs 300 may be coplanar with a top surface of the lid-type cavity structure 630, and bottom surfaces of the TECs 300 may be coplanar with a bottom surface of the topmost portion of the lid-type cavity structure 630.

FIGS. 18A-25B are various views of alternate embodiments including various cavity and TEC sizes overlaying different areas of a fan-out package. The various view in FIGS. 18A-25B illustrate alternate configurations of the extruded heatsink base 600e including TECs of various size, such that the coverage area for reducing thermal cross-talk between semiconductor dies (700, 800) varies according to the size and position of each TEC 300 relative to the fan-out package. The dashed lines in FIGS. 18B, 19B, 20B, 21B, 22B, 23B, 24B, and 25B illustrate the region overlaid by the respective TECs 300 shown in FIGS. 18A, 19A, 20A, 21A, 22A, 23A, 24A, and 25A (i.e., illustrated as having bottom substrates 302 visible). For ease of illustration, the areas of each PHY interface (e.g., memory PHY interfaces 801, SoC PHY interfaces 701) are outlined, but would not normally be visible with respect to a top-down view. Various shapes and size of cavities 600c and corresponding TECs 300 are contemplated within this disclosure, as well as additional embodiments that one of ordinary skill in the art could form including any number of semiconductor dies (700, 800) based on the contents of this disclosure.

Figure 18A:
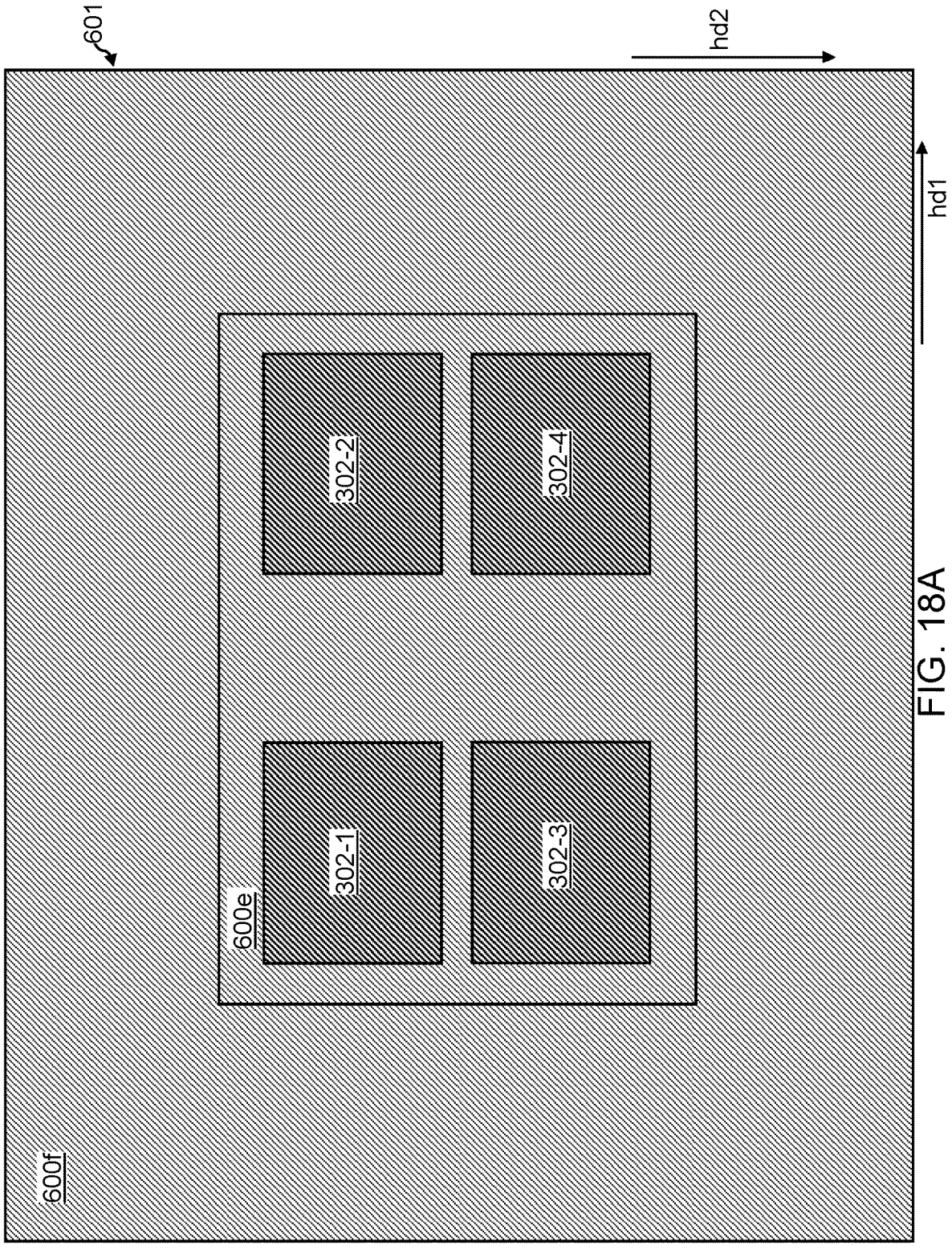
FIG. 18A is a bottom up view of an eighth alternate embodiment of a heatsink structure including four TECs.
Figure 18B:
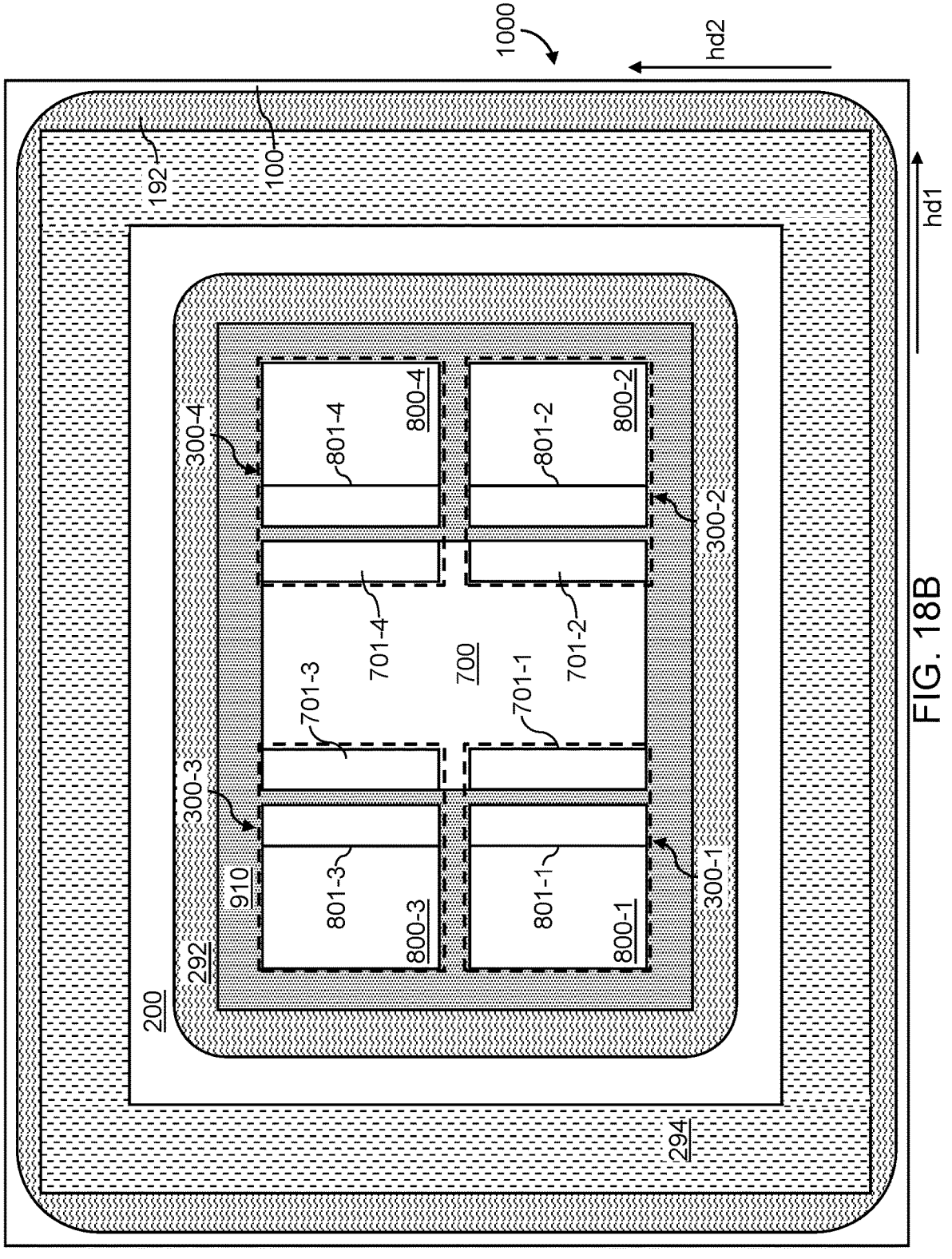
FIG. 18B is a top-down view of the chip package structure 1000 of FIG. 18A.

FIG. 18A is a bottom-up view of an eighth alternate embodiment of a heatsink structure including four TECs and FIG. 18B is a top-down view of the chip package structure 1000 of FIG. 18A. Referring to FIGS. 18A and 18B, the TEC 300-1 overlays the memory die 800-1 and the SoC PHY interface 701-1, the TEC 300-2 overlays the memory die 800-2 and the SoC PHY interface 701-2, the TEC 300-3 overlays the memory die 800-3 and the SoC PHY interface 701-3, and the TEC 300-4 overlays the memory die 800-4 and the SoC PHY interface 701-4. Such an embodiment may provide for isolated control and regulation of thermal cross-talk.

Figure 19A:
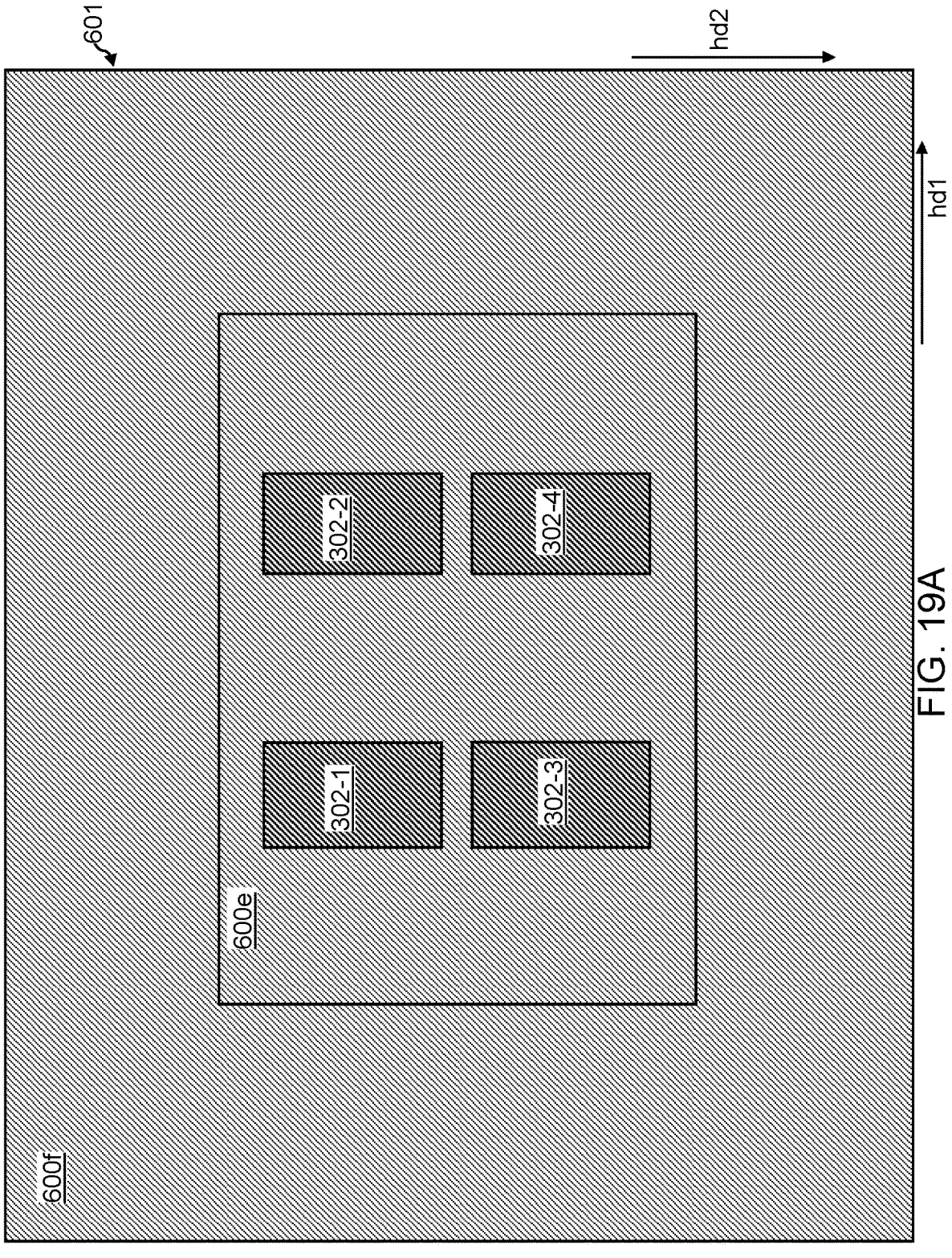
FIG. 19A is a bottom up view of a ninth alternate embodiment of a heatsink structure including four TECs.
Figure 19B:
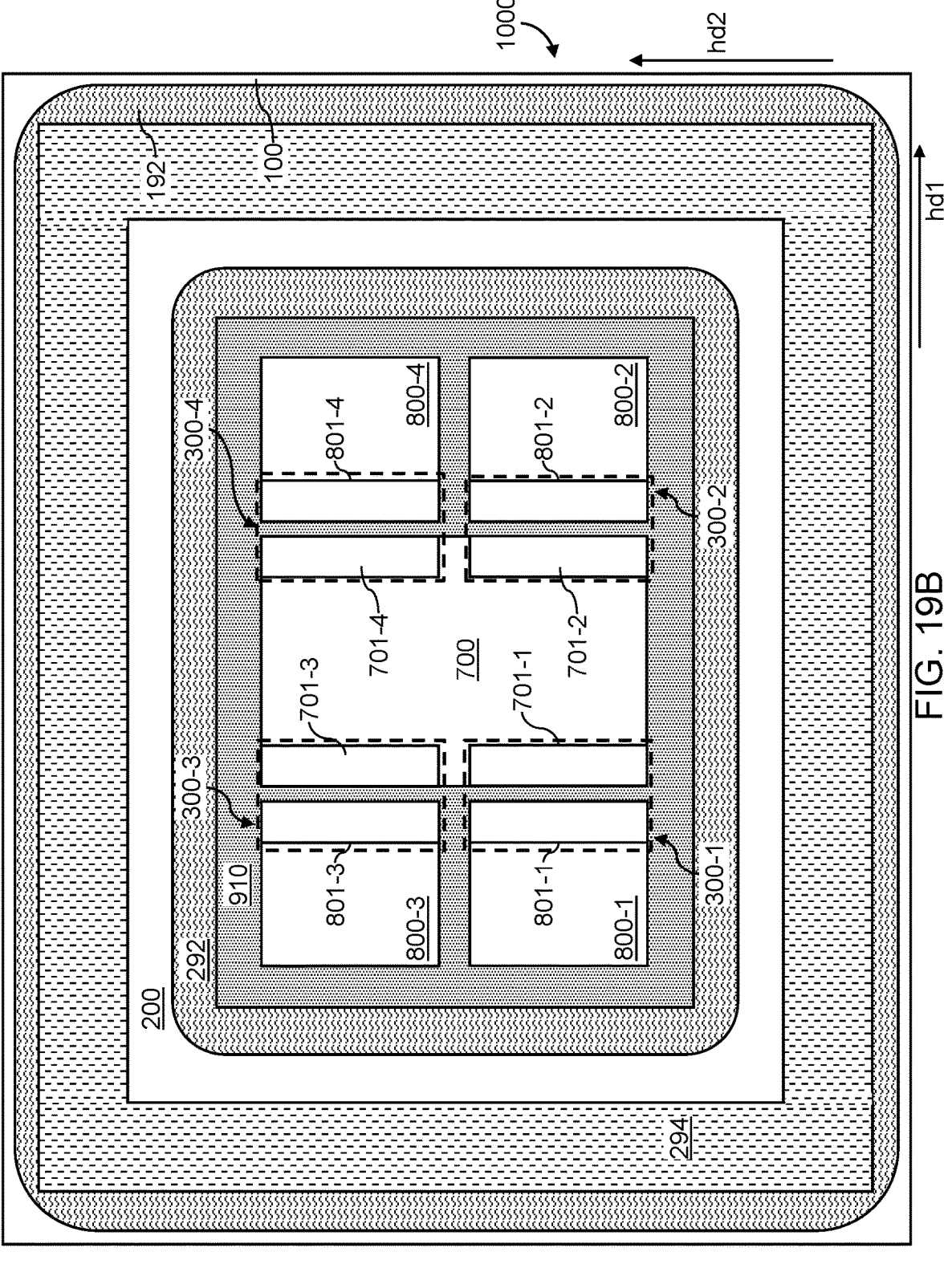
FIG. 19B is a top-down view of the chip package structure 1000 of FIG. 19A.

FIG. 19A is a bottom-up view of a ninth alternate embodiment of a heatsink structure including four TECs and FIG. 19B is a top-down view of the chip package structure 1000 of FIG. 19A. Referring to FIGS. 19A and 19B, the TEC 300-1 overlays the memory PHY interface 801-1 and the SoC PHY interface 701-1, the TEC 300-2 overlays the memory PHY interface 801-2 and the SoC PHY interface 701-2, the TEC 300-3 overlays the memory PHY interface 801-3 and the SoC PHY interface 701-3, and the TEC 300-4 overlays the memory PHY interface 801-4 and the SoC PHY interface 701-4. Such an embodiment may provide for more isolated control and regulation of thermal cross-talk at critical areas exhibiting the most thermal cross-talk.

Figure 20A:
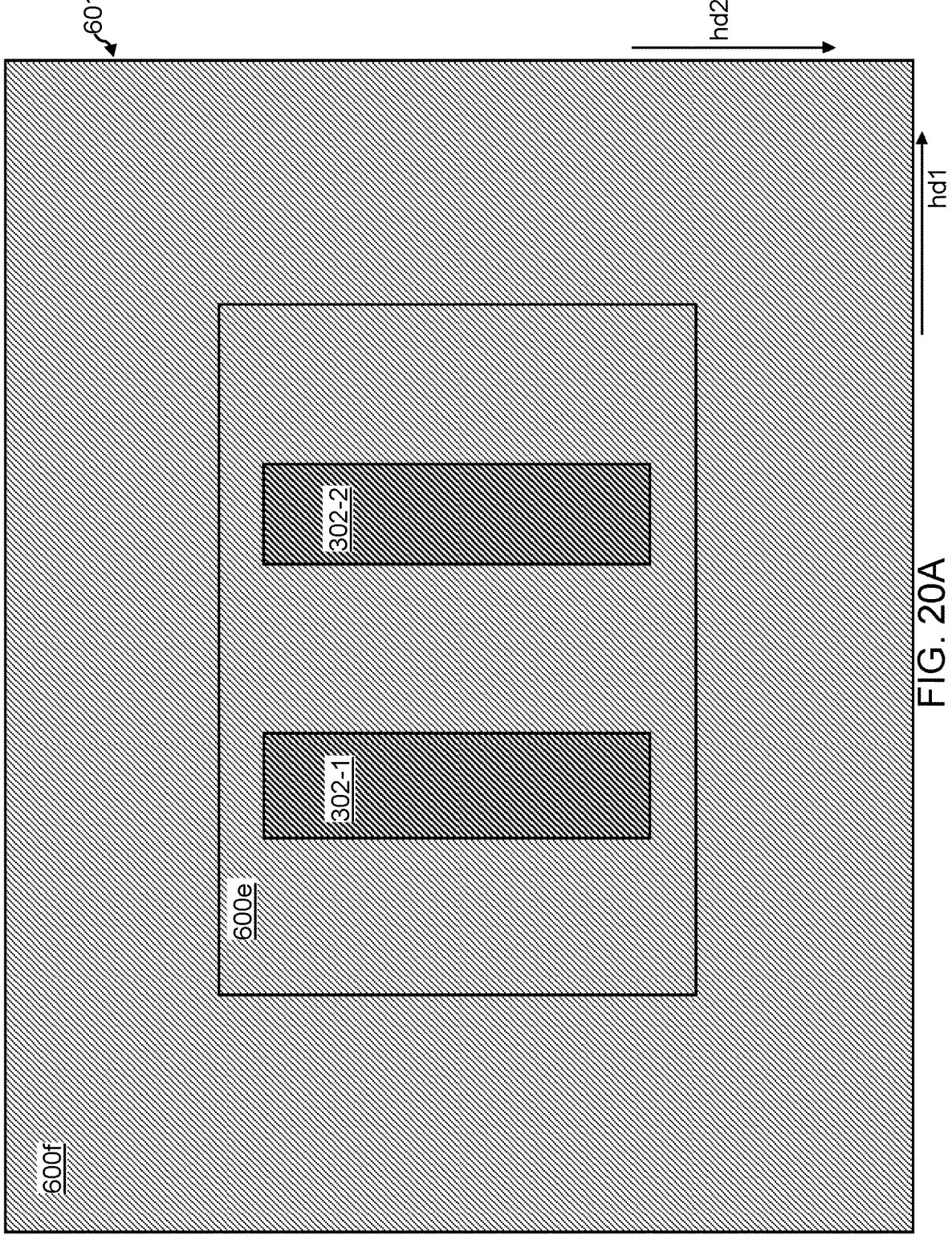
FIG. 20A is a bottom up view of a tenth alternate embodiment of a heatsink structure including two TECs.
Figure 20B:
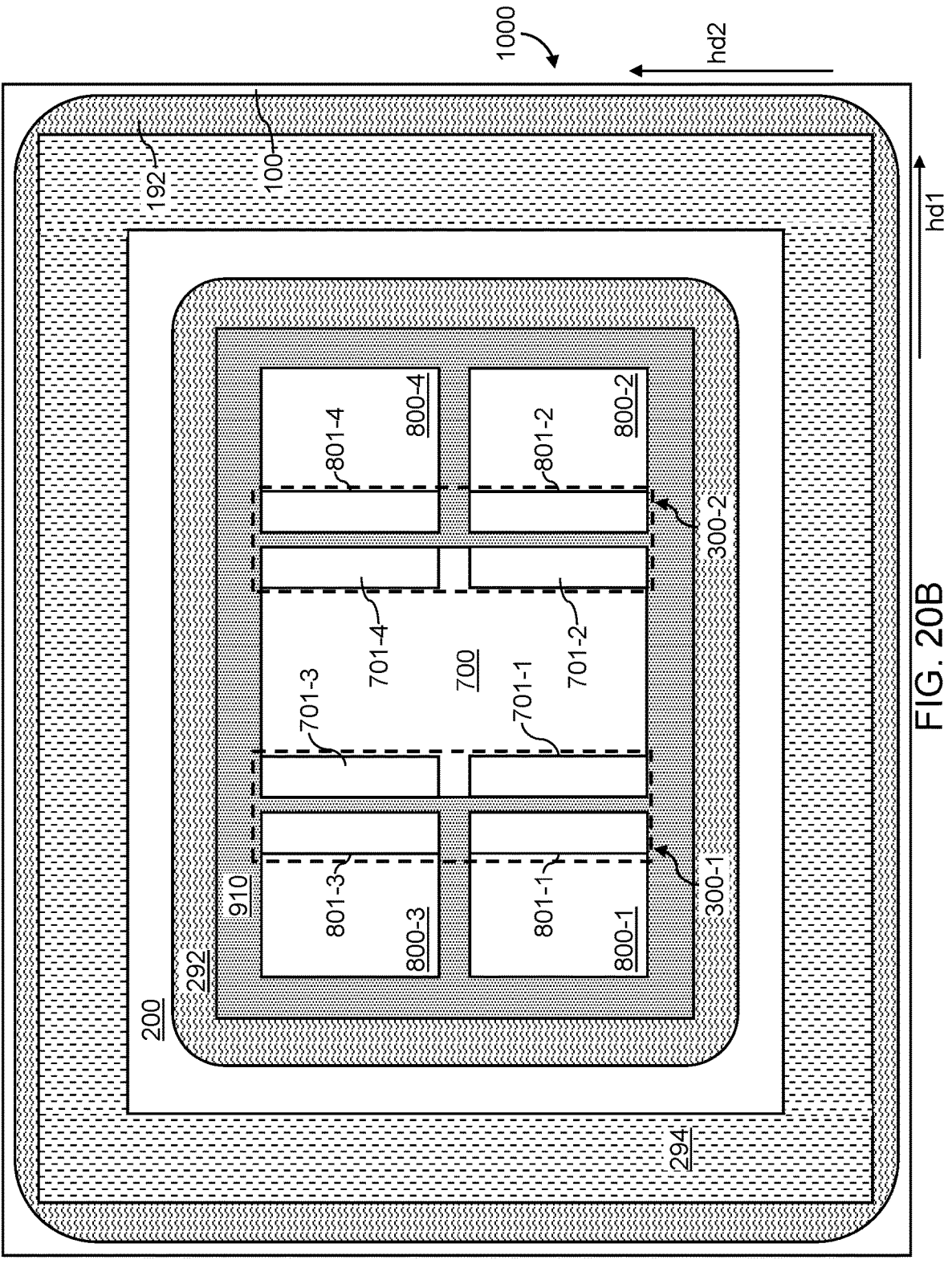
FIG. 20B is a top-down view of the chip package structure 1000 of FIG. 20A.

FIG. 20A is a bottom-up view of a tenth alternate embodiment of a heatsink structure including two TECs and FIG. 20B is a top-down view of the chip package structure 1000 of FIG. 20A. Referring to FIGS. 20A and 20B, the TEC 300-1 overlays the memory PHY interface 801-1, the SoC PHY interface 701-1, memory PHY interface 801-3 and the SoC PHY interface 701-3, and the TEC 300-2 overlays the memory PHY interface 801-2, the SoC PHY interface 701-2, the memory PHY interface 801-4, and the SoC PHY interface 701-4.

Figure 21A:
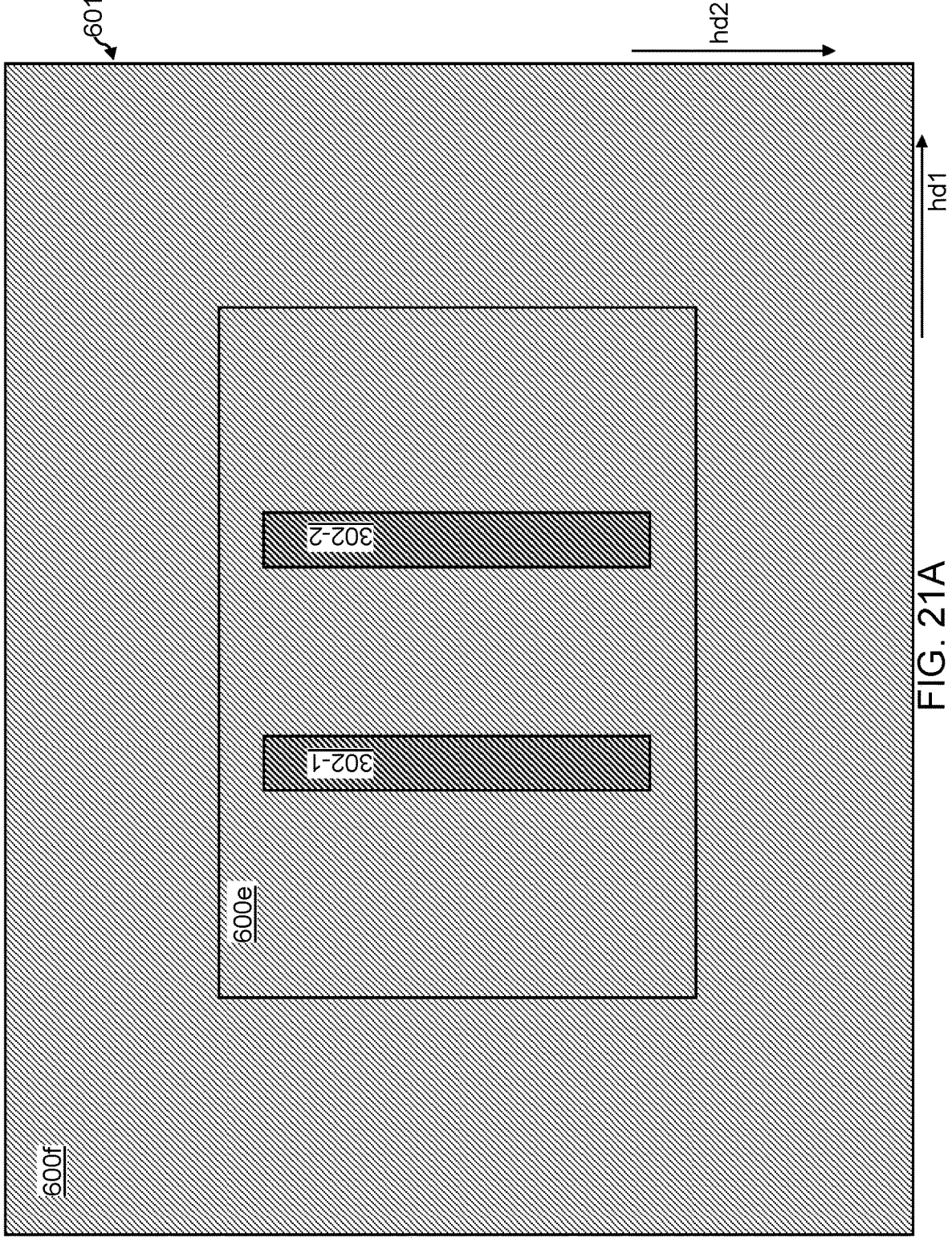
FIG. 21A is a bottom up view of an eleventh alternate embodiment of a heatsink structure including two TECs.
Figure 21B:
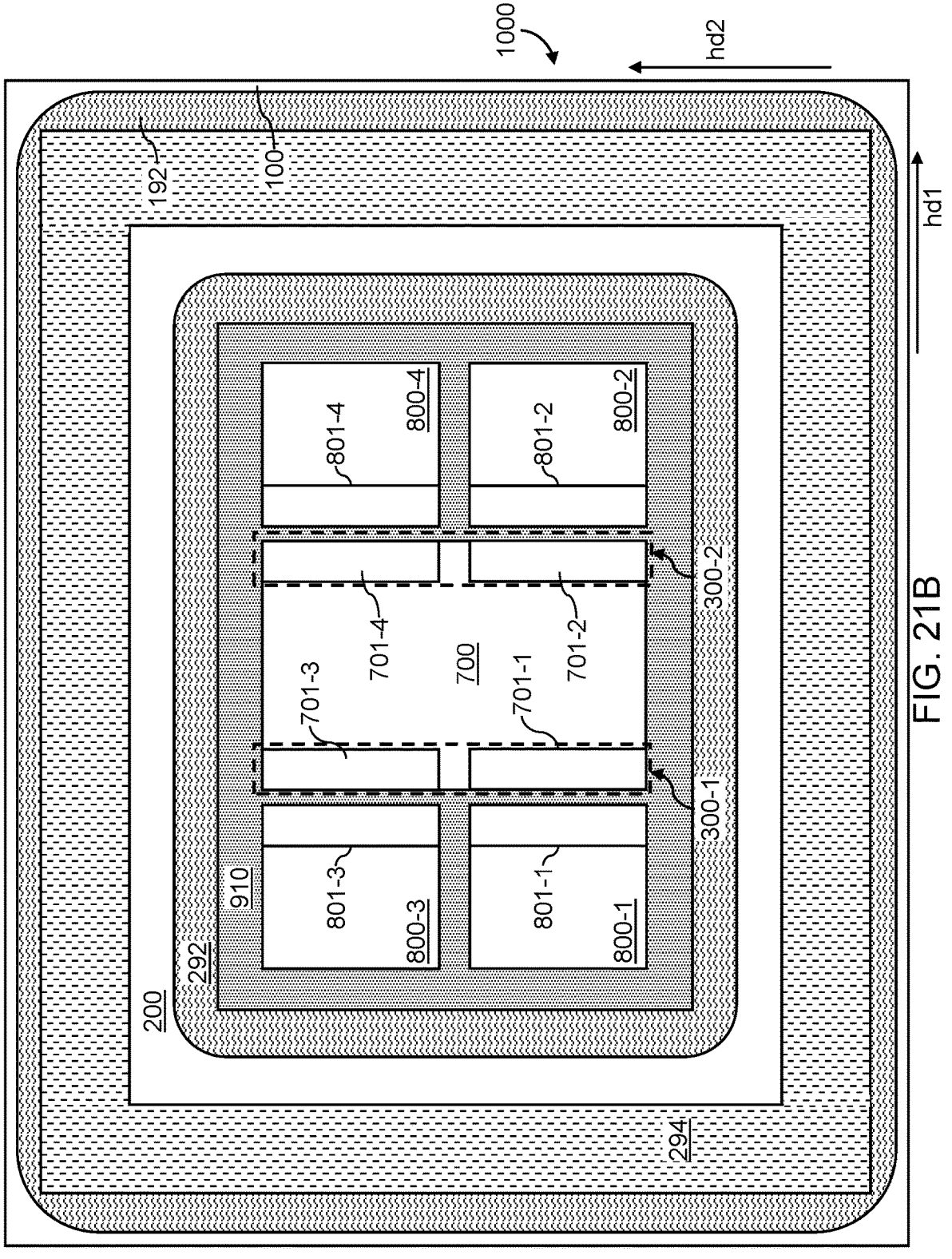
FIG. 21B is a top-down view of the chip package structure 1000 of FIG. 21A.

FIG. 21A is a bottom-up view of an eleventh alternate embodiment of a heatsink structure including two TECs and FIG. 21B is a top-down view of the chip package structure 1000 of FIG. 21A. Referring to FIGS. 21A and 21B, the TEC 300-1 overlays the SoC PHY interface 701-1 and the SoC PHY interface 701-3, and the TEC 300-2 overlays the SoC PHY interface 701-2 and the SoC PHY interface 701-4.

Figure 22A:
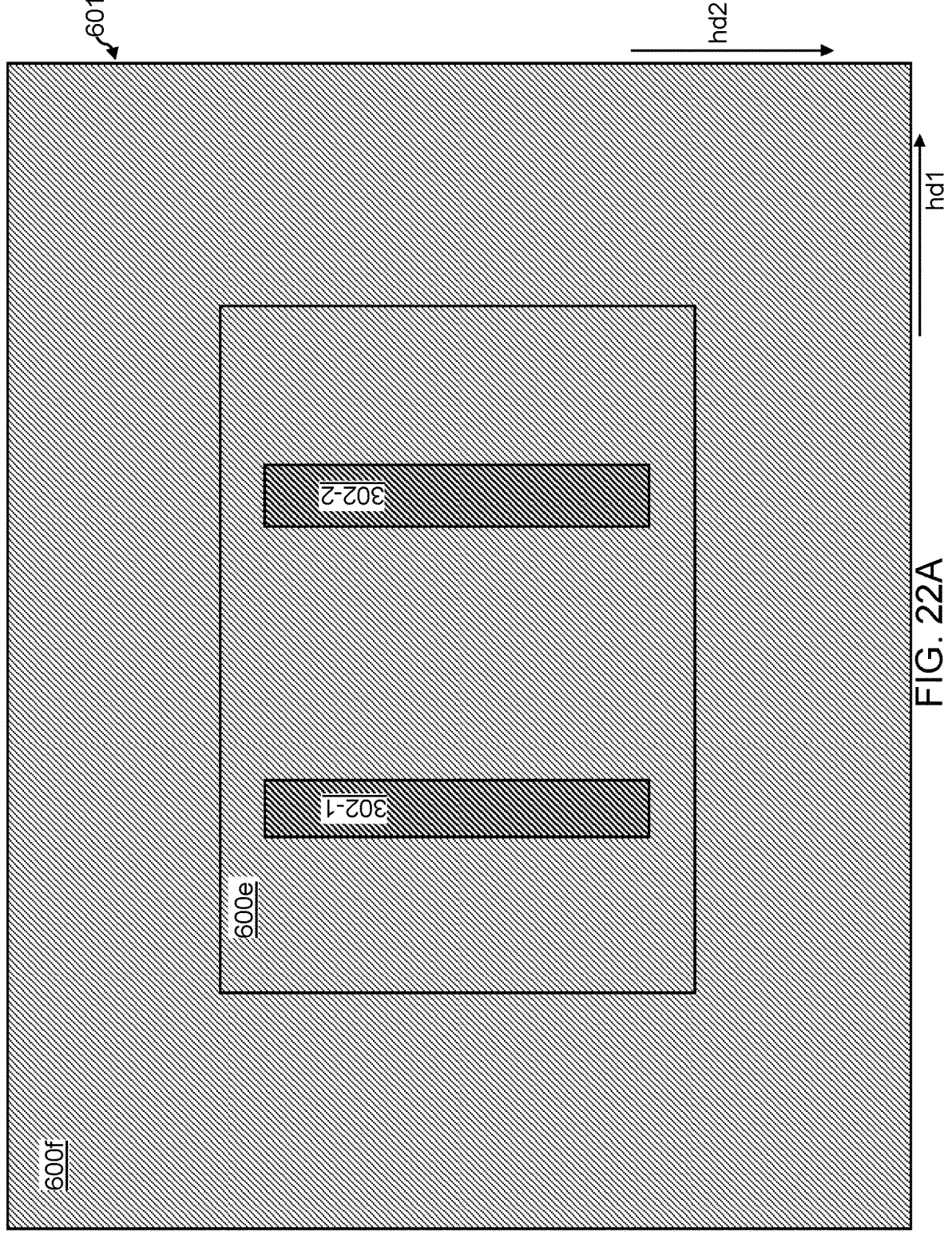
FIG. 22A is a bottom up view of a twelfth alternate embodiment of a heatsink structure including two TECs.
Figure 22B:
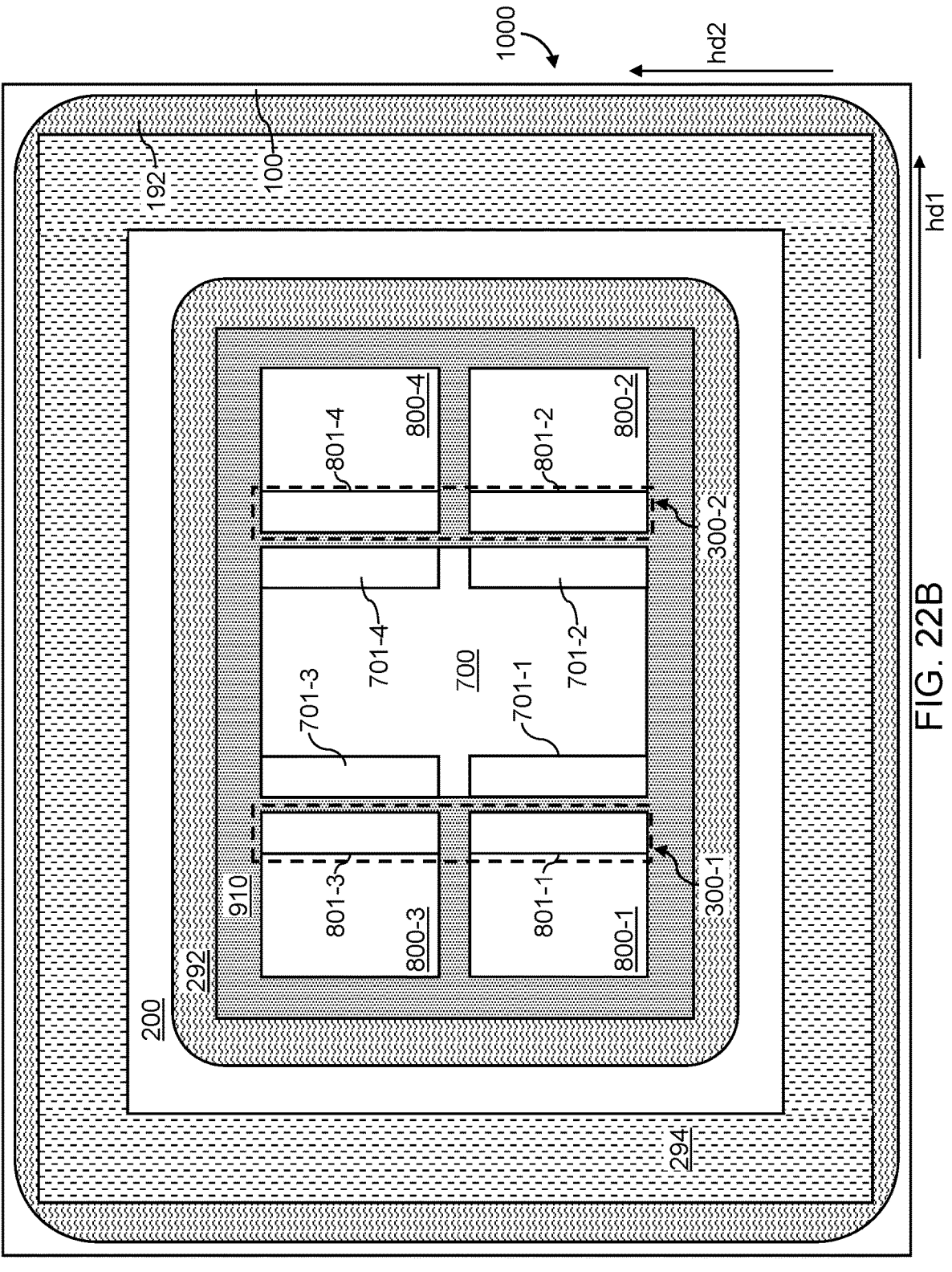
FIG. 22B is a top-down view of the chip package structure 1000 of FIG. 22A.

FIG. 22A is a bottom-up view of a twelfth alternate embodiment of a heatsink structure including two TECs and FIG. 22B is a top-down view of the chip package structure 1000 of FIG. 22A. Referring to FIGS. 22A and 22B, the TEC 300-1 overlays the memory PHY interface 801-1 and the memory PHY interface 801-3, and the TEC 300-2 overlays the memory PHY interface 801-2 and the memory PHY interface 801-4.

Figure 23A:
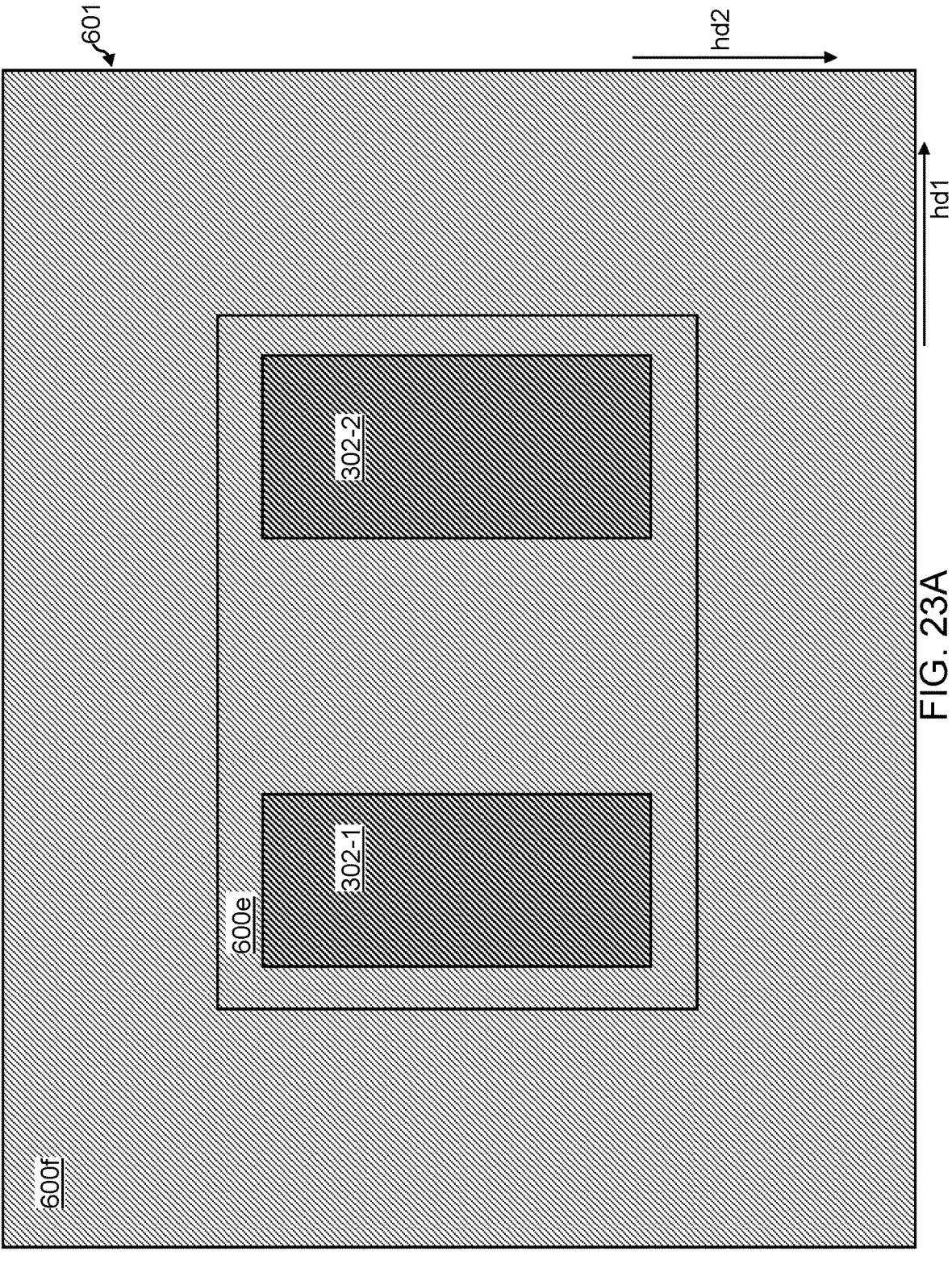
FIG. 23A is a bottom up view of a thirteenth alternate embodiment of a heatsink structure including two TECs.
Figure 23B:
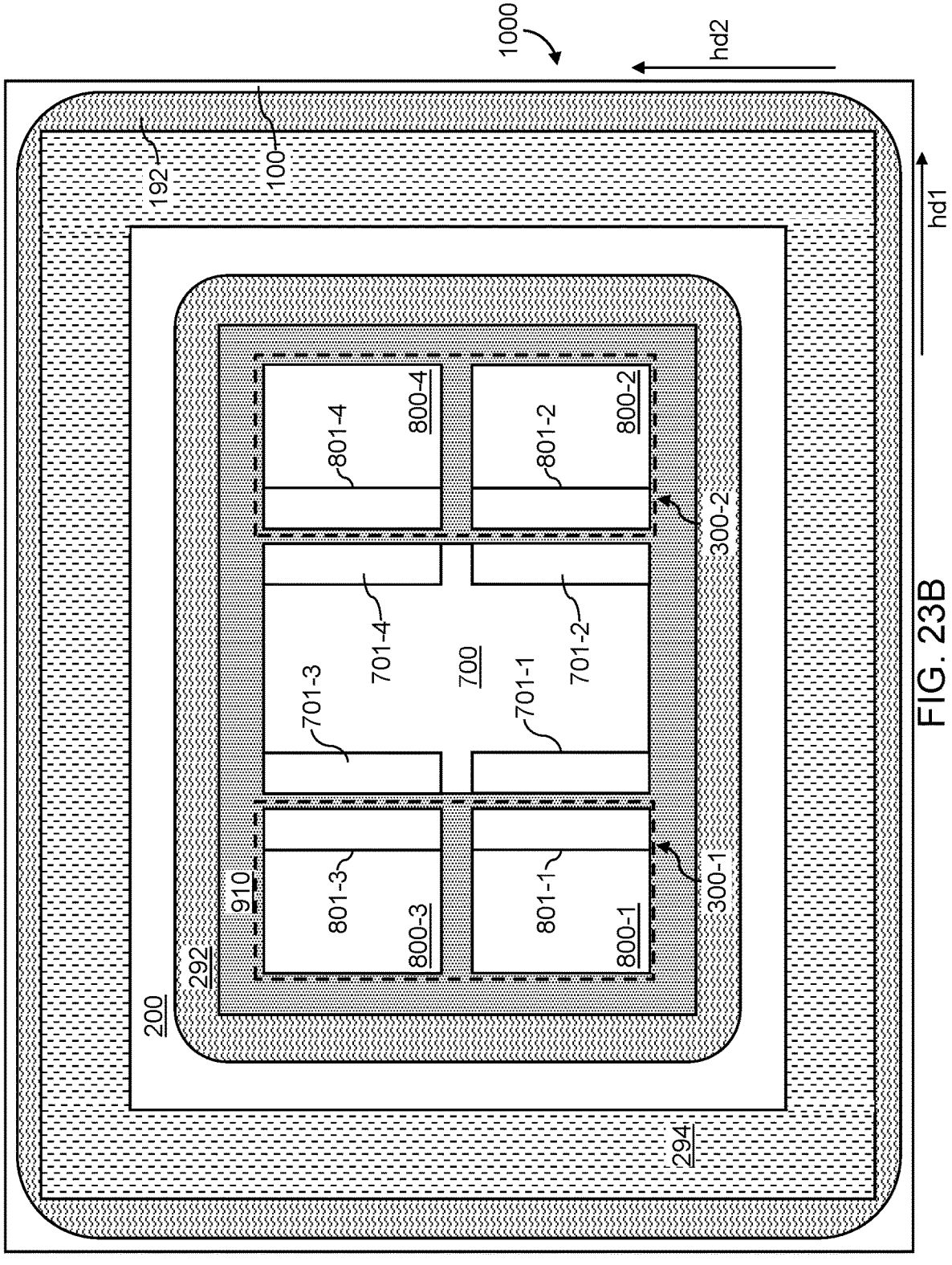
FIG. 23B is a top-down view of the chip package structure 1000 of FIG. 23A.

FIG. 23A is a bottom-up view of a thirteenth alternate embodiment of a heatsink structure including two TECs and FIG. 23B is a top-down view of the chip package structure 1000 of FIG. 23A. Referring to FIGS. 23A and 23B, the TEC 300-1 overlays the memory die 800-1 and the memory die 800-3, and the TEC 300-2 overlays the memory die 800-2 and the memory die 800-4.

Figure 24A:
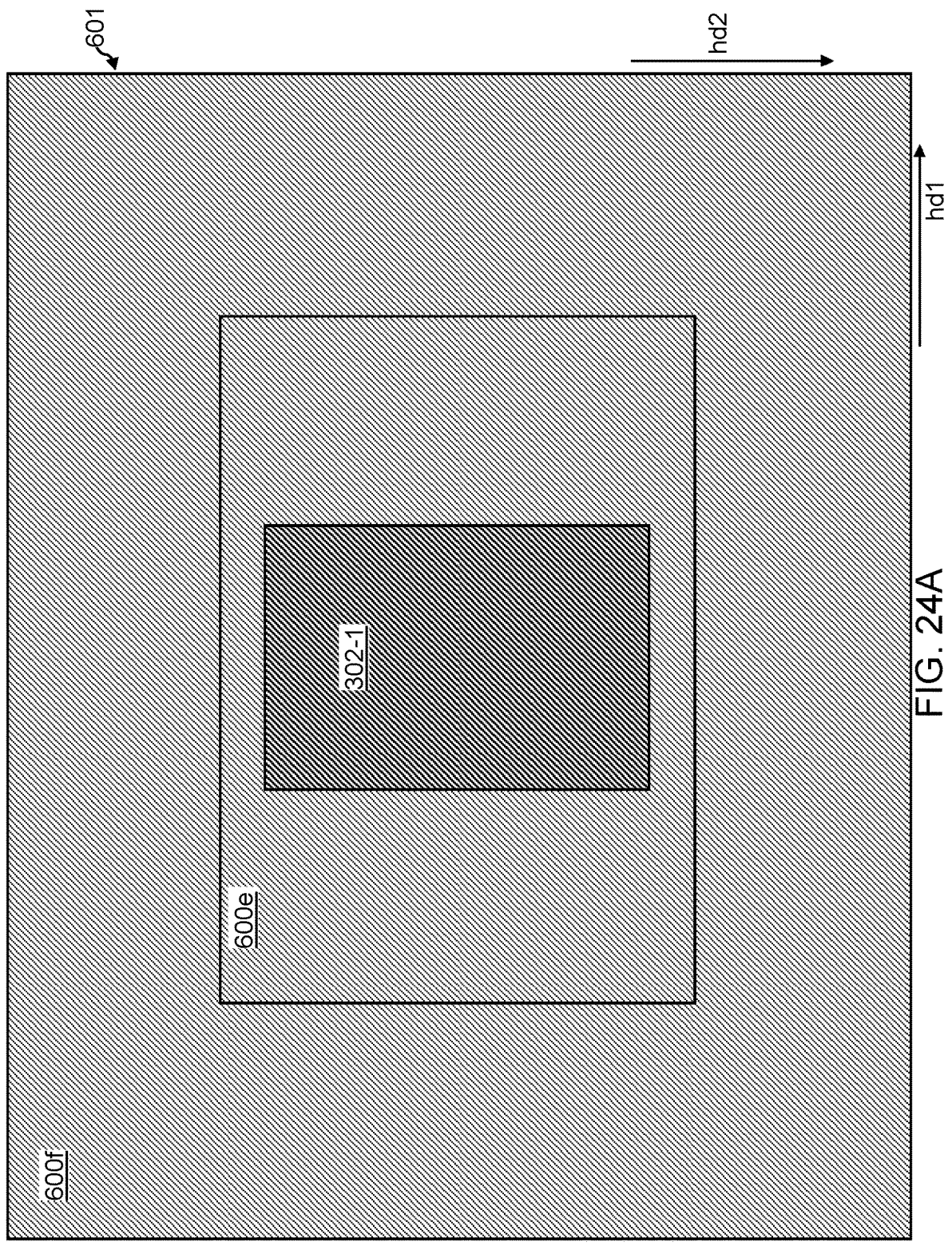
FIG. 24A is a bottom up view of a fourteenth alternate embodiment of a heatsink structure including one TEC.
Figure 24B:
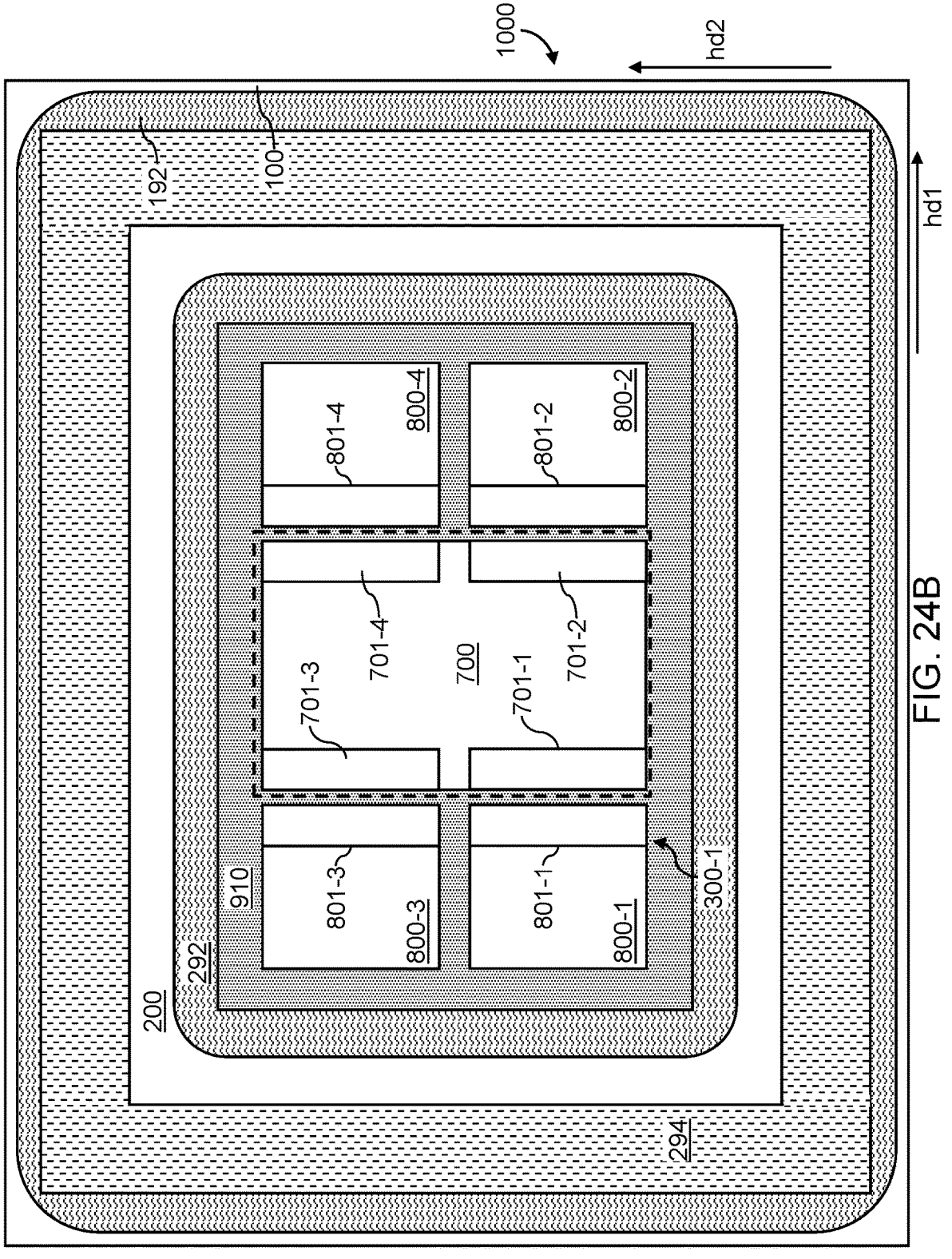
FIG. 24B is a top-down view of the chip package structure 1000 of FIG. 24A.

FIG. 24A is a bottom-up view of a fourteenth alternate embodiment of a heatsink structure including one TEC and FIG. 24B is a top-down view of the chip package structure 1000 of FIG. 24A. Referring to FIGS. 24A and 24B, the TEC 300-1 overlays the SoC die 700.

Figure 25A:
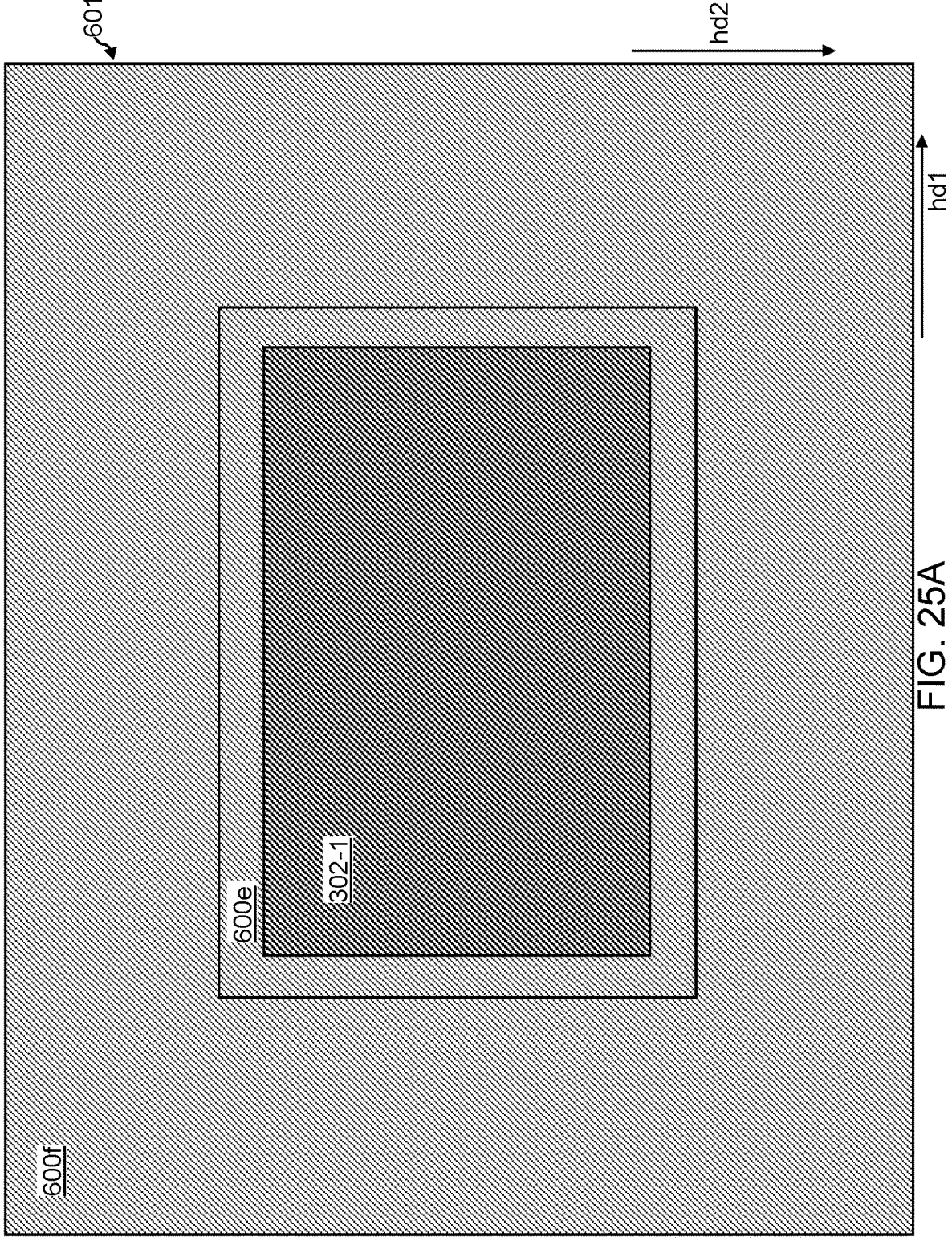
FIG. 25A is a bottom up view of a fifteenth alternate embodiment of a heatsink structure including one TEC.
Figure 25B:
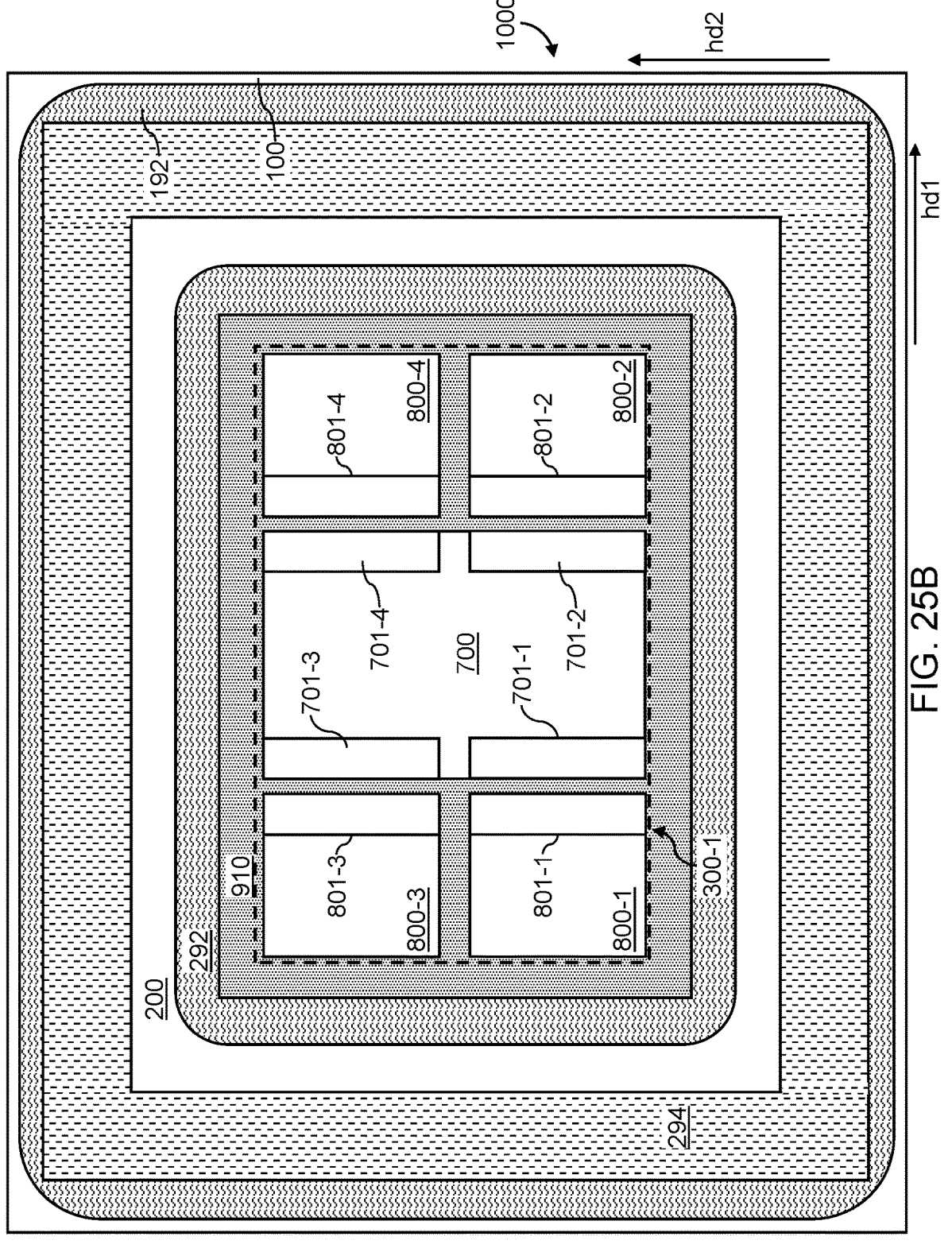
FIG. 25B is a top-down view of the chip package structure 1000 of FIG. 25A.

FIG. 25A is a bottom-up view of a fifteenth alternate embodiment of a heatsink structure including one TEC and FIG. 25B is a top-down view of the chip package structure 1000 of FIG. 25A. Referring to FIGS. 25A and 25B, the TEC 300-1 overlays the semiconductor dies (700, 800).

Figure 26:
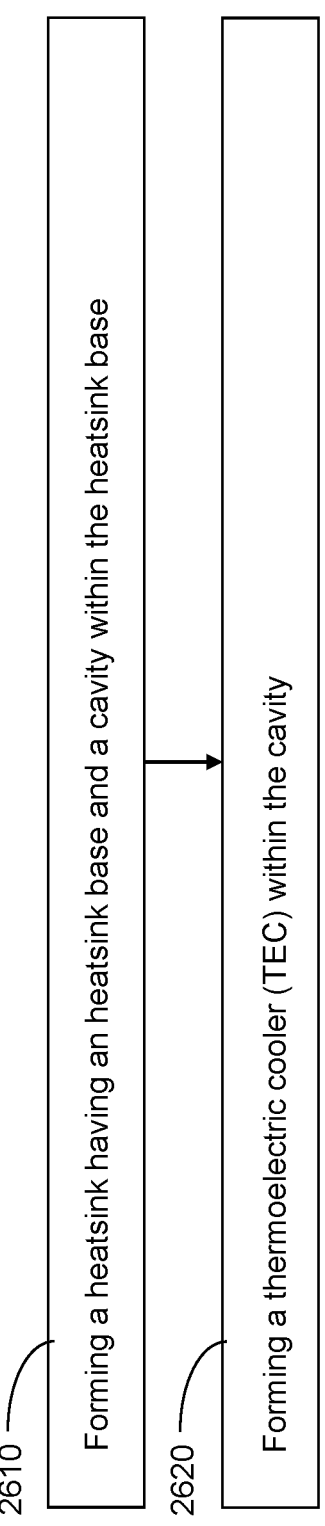
FIG. 26 is a flowchart illustrating steps for forming a structure according to an embodiment of the present disclosure.

Referring to FIG. 26, a flowchart illustrates steps for forming a thermal cooling system (e.g., heatsink structure 601) according to an embodiment of the present disclosure.

Referring to step 2610 and FIGS. 3A-3C, 11A-11C, 13A, and 13B, a heatsink (e.g., heatsink structure 601) having a heatsink base (e.g., extruded heatsink base 600e) and a cavity (e.g., cavities 600c) within the heatsink base may be formed.

In some embodiments, forming the heatsink (e.g., heatsink structure 601) having the heatsink base (e.g., extruded heatsink base 600e) and the cavity (e.g., cavities 600c) within the heatsink base may include molding a heatsink having a fin portion 600f and the heatsink base, in which the heatsink base extends from the fin portion, and beveling a bottom surface of the heatsink base to form the cavity. In some embodiments, forming the heatsink having the extruded heatsink base and the cavity within the extruded heatsink base may further includes forming holes (e.g., holes 600h) within the heatsink base connecting the cavity to an outer surface of the heatsink.

Referring to step 2620 and FIGS. 4A-6B, 9A, 9B, 10, 12A, 12B, and 14-17, a thermoelectric cooler (TEC) (e.g., TECs 300, TEC structure 1200) may be formed within the cavity (e.g., cavities 600c).

In some embodiments, forming the thermoelectric cooler (e.g., TECs 300, TEC structure 1200) within the cavity (e.g., cavities 600c) may further include depositing a thermal interface material (TIM) (e.g., TIM layers 502) on a bottom surface of the heatsink base (e.g., extruded heatsink base 600e) within the cavity, and attaching a top surface of the TEC to contact a bottom surface of the TIM. In some embodiments, the method may further include depositing the TIM around sidewalls of the TEC.

In some embodiments, forming the thermoelectric cooler (e.g., TECs 300, TEC structure 1200) within the cavity (e.g., cavities 600c) may include forming a top set of conductor pads (e.g., top conductor pads 308, 308c) on a bottom surface of the heatsink (e.g., intermediate heatsink structure 600, heatsink structure 601) within the cavity, forming N-type semiconductor pellets (e.g., N pellets 305) and P-type semiconductor pellets (e.g., P pellets 306) on bottom surfaces of the top set of conductor pads, forming a bottom set of conductor pads (e.g., bottom conductor pads 304) on bottom surfaces of the N-type semiconductor pellets and P-type semiconductor pellets, in which the N-type semiconductor pellets and P-type semiconductor pellets are alternatingly and electrically connected in series via the top set of conductor pads and the bottom set of conductor pads, and forming a bottom substrate 302 on bottom surfaces of the bottom set of conductor pads.

Referring to all drawings and according to various embodiments of the present disclosure, a chip package assembly 1100 is provided, which may include: a package substrate 200; a fan-out package 900 attached to the package substrate 200, the fan-out package 900 including a first semiconductor die (e.g., semiconductor dies 700, 800) including a first physical interface (e.g., SoC PHY interfaces 701, memory PHY interfaces 801) and a second semiconductor die (e.g., semiconductor dies 700, 800) including a second physical interface (e.g., SoC PHY interfaces 701, memory PHY interfaces 801); a heatsink structure (e.g., heatsink structure 601) including a heatsink base (e.g., extruded heatsink base 600e) and a cavity (e.g., cavities 600c) within the heatsink base; and a thermoelectric cooler (TEC) (e.g., TECs 300, TEC structure 1200) embedded within the cavity, in which the TEC is positioned above the first physical interface and the second physical interface.

In some embodiments, a bottom surface of the TEC (e.g., TECs 300, TEC structure 1200) is coplanar with a bottom surface of the heatsink base (e.g., extruded heatsink base).

In some embodiments, the chip package assembly 1100 may further include a fan-out package thermal interface material (TIM) (e.g., TIM layer 500) positioned between a bottom surface of the heatsink base (e.g., extruded heatsink base 600e) and a top surface of the fan-out package 900 and between a bottom surface of the TEC (e.g., TECs 300, TEC structure 1200) and the top surface of the fan-out package 900.

In some embodiments, the chip package assembly 1100 may further include a TEC thermal interface material (TIM) (e.g., TIM layers 502) positioned between a bottom surface of the heatsink (e.g., intermediate heatsink structure 600, heatsink structure 601) within the cavity (e.g., cavities 600c) and a top surface of the TEC (e.g., TECs 300, TEC structure 1200). In some embodiments, the TEC TIM (e.g., TIM layers 502, TIM encapsulation layers 504) may be positioned between sidewalls of the heatsink structure (e.g., intermediate heatsink structure 600, heatsink structure 601) within the cavity and sidewalls of the TEC (e.g., TECs 300, TEC structure 1200).

In some embodiments, a depth of the cavity (e.g., cavities 600c) may be less than or equal to a height of the heatsink base (e.g., extruded heatsink base). In some embodiments, the first semiconductor die is a system-on-a-chip (e.g., SoC die 700) and the second semiconductor die is a high bandwidth memory (e.g., memory die 800).

Referring to all drawings and according to various embodiments of the present disclosure, a thermal cooling system (e.g., heatsink structure 601) is provided, which may include: a heatsink structure (e.g., intermediate heatsink structure 600) including a heatsink base (e.g., extruded heatsink base 600e) and a cavity (e.g., cavities 600c) within the heatsink base; and a thermoelectric cooler (TEC) (e.g., TECs 300, TEC structure 1200) embedded within the cavity.

In some embodiments, the TEC (e.g., TECs 300, TEC structure 1200) may include a first substrate (e.g., bottom substrate 302); a first set of conductor pads (e.g., bottom conductor pads 304) having bottom surfaces contacting a top surface of the first substrate; N-type semiconductor pellets (e.g., N pellets 305); P-type semiconductor pellets (e.g., P pellets 306); a second set of conductor pads (e.g., top conductor pads 308, 308c) having bottom surfaces contacting top surfaces of the N-type semiconductor pellets and P-type semiconductor pellets, in which the N-type semiconductor pellets and P-type semiconductor pellets are alternatingly and electrically connected in series via the first set of conductor pads and the second set of conductor pads; and a second substrate (e.g., top substrate 310) having a bottom surface in contact with top surfaces of the second set of conductor pads.

In some embodiments, the thermal cooling system (e.g., heatsink structure 601) may further include a thermal interface material (TIM) (e.g., TIM layers 502, TIM encapsulation layers 504) positioned between a bottom surface of the heatsink structure (e.g., intermediate heatsink structure 600, heatsink structure 601) within the cavity (e.g., cavities 600c) and a top surface of the second substrate (e.g., top substrate 310), in which the TIM is positioned between sidewalls of the heatsink structure within the cavity and sidewalls of the N-type semiconductor pellets (e.g., N pellets 305) and P-type semiconductor pellets (e.g., P pellets 306).

In some embodiments, the thermal cooling system (e.g., heatsink structure 601) may further include a first substrate (e.g., bottom substrate 302); a first set of conductor pads (e.g., bottom conductor pads 304) having bottom surfaces contacting a top surface of the first substrate; N-type semiconductor pellets (e.g., N pellets 305); P-type semiconductor pellets (e.g., P pellets 306); and a second set of conductor pads (e.g., top conductor pads 308) having bottom surfaces contacting top surfaces of the N-type semiconductor pellets and P-type semiconductor pellets, in which the N-type semiconductor pellets and P-type semiconductor pellets are alternatingly and electrically connected in series via the first set of conductor pads and the second set of conductor pads, and in which top surfaces of the second set of conductor pads are in contact with a bottom surface of the heatsink structure within the cavity.

In some embodiments, the first substrate (e.g., bottom substrate 302) and the second substrate (e.g., top substrate 310) may include silicon or ceramic material.

In some embodiments, the heatsink structure (e.g., heatsink structure 601) may further include a hole (e.g., holes 600h) within the heatsink base (e.g., extruded heatsink base) connecting the cavity (e.g., cavities 600c) to an opening at an outer edge of the heatsink base. In some embodiments, the TEC (e.g., TECs 300, TEC structure 1200) may further include a positive electrical connection and a negative electrical connection (e.g., electrical connections 600p) positioned within the hole.

In some embodiments, the heatsink structure (e.g., heatsink structure 601, may further include a fan module 609, the fan module including a positive electrical connection and a negative electrical connection, in which the TEC (e.g., TECs 300, TEC structure 1200) is electrically connected to the positive electrical connection and the negative electrical connection.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A chip package assembly, comprising:
   a package substrate;
   a fan-out package attached to the package substrate, the fan-out package comprising:

a first semiconductor die including a first physical layer interface configured to transmit signals to, and from, the packaging substrate;

a second semiconductor die including a second physical layer interface configured to transmit signals to, and from, the packaging substrate; and an underfill material portion laterally surrounding the first semiconductor die and the second semiconductor die;

a heatsink structure including a heatsink base and a cavity within the heatsink base;

a thermoelectric cooler (TEC) embedded within the cavity, wherein the TEC is positioned above the first physical layer interface and the second physical layer interface; and a fan-out package thermal interface material (TIM) layer directly contacting an entirety of a bottom surface of the TEC, an entirety of top surfaces of the first semiconductor die and the second semiconductor die, and a top surface of the underfill material portion, wherein:

the TEC has an areal overlap with an entirety of the first physical layer interface of the first semiconductor die and with an entirety of the second physical layer interface of the second semiconductor die in a plan view along a vertical direction;

the chip package assembly comprises a molding compound die frame that laterally surrounds the first semiconductor die, the second semiconductor die, and the underfill material portion;

the TEC has an areal overlap with an entirety of the first semiconductor die in the plan view; and a portion of the second semiconductor die other than the second physical layer interface does not have any areal overlap with the TEC in the plan view.

2. The chip package assembly of claim 1, wherein a bottom surface of the TEC is coplanar with a bottom surface of the heatsink base.

3. The chip package assembly of claim 1, wherein the fan-out package TIM layer contacts a bottom surface of the heatsink base.

4. The chip package assembly of claim 1, further comprising a TEC thermal interface material (TIM) layer positioned between a bottom surface of the heatsink structure within the cavity and a top surface of the TEC.

5. The chip package assembly of claim 1, wherein the heatsink structure further comprises a hole within the heatsink base connecting the cavity to an opening at an outer edge of the heatsink base; and an electrical connection positioned within the hole.

6. The chip package assembly of claim 5, wherein the electrical connection connects an electrical node of the TEC to an external power supply.

7. The chip package assembly of claim 1, wherein the heatsink structure further comprises a fan module, the fan module comprising a positive electrical connection and a negative electrical connection, wherein the TEC is electrically connected to the positive electrical connection and the negative electrical connection.

8. A chip package assembly, comprising:

a package substrate;

a fan-out package attached to the package substrate, the fan-out package comprising:

a first semiconductor die including a first physical layer interface configured to transmit signals to, and from, the packaging substrate;

a second semiconductor die including a second physical layer interface configured to transmit signals to, and from, the packaging substrate; and an underfill material portion laterally surrounding the first semiconductor die and the second semiconductor die;

a heatsink structure including a heatsink base and a cavity within the heatsink base;

a thermoelectric cooler (TEC) embedded within the cavity, wherein the TEC is positioned above the first physical layer interface and the second physical layer interface; and a fan-out package thermal interface material (TIM) layer directly contacting an entirety of a bottom surface of the TEC, an entirety of top surfaces of the first semiconductor die and the second semiconductor die, and a top surface of the underfill material portion, wherein:

the TEC has an areal overlap with an entirety of the first physical layer interface of the first semiconductor die and with an entirety of the second physical layer interface of the second semiconductor die in a plan view along a vertical direction;

the chip package assembly comprises a molding compound die frame that laterally surrounds the first semiconductor die, the second semiconductor die, and the underfill material portion;

a portion of the first semiconductor die other than the first physical layer interface does not have any areal overlap with the TEC in the plan view; and a portion of the second semiconductor die other than the second physical layer interface does not have any areal overlap with the TEC in the plan view.

9. The chip package assembly of claim 8, wherein the TEC comprises:

a first substrate;

a first set of conductor pads having bottom surfaces contacting a top surface of the first substrate;

N-type semiconductor pellets;

P-type semiconductor pellets;

a second set of conductor pads having bottom surfaces contacting top surfaces of the N-type semiconductor pellets and P-type semiconductor pellets, wherein the N-type semiconductor pellets and P-type semiconductor pellets are alternatingly and electrically connected in series via the first set of conductor pads and the second set of conductor pads.

10. The chip package assembly of claim 9, wherein the TEC comprises: a second substrate having a bottom surface in contact with top surfaces of the second set of conductor pads.

11. The chip package assembly of claim 9, further comprising TEC thermal interface material (TIM) positioned between sidewalls of the heatsink structure within the cavity and sidewalls of the N-type semiconductor pellets and P-type semiconductor pellets.

12. The chip package assembly of claim 9, wherein top surfaces of the second set of conductor pads are in contact with a bottom surface of the heatsink structure within the cavity.

13. The chip package assembly of claim 10, wherein the first substrate and the second substrate comprise silicon or ceramic material.

14. The chip package assembly of claim 9, wherein:

the heatsink structure further comprises a hole within the heatsink base connecting the cavity to an opening at an outer edge of the heatsink base; and an electrical connection extends through the hole and connects an electrical node of the TEC to an external power supply.

15. The chip package assembly of claim 9, wherein the heatsink structure further comprises a fan module, the fan module comprising a positive electrical connection and a negative electrical connection, wherein the TEC is electrically connected to the positive electrical connection and the negative electrical connection.

16. A method of forming a chip package assembly, comprising:

attaching a fan-out package to a package substrate, wherein the fan-out package comprises a first semiconductor die including a first physical layer interface configured to transmit signals to, and from, the packaging substrate, a second semiconductor die including a second physical layer interface configured to transmit signals to, and from, the packaging substrate, and an underfill material portion laterally surrounding the first semiconductor die and the second semiconductor die; and attaching a combination of a heatsink structure and a thermoelectric cooler (TEC) to the fan-out package, wherein the heat sink structure includes a heatsink base and a cavity within the heatsink base, and the TEC is embedded within the cavity, and wherein a fan-out package thermal interface material (TIM) layer is formed between the combination and the fan-out package such that the fan-out package TIM layer directly contacts an entirety of a bottom surface of the TEC, an entirety of top surfaces of the first semiconductor die and the second semiconductor die, and a top surface of the underfill material portion, wherein:

the heatsink structure includes a heatsink base and a cavity within the heatsink base;

a thermoelectric cooler (TEC) is embedded within the cavity, wherein the TEC is positioned above the first physical layer interface and the second physical layer interface;

the TEC has an areal overlap with an entirety of the first physical layer interface of the first semiconductor die and with an entirety of the second physical layer interface of the second semiconductor die in a plan view along a vertical direction;

a portion of the first semiconductor die other than the first physical layer interface does not have any areal overlap with the TEC in the plan view; and a portion of the second semiconductor die other than the second physical layer interface does not have any areal overlap with the TEC in the plan view.

17. The method of claim 16, wherein the heatsink structure is formed by:

molding a heatsink material portion having a fin portion and the heatsink base, wherein the heatsink base extends from the fin portion; and beveling a bottom surface of the heatsink base to form the cavity, whereby the heatsink structure is formed.

18. The method of claim 16, wherein the thermoelectric cooler is formed within the cavity by:

depositing a thermal interface material (TIM) on a bottom surface of the heatsink base within the cavity; and attaching a top surface of the TEC to contact a bottom surface of the TIM, whereby a TEC thermal interface material (TIM) layer is formed.

19. The method of claim 16, wherein the thermoelectric cooler is formed within the cavity by:

forming a top set of conductor pads on a bottom surface of the heatsink structure within the cavity;

forming N-type semiconductor pellets and P-type semiconductor pellets on bottom surfaces of the top set of conductor pads;

forming a bottom set of conductor pads on bottom surfaces of the N-type semiconductor pellets and P-type semiconductor pellets, wherein the N-type semiconductor pellets and P-type semiconductor pellets are alternatingly and electrically connected in series via the top set of conductor pads and the bottom set of conductor pads; and forming a bottom substrate on bottom surfaces of the bottom set of conductor pads.

20. The method of claim 16, wherein the heatsink structure comprises holes within the heatsink base connecting the cavity to an outer surface of the heatsink structure, and the method comprises forming electrical connections through the holes to provide electrical connections between the TEC to an external power supply.

* * * * *